(12) United States Patent
Ogihara et al.

(10) Patent No.: US 9,312,127 B2
(45) Date of Patent: Apr. 12, 2016

(54) METHOD FOR PRODUCING SEMICONDUCTOR APPARATUS SUBSTRATE

(71) Applicant: SHIN-ETSU CHEMICAL CO., LTD., Tokyo (JP)

(72) Inventors: Tsutomu Ogihara, Jyoetsu (JP); Daisuke Kori, Jyoetsu (JP); Yoshinori Taneda, Jyoetsu (JP); Yusuke Biyajima, Jyoetsu (JP); Rie Kikuchi, Jyoetsu (JP); Seiichiro Tachibana, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/817,797

(22) Filed: Aug. 4, 2015

(65) Prior Publication Data

US 2016/0064220 A1    Mar. 3, 2016

(30) Foreign Application Priority Data

Sep. 1, 2014 (JP) ................................. 2014-176897

(51) Int. Cl.

| H01L 21/00 | (2006.01) |
|---|---|
| H01L 21/02 | (2006.01) |
| H01L 21/311 | (2006.01) |
| H01L 21/265 | (2006.01) |
| H01L 21/266 | (2006.01) |
| H01L 21/324 | (2006.01) |

(52) U.S. Cl.
CPC .... *H01L 21/02343* (2013.01); *H01L 21/02057* (2013.01); *H01L 21/02118* (2013.01); *H01L 21/02216* (2013.01); *H01L 21/266* (2013.01); *H01L 21/26513* (2013.01); *H01L 21/31116* (2013.01); *H01L 21/31144* (2013.01); *H01L 21/324* (2013.01)

(58) Field of Classification Search
CPC ................... H01L 21/02343; H01L 21/31116; H01L 21/31144; H01L 21/26513; H01L 21/266; H01L 21/02118; H01L 21/324; H01L 21/02057; H01L 21/02216
See application file for complete search history.

(56) References Cited

U.S. PATENT DOCUMENTS 7,816,273 B2 *  10/2010  Krueger et al. ............... 438/725
8,574,369 B2 *  11/2013  Miura ........................... 134/1.3

(Continued)

FOREIGN PATENT DOCUMENTS

| JP | 2007-199653 A | 8/2007 |
| JP | 2007-226204 A | 9/2007 |

(Continued)

*Primary Examiner* — Richard Booth
(74) *Attorney, Agent, or Firm* — Oliff PLC

(57) ABSTRACT

A method for producing a semiconductor apparatus substrate includes steps of: forming silicon-containing film having silicon content of 1% by mass or more and 30% by mass or less on an organic under layer film formed on an substrate; forming a resist film on silicon-containing film; forming a resist pattern by exposing and developing resist film; transferring pattern to silicon-containing film using resist pattern as a mask; transferring pattern to organic under layer film using silicon-containing film as a mask to leave part or all of silicon-containing film on organic under layer film; implanting ions into substrate using organic under layer film as a mask; and peeling organic under layer film used as mask for ion implantation on which part or all of silicon-containing film remains, with peeling liquid.

20 Claims, 1 Drawing Sheet

(56) References Cited

U.S. PATENT DOCUMENTS

| | | | |
|---|---|---|---|
| 8,906,595 B2 * | 12/2014 | Liu et al. ................ | 430/313 |
| 2007/0172759 A1 | 7/2007 | Ogihara et al. | |
| 2007/0238300 A1 | 10/2007 | Ogihara et al. | |
| 2009/0136869 A1 | 5/2009 | Ogihara et al. | |

FOREIGN PATENT DOCUMENTS

| | | | |
|---|---|---|---|
| JP | 2007-302873 A | 11/2007 |
| JP | 2009-126940 A | 6/2009 |

* cited by examiner

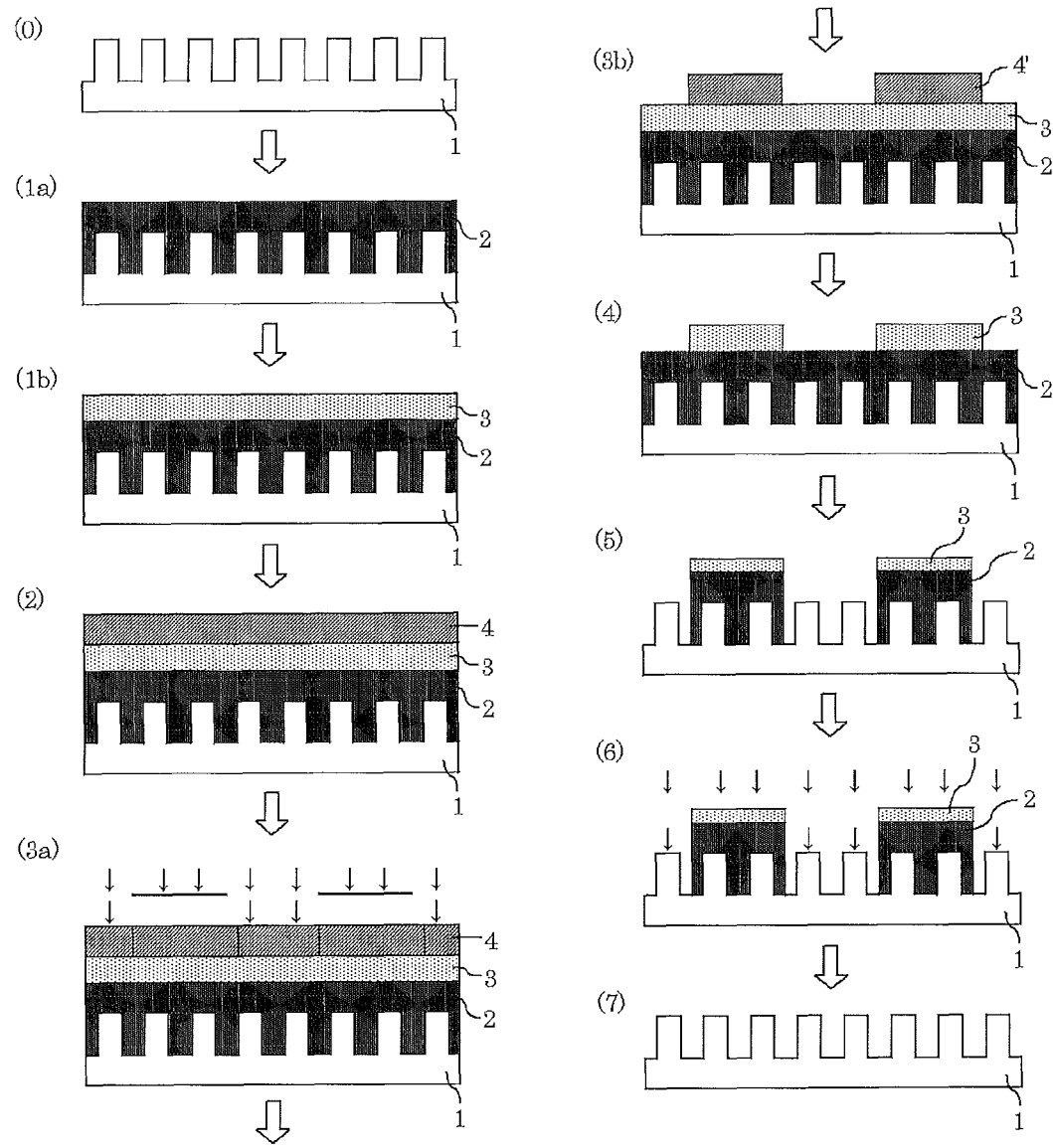

METHOD FOR PRODUCING SEMICONDUCTOR APPARATUS SUBSTRATE

BACKGROUND OF THE INVENTION

1. Field of the Invention

The present invention relates to a production method when a transistor and a circuit are formed on a semiconductor apparatus substrate in a process of producing a semiconductor apparatus.

2. Description of the Related Art

Higher integration of a semiconductor apparatus has been achieved by miniaturization of a pattern dimension with the shorter wavelength of lithography light source and selection of a resist composition suitable for the wavelength. However, delay of EUV exposure techniques slows the miniaturization in pattern dimension due to the shorter wavelength of light source. The latest research and development about the higher integration of a semiconductor apparatus focus on lamination of the semiconductor apparatus through a penetrating wiring and formation of a three-dimensional transistor. In particular, the three-dimensional transistor is noticed in terms of motion at high speed and low power consumption, in addition to the higher integration of the semiconductor apparatus.

Since a substrate for forming a planar transistor has relatively small unevenness, a single-layer resist process and patterning of an organic antireflective film and a single layer resist (hereinafter referred to two-layer process) is mainly used as a conventional process for producing the planar transistor. However, a more three-dimensional structure is formed in a process of producing a three-dimensional transistor of FinFET structure. Therefore, the substrate of the transistor has larger unevenness as compared with the planar transistor. Forming this structure by the conventional two-layer process is made difficult.

As one of methods for solving the problem, a pattern formed by a three-layer process has been investigated. The three-layer process is a process in which a resist under layer film having an etching selectivity different from that of a photoresist film (i.e. a resist upper layer film) is interposed between the resist upper layer film and an organic under layer film, a pattern is formed with the resist upper layer film, the pattern is then transferred to the resist under layer film by dry etching using the upper layer resist as an etching mask, the pattern is transferred to the organic under layer film by dry etching using the pattern as an etching mask, and the pattern is transferred to a substrate to be processed by dry etching using the pattern as an etching mask. A silicon-containing film having good etching selectivity between both the resist upper layer film and the organic under layer film is usually used for the resist under layer film (Patent Document 1).

Specifically, in the three-layer process, a large uneven substrate for forming a three-dimensional transistor is made flat using an organic under layer film having appropriate thickness, a silicon-containing resist under layer film is placed as a hard mask to process the organic under layer film, a pattern is transferred to the silicon-containing resist under layer film using the pattern formed with an upper layer resist as an etching mask, and the organic under layer film is processed using the transferred pattern as a mask. The process has been widely used in a wiring process of the semiconductor apparatus.

PRIOR ART DOCUMENTS

Patent Documents

Patent Document 1: Japanese Patent Laid-Open Publication No. 2007-199653

SUMMARY OF THE INVENTION

In order to apply the three-layer process to a process for forming a three-dimensional transistor, it is necessary that a silicon-containing resist under layer film and an organic under layer film that have been used as a mask for ion implantation (hereinafter, the layers are also referred to as under layer film residue) be removed without causing damage to a substrate. In the conventional wiring process, the under layer film residue can be removed by dry etching. However, There is a problem, in a transistor forming process, that removing the under layer film residue by dry etching causes damage to the substrate.

The present invention was made in view of the above situation, and has an object to provide a method for producing a semiconductor apparatus substrate using a silicon-containing film, in which an organic under layer film pattern formed by dry etching on which a part of or all of the silicon-containing film remains is used as a mask for ion implantation, and wet peeling can be easily carried out with a peeling liquid without causing damage to the semiconductor apparatus substrate.

In order to solve the problem, the present invention provides a method for producing a semiconductor apparatus substrate including the steps of:

(1) forming an organic under layer film on a substrate to be processed for producing a semiconductor apparatus, and applying a composition for forming a silicon-containing film on the organic under layer film, followed by heating, to form a silicon-containing film having a silicon content of 1% by mass or more and 30% by mass or less;

(2) applying a resist composition on the silicon-containing film to form a resist film, the resist composition containing a polymer whose polarity is changed by an acid action to change solubility thereof, in a developer;

(3) forming a resist pattern by exposing and developing the resist film;

(4) transferring the pattern to the silicon-containing film by dry etching using the resist pattern as a dry etching mask;

(5) transferring the pattern to the organic under layer film by dry etching using the silicon-containing film to which the pattern has been transferred as a dry etching mask, to leave a part of or all of the silicon-containing film after the pattern transferring, on the organic under layer film to which the pattern has been transferred;

(6) implanting ions into the substrate to be processed for producing a semiconductor apparatus using the organic under layer film to which the pattern has been transferred as a mask; and (7) peeling the organic under layer film used as the mask for ion implantation on which a part of or all of the silicon-containing film remains, with a peeling liquid.

According the method for producing a semiconductor apparatus substrate, the mask used for ion implantation can be easily peeled with the peeling liquid without causing damage to the semiconductor apparatus substrate in a method for producing a semiconductor apparatus substrate using a silicon-containing film having excellent pattern adhesion.

In the step (6), ions can be implanted into the substrate to be processed for producing a semiconductor apparatus using the pattern formed from a part of or all of the silicon-containing film and the organic under layer film as a mask.

Thus, ion implantation can be carried out using the pattern formed from the silicon-containing film and the organic under layer film as a mask in the present invention.

In the step (7), it is preferable that the organic under layer film used as the mask for ion implantation on which a part of or all of the silicon-containing film remains be peeled with the peeling liquid at a time.

This peeling at a time can achieve more efficient peeling.

It is preferable that the peeling liquid contain hydrogen peroxide.

Such a peeling liquid is particularly suitable for peeling of the silicon-containing film.

It is preferable that the peeling liquid contain sulfuric acid.

Use of the peeling liquid containing sulfuric acid can promote peeling.

In the step (7), it is preferable that the treatment with the peeling liquid be followed by peeling with another peeling liquid containing fluorine ions.

As a result, the mask used for ion implantation can be peeled more accurately.

In the step (7), it is preferable that the treatment with the peeling liquid be followed by cleaning with a cleaning liquid containing ammonia.

As a result, impurities attached to the semiconductor apparatus substrate after the peeling can be removed.

It is preferable that the substrate to be processed for producing a semiconductor apparatus be a semiconductor apparatus substrate on which a part of or all of semiconductor circuit is formed or a material in which any of a metal film, an amorphous metal film, a metal carbide film, a metal oxide film, a metal nitride film, a metal oxycarbide film, and a metal oxynitride film is formed on the semiconductor apparatus substrate.

It is preferable that the metal contain silicon, titanium, tungsten, hafnium, zirconium, chromium, germanium, copper, silver, gold, aluminum, indium, gallium, arsenic, palladium, iron, tantalum, iridium, molybdenum, or an alloy thereof.

In the present invention, such a substrate to be processed for producing a semiconductor apparatus can be suitably used.

It is preferable that the ion used for the ion implantation be any of boron, phosphorous, arsenic, carbon, nitrogen, oxygen, fluorine, argon, silicon, gallium, germanium, indium, and antimony.

Such an ionic species is suitable for ion to be implanted.

It is preferable that the composition for forming a silicon-containing film contains at least a polysiloxane and a solvent.

Since a high-quality silicon-containing film can be formed from such a composition for forming a silicon-containing film, the composition can be suitably used in the present invention.

It is preferable that the polysiloxane have a crosslinkable organic group.

When the polysiloxane has a crosslinkable organic group, a silicon-containing film having better adhesion can be formed.

It is preferable that the crosslinkable organic group be any of an epoxy group, a phenol group, and a naphthol group.

Due to such a crosslinkable organic group, a silicon-containing film having good adhesion can be accurately formed.

It is preferable that the polysiloxane have a halogenated organic group.

When the polysiloxane has the halogenated organic group, the mask used for ion implantation can be accurately peeled.

It is preferable that halogen in the halogenated organic group be fluorine or chlorine.

Due to such a halogenated organic group, the mask used for ion implantation can be more accurately peeled.

The composition for forming a silicon-containing film may further contain an acid generator which generates an acid by an action of heat, light, or both.

The composition for forming a silicon-containing film may further contain an organic compound containing fluorine.

The composition for forming a silicon-containing film may further contain a crosslinker.

Thus, the composition for forming a silicon-containing film used in the present invention may contain the additives described above.

According to the method for producing a semiconductor apparatus substrate of the present invention, by adjusting the silicon content in a silicon-containing film within a predetermined range, an organic under layer film can be peeled and removed, for example, with a peeling liquid, together with a part of or all of the silicon-containing film that may remain on the organic under layer film. Therefore, even when the pattern formed from the silicon-containing film and the organic under layer film is used as a mask for ion implantation, wet peeling with a peeling liquid can be easily carried out after ion implantation without causing damage to the semiconductor apparatus substrate. Since processing is carried out by a three-layer process without causing damage to the ion-implanted substrate, the present invention is particularly suitable for production of a three-dimensional transistor.

BRIEF DESCRIPTION OF THE DRAWINGS

FIG. 1 is a flow chart showing one example of a method for producing a semiconductor apparatus substrate of the present invention.

DETAILED DESCRIPTION OF THE PREFERRED EMBODIMENTS

As described above, development of the method for producing a semiconductor apparatus substrate using a silicon-containing film, in which a mask used for ion implantation can be easily peeled with a peeling liquid without causing damage to the semiconductor apparatus substrate is required.

The present inventors have intensively investigated to solve the problems, and as a result, found that in a method in which ion implantation is carried out using an organic under layer film on which a silicon-containing film remains as a mask and the mask (under layer film residue) is then removed, by adjusting the silicon content in the silicon-containing film to 1% by mass or more and 30% by mass or less, and the ion-implanted substrate is treated with a peeling liquid, wet peeling can be easily carried out without causing damage to the substrate. Thus, the present invention has been accomplished.

That is, the present invention is a method for producing a semiconductor apparatus substrate including the steps of:

(1) forming an organic under layer film on a substrate to be processed for producing a semiconductor apparatus, and applying a composition for forming a silicon-containing film on the organic under layer film, followed by heating, to form a silicon-containing film having a silicon content of 1% by mass or more and 30% by mass or less;

(2) applying a resist composition on the silicon-containing film to form a resist film, the resist composition containing a polymer whose polarity is changed by an acid action to change solubility thereof in a developer;

(3) forming a resist pattern by exposing and developing the resist film;

(4) transferring the pattern to the silicon-containing film by dry etching using the resist pattern as a dry etching mask;

(5) transferring the pattern to the organic under layer film by dry etching using the silicon-containing film to which the pattern has been transferred as a dry etching mask, to leave a part of or all of the silicon-containing film after the pattern transferring, on the organic under layer film to which the pattern has been transferred;

(6) implanting ions into the substrate to be processed for producing a semiconductor apparatus using the organic under layer film to which the pattern has been transferred as a mask; and (7) peeling the organic under layer film used as the mask for ion implantation on which a part of or all of the silicon-containing film remains, with a peeling liquid.

Hereinafter, the present invention will be described in detail, but the present invention is not limited to these.

Herein, "Me" represents a methyl group, "Et" represents an ethyl group, and "Ac" represents an acetyl group.

[Substrate to be Processed for Producing a Semiconductor Apparatus]

In the present invention, as the substrate to be processed for producing a semiconductor apparatus (i.e. the body to be processed), a semiconductor apparatus substrate on which a part of or all of semiconductor circuit is formed or a material in which any of a metal film, an amorphous metal film, a metal carbide film, a metal oxide film, a metal nitride film, a metal oxycarbide film, and a metal oxynitride film is formed on the semiconductor apparatus substrate as an layer to be processed (i.e. a portion to be processed) may be preferably used.

As the semiconductor apparatus substrate, a silicon substrate is generally used, but it is not particularly limited thereto, and a material such as Si, amorphous silicon (α-Si), p-Si, $SiO_2$, SiN, SiON, W, TiN, Al, etc., and different in the material from the layer to be processed may be used.

Examples of a metal constituting the body to be processed include silicon, titanium, tungsten, hafnium, zirconium, chromium, germanium, copper, silver, gold, aluminum, indium, gallium, arsenic, palladium, iron, tantalum, iridium, molybdenum, and an alloy thereof. The layer to be processed containing such a metal may be made of Si, $SiO_2$, SiN, SiON, SiOC, p-Si, α-Si, TiN, BPSG, SOG, Cr, CrO, CrON, MoSi, W, W—Si, Al, Cu, Al—Si, or the like; various low dielectric constant films, or etching stopper film thereof. The thickness of the layer is preferably in the range of 50 to 10,000 nm, and more preferably 100 to 5,000 nm.

[Organic Under Layer Film]

The organic under layer film formed on the substrate to be processed for producing a semiconductor apparatus in the present invention may be formed from a known material by a known method, and is not particularly limited so long as it can be peeled with a peeling liquid described below. The thickness of the organic under layer film is not particularly limited, and is preferably about 100 nm to about 500 nm.

[Silicon-Containing Film]

The silicon-containing film formed on the organic under layer film in the present invention may be formed by applying the composition for forming a silicon-containing film, followed by heating. The silicon content in the silicon-containing film needs to be 1% by mass or more and 30% by mass or less. The silicon content will be described below.

In the present invention, it is preferable that the composition for forming a silicon-containing film contain at least a polysiloxane and a solvent.

The polysiloxane contained in the composition for forming a silicon-containing film used in the present invention preferably contains one or more members selected from a compound represented by the formula (A-1), a hydrolysate of the compound, a condensate of the compound, and a hydrolysis condensate of the compound, $$R^{1A}{}_{A1}R^{2A}{}_{A2}R^{3A}{}_{A3}Si(OR^{0A})_{(4-A1-A2-A3)} \quad (A-1)$$

wherein $R^{0A}$ represents a hydrocarbon group having 1 to 6 carbon atoms; $R^{1A}$, $R^{2A}$, and $R^{3A}$ each represent a hydrogen atom or a monovalent organic group; and A1, A2, and A3 are each 0 or 1, and satisfy $0 \leq A1+A2+A3 \leq 3$.

A hydrolysable silicon compound (alkoxy silane) represented by the formula (A-1) used as a raw material (stating material) of the polysiloxane can be exemplified by the following.

Illustrative examples of tetraalkoxy silane include tetramethoxy silane, tetraethoxy silane, tetrapropoxy silane, tetraisopropoxy silane, etc.

Illustrative examples of trialkoxy silane include trimethoxy silane, triethoxy silane, tripropoxy silane, triisopropoxy silane, methyl trimethoxy silane, methyl triethoxy silane, methyl tripropoxy silane, methyl triisopropoxy silane, ethyl trimethoxy silane, ethyl triethoxy silane, ethyl tripropoxy silane, ethyl triisopropoxy silane, vinyl trimethoxy silane, vinyl triethoxy silane, vinyl tripropoxy silane, vinyl triisopropoxy silane, propyl trimethoxy silane, propyl triethoxy silane, propyl tripropoxy silane, propyl triisopropoxy silane, isopropyl trimethoxy silane, isopropyl triethoxy silane, isopropyl tripropoxy silane, isopropyl triisopropoxy silane, butyl trimethoxy silane, butyl triethoxy silane, butyl tripropoxy silane, butyl triisopropoxy silane, s-butyl trimethoxy silane, s-butyl triethoxy silane, s-butyl tripropoxy silane, s-butyl triisopropoxy silane, t-butyl trimethoxy silane, t-butyl triethoxy silane, t-butyl tripropoxy silane, t-butyl triisopropoxy silane, cyclopropyl trimethoxy silane, cyclopropyl triethoxy silane, cyclopropyl tripropoxy silane, cyclopropyl triisopropoxy silane, cyclobutyl trimethoxy silane, cyclobutyl triethoxy silane, cyclobutyl tripropoxy silane, cyclobutyl triisopropoxy silane, cyclopentyl trimethoxy silane, cyclopentyl triethoxy silane, cyclopentyl tripropoxy silane, cyclopentyl triisopropoxy silane, cyclohexyl trimethoxy silane, cyclohexyl triethoxy silane, cyclohexyl tripropoxy silane, cyclohexyl triisopropoxy silane, cyclohexenyl trimethoxy silane, cyclohexenyl triethoxy silane, cyclohexenyl tripropoxy silane, cyclohexenyl triisopropoxy silane, cyclohexenylethyl trimethoxy silane, cyclohexenylethyl triethoxy silane, cyclohexenylethyl tripropoxy silane, cyclohexenylethyl triisopropoxy silane, cyclooctyl trimethoxy silane, cyclooctyl triethoxy silane, cyclooctyl tripropoxy silane, cyclooctyl triisopropoxy silane, cyclopentadienylpropyl trimethoxy silane, cyclopentadienylpropyl triethoxy silane, cyclopentadienylpropyl tripropoxy silane, cyclopentadienylpropyl triisopropoxy silane, bicycloheptenyl trimethoxy silane, bicycloheptenyl triethoxy silane, bicycloheptenyl tripropoxy silane, bicycloheptenyl triisopropoxy silane, bicycloheptyl trimethoxy silane, bicycloheptyl triethoxy silane, bicycloheptyl tripropoxy silane, bicycloheptyl triisopropoxy silane, adamantyl trimethoxy silane, adamantyl triethoxy silane, adamantyl tripropoxy silane, adamantyl triisopropoxy silane, phenyl trimethoxy silane, phenyl triethoxy silane, phenyl tripropoxy silane, phenyl triisopropoxy silane, benzyl trimethoxy silane, benzyl triethoxy silane, benzyl tripropoxy silane, benzyl triisopropoxy silane, tolyl trimethoxy silane, tolyl triethoxy silane, tolyl tripropoxy silane, tolyl triisopropoxy silane, anisyl trimethoxy silane, anisyl triethoxy silane, anisyl tripropoxy silane, anisyl triisopropoxy silane, phenethyl trimethoxy silane, phenethyl triethoxy silane, phenethyl tripropoxy silane, phenethyl triisopropoxy silane, naphthyl trimethoxy silane, naphthyl triethoxy silane, naphthyl tripropoxy silane, naphthyl triisopropoxy silane, etc.

Illustrative examples of dialkoxy silane include dimethyl dimethoxy silane, dimethyl diethoxy silane, methyl ethyl dimethoxy silane, methyl ethyl diethoxy silane, dimethyl dipropoxy silane, dimethyl diisopropoxy silane, diethyl dimethoxy silane, diethyl diethoxy silane, diethyl dipropoxy silane, diethyl diisopropoxy silane, dipropyl dimethoxy silane, dipropyl diethoxy silane, dipropyl dipropoxy silane, dipropyl diisopropoxy silane, diisopropyl dimethoxy silane, diisopropyl diethoxy silane, diisopropyl dipropoxy silane, diisopropyl diisopropoxy silane, dibutyl dimethoxy silane, dibutyl diethoxy silane, dibutyl dipropoxy silane, dibutyl diisopropoxy silane, di-s-butyl dimethoxy silane, di-s-butyl diethoxy silane, di-s-butyl dipropoxy silane, di-s-butyl diisopropoxy silane, di-t-butyl dimethoxy silane, di-t-butyl diethoxy silane, di-t-butyl dipropoxy silane, di-t-butyl diisopropoxy silane, dicyclopropyl dimethoxy silane, dicyclopropyl diethoxy silane, dicyclopropyl dipropoxy silane, dicyclopropyl diisopropoxy silane, dicyclobutyl dimethoxy silane, dicyclobutyl diethoxy silane, dicyclobutyl dipropoxy silane, dicyclobutyl diisopropoxy silane, dicyclopentyl dimethoxy silane, dicyclopentyl diethoxy silane, dicyclopentyl dipropoxy silane, dicyclopentyl diisopropoxy silane, dicyclohexyl dimethoxy silane, dicyclohexyl diethoxy silane, dicyclohexyl dipropoxy silane, dicyclohexyl diisopropoxy silane, dicyclohexenyl dimethoxy silane, dicyclohexenyl diethoxy silane, dicyclohexenyl dipropoxy silane, dicyclohexenyl diisopropoxy silane, dicyclohexenylethyl dimethoxy silane, dicyclohexenylethyl diethoxy silane, dicyclohexenylethyl dipropoxy silane, dicyclohexenylethyl diisopropoxy silane, dicyclooctyl dimethoxy silane, dicyclooctyl diethoxy silane, dicyclooctyl dipropoxy silane, dicyclooctyl diisopropoxy silane, dicyclopentadienylpropyl dimethoxy silane, dicyclopentadienylpropyl diethoxy silane, dicyclopentadienylpropyl dipropoxy silane, dicyclopentadienylpropyl diisopropoxy silane, bis(bicycloheptenyl)dimethoxy silane, bis(bicycloheptenyl) diethoxy silane, bis(bicycloheptenyl)dipropoxy silane, bis(bicycloheptenyl)diisopropoxy silane, bis(bicycloheptyl) dimethoxy silane, bis(bicycloheptyl) diethoxy silane, bis(bicycloheptyl)dipropoxy silane, bis(bicycloheptyl) diisopropoxy silane, diadamantyl dimethoxy silane, diadamantyl diethoxy silane, diadamantyl dipropoxy silane, diadamantyl diisopropoxy silane, diphenyl dimethoxy silane, diphenyl diethoxy silane, methyl phenyl dimethoxy silane, methyl phenyl diethoxy silane, diphenyl dipropoxy silane, diphenyl diisopropoxy silane, etc.

Illustrative examples of monoalkoxy silane include trimethyl methoxy silane, trimethyl ethoxy silane, dimethyl ethyl methoxy silane, dimethyl ethyl ethoxy silane, dimethyl phenyl methoxy silane, dimethyl phenyl ethoxy silane, dimethyl benzyl methoxy silane, dimethyl benzyl ethoxy silane, dimethyl phenethyl methoxy silane, dimethyl phenethyl ethoxy silane, etc.

Other examples of the compound represented by the formula (A-1) include those having the following structures whose silicon is bonded to one to three methoxy groups, ethoxy groups, propoxy groups, butoxy groups, pentoxy groups, cyclopentoxy groups, hexyloxy groups, cyclohexyloxy groups, and phenoxy groups as hydrolysable group, $OR^{04}$. Hereinafter, (Si) in the formula is described to show the bonding sites to the Si atom.

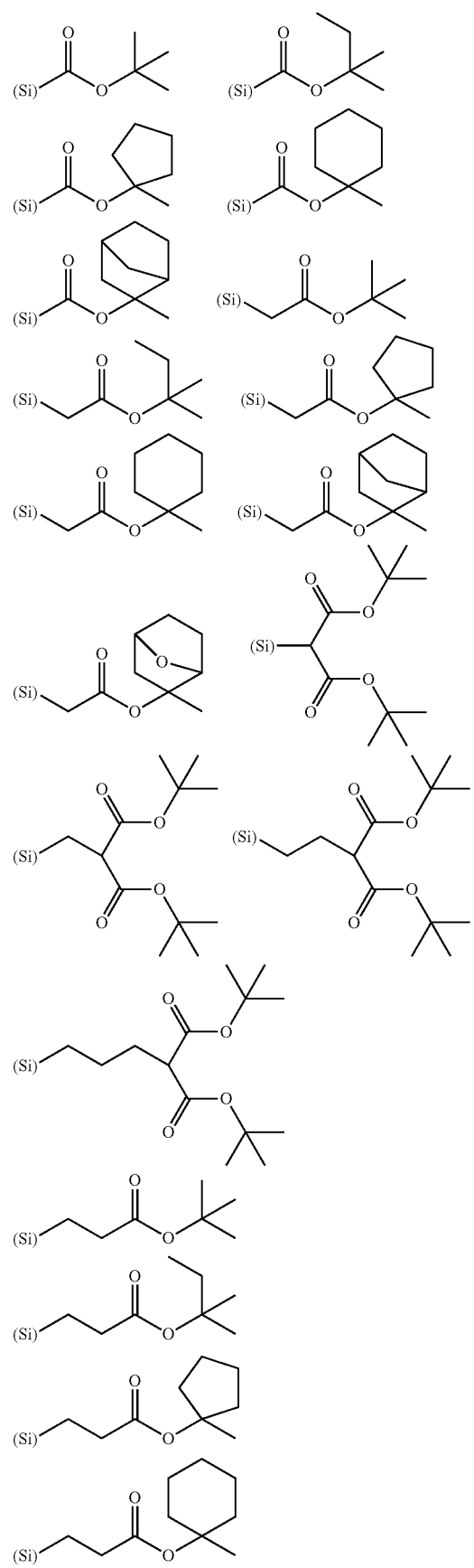

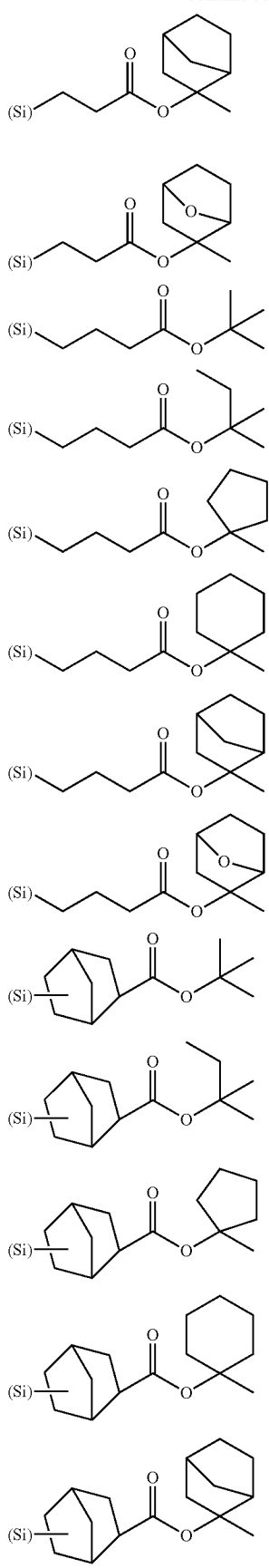
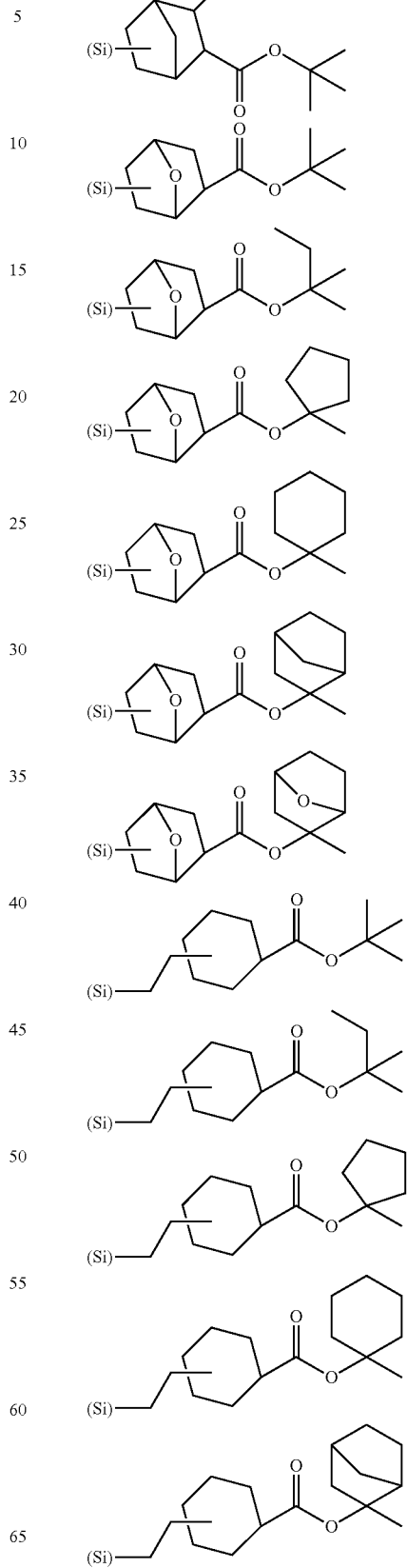

-continued
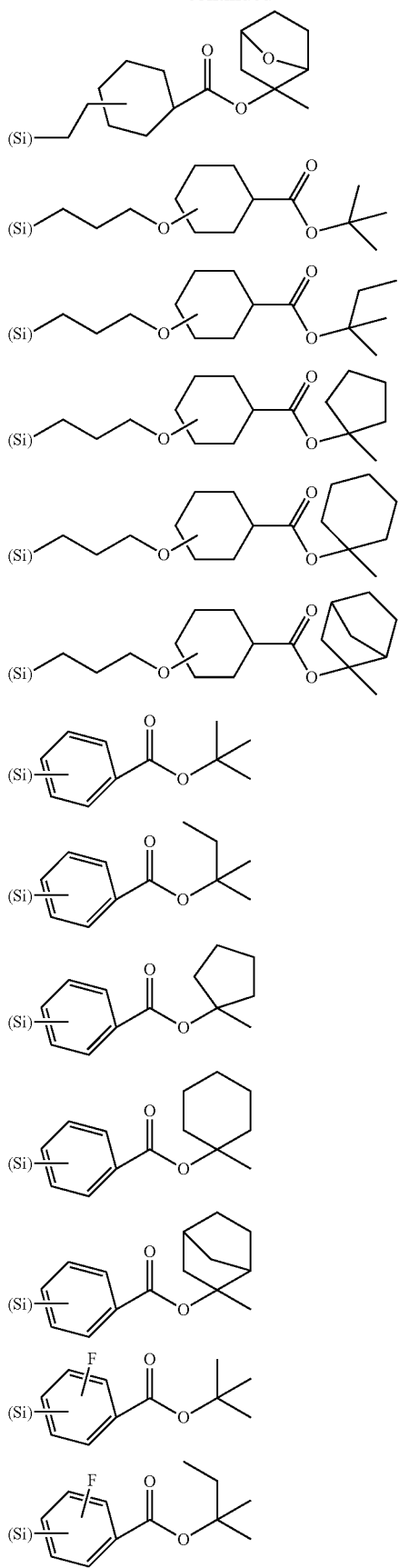
-continued
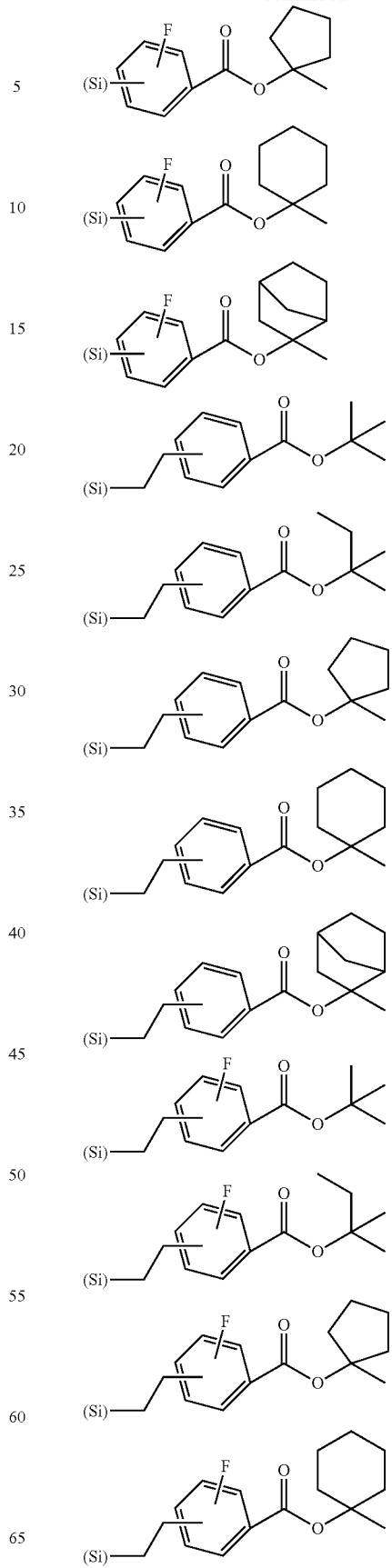

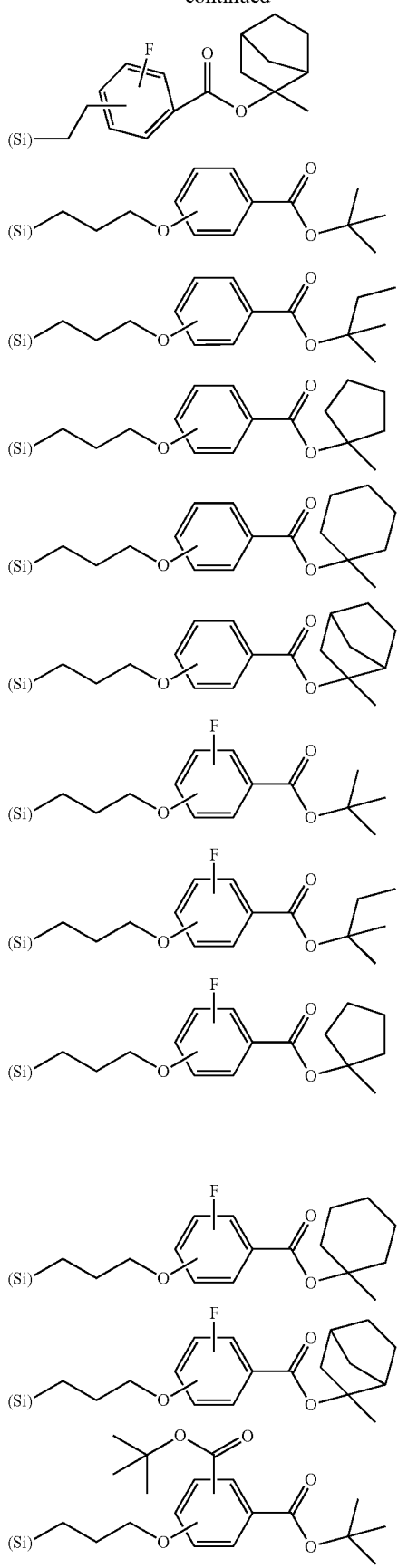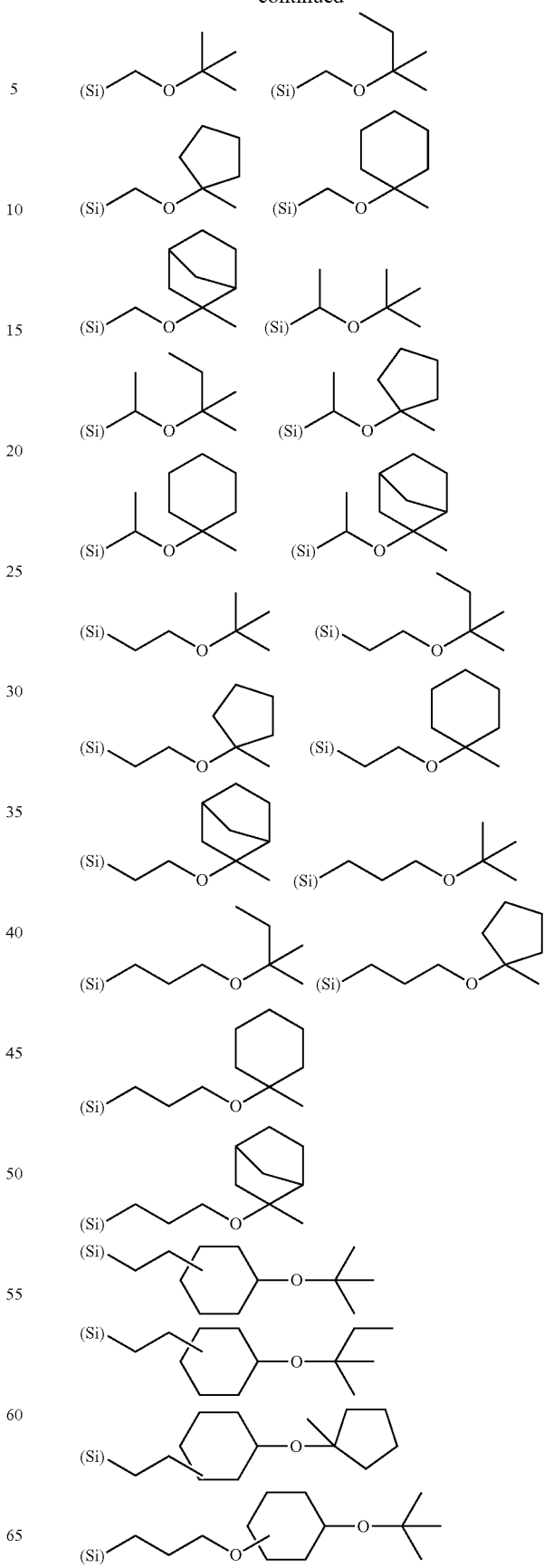

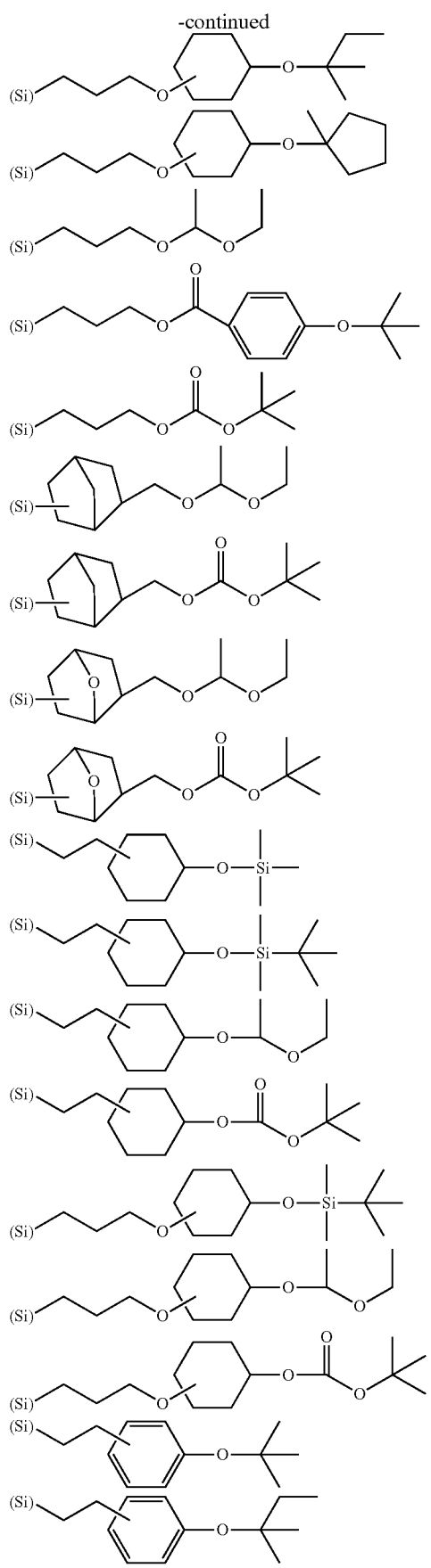
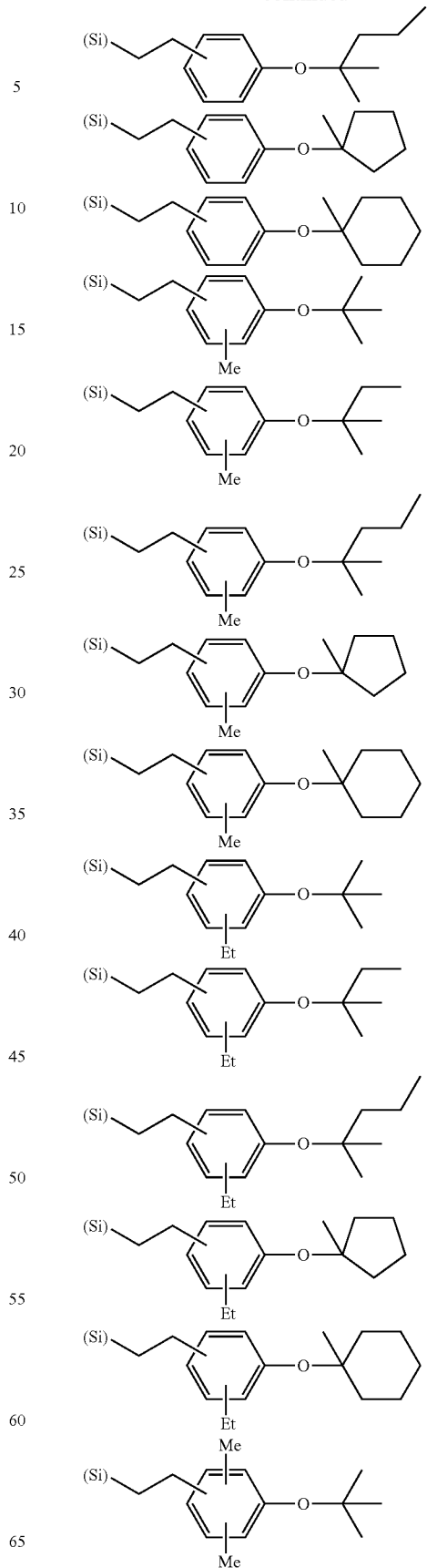

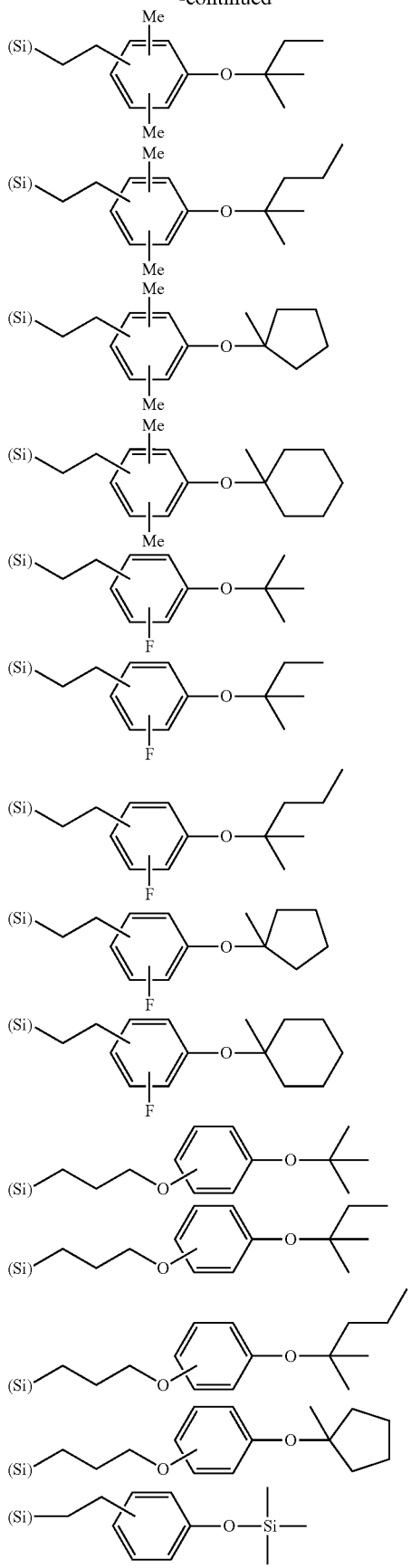
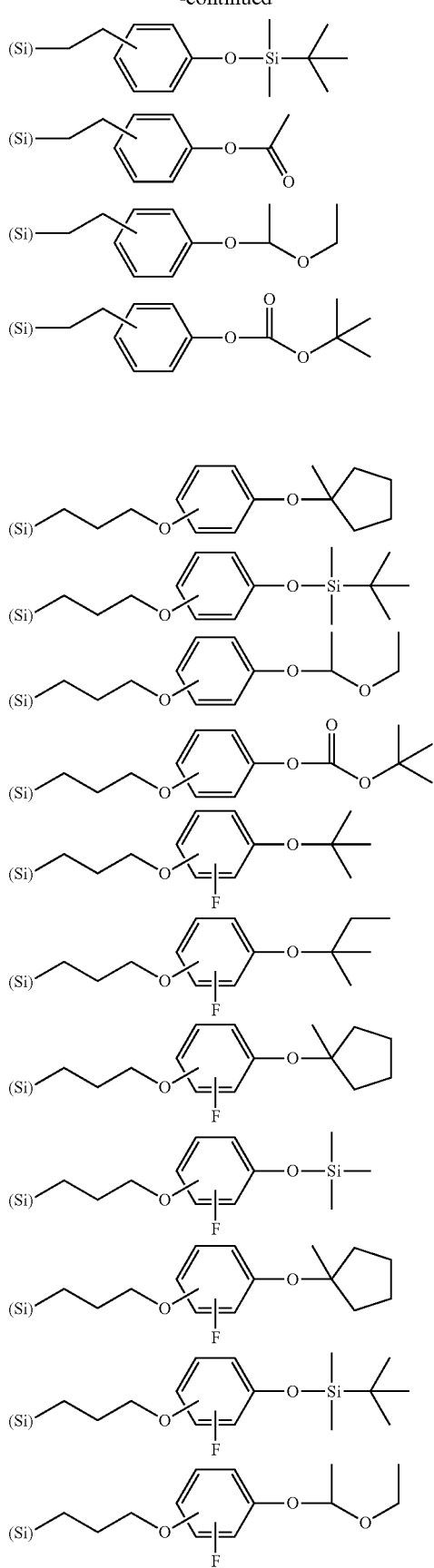

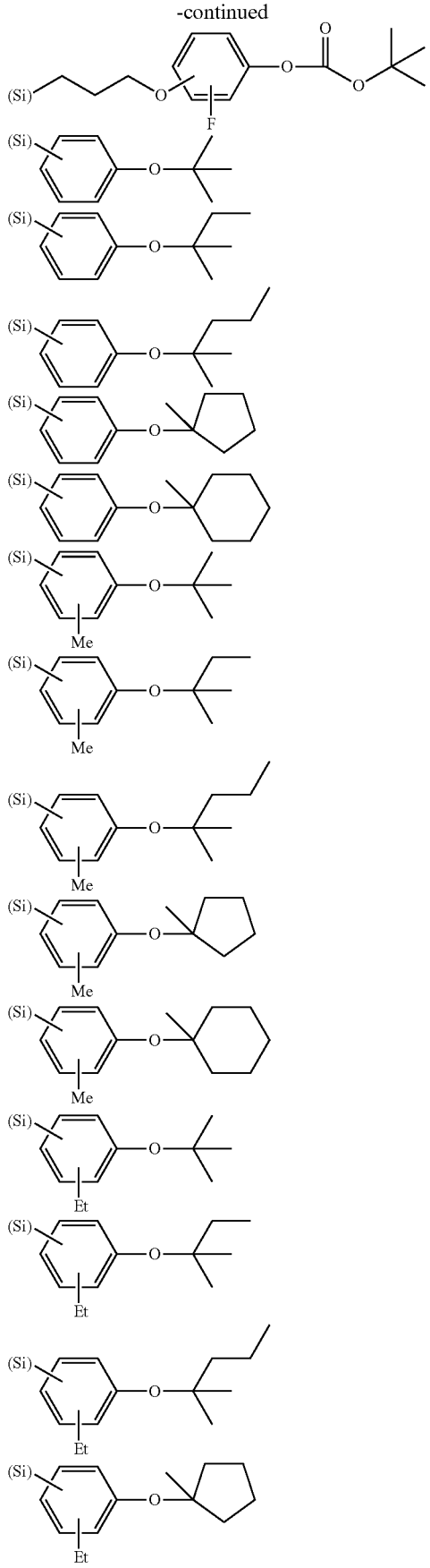
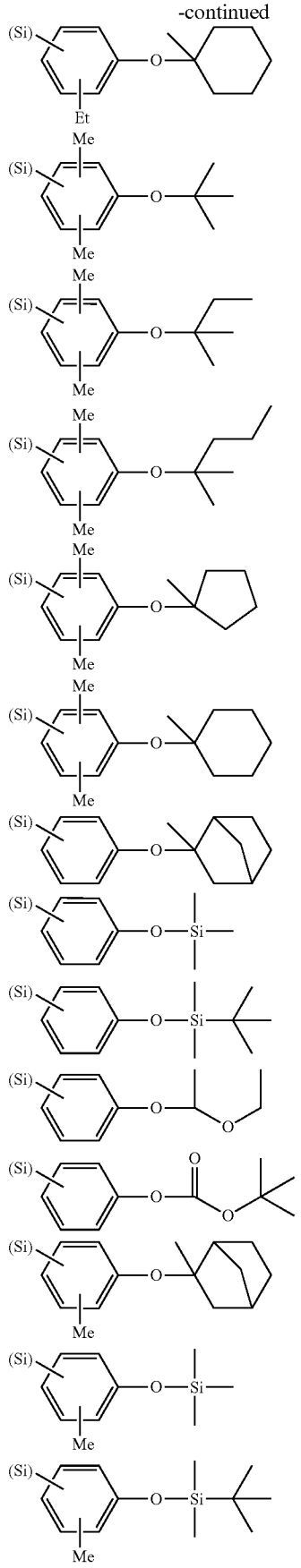

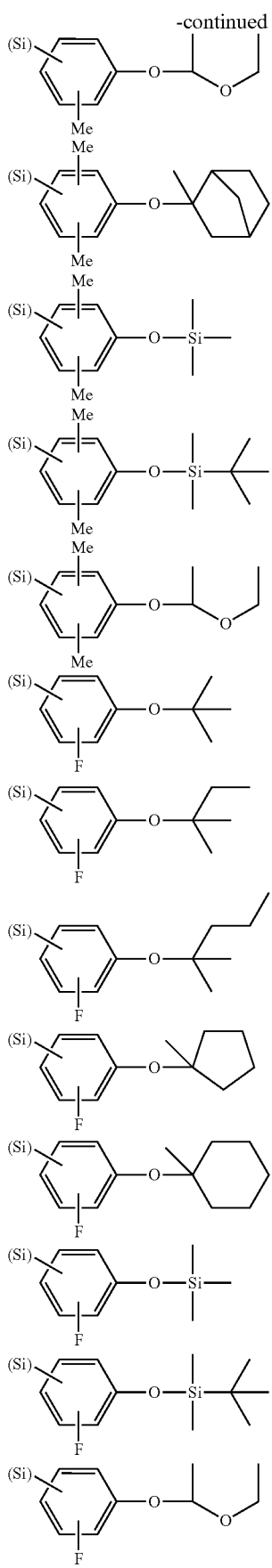
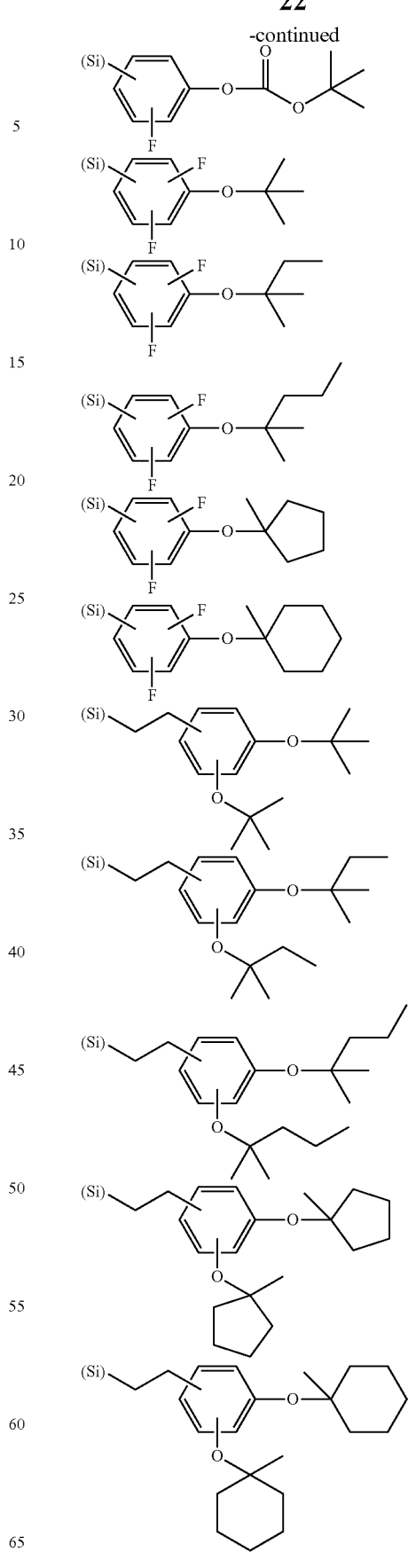

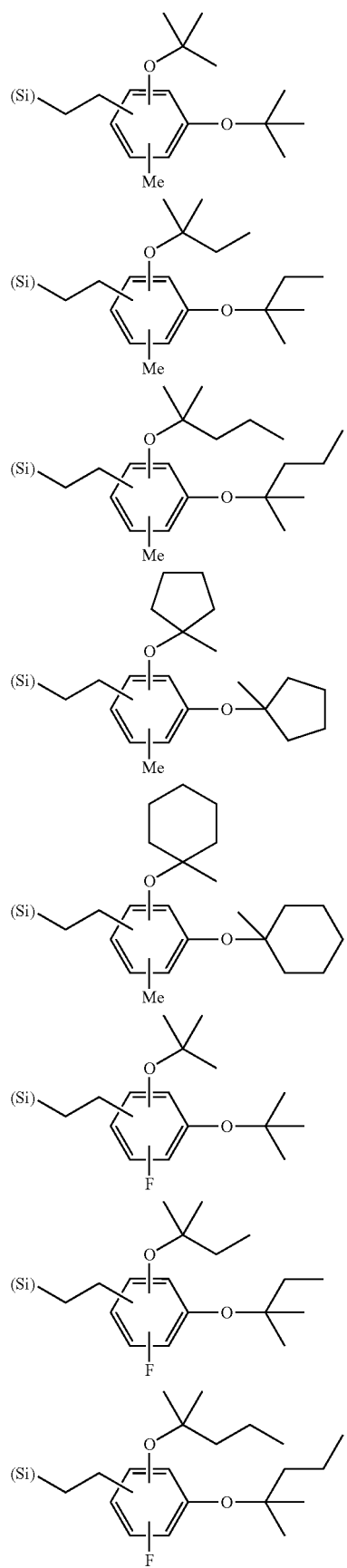
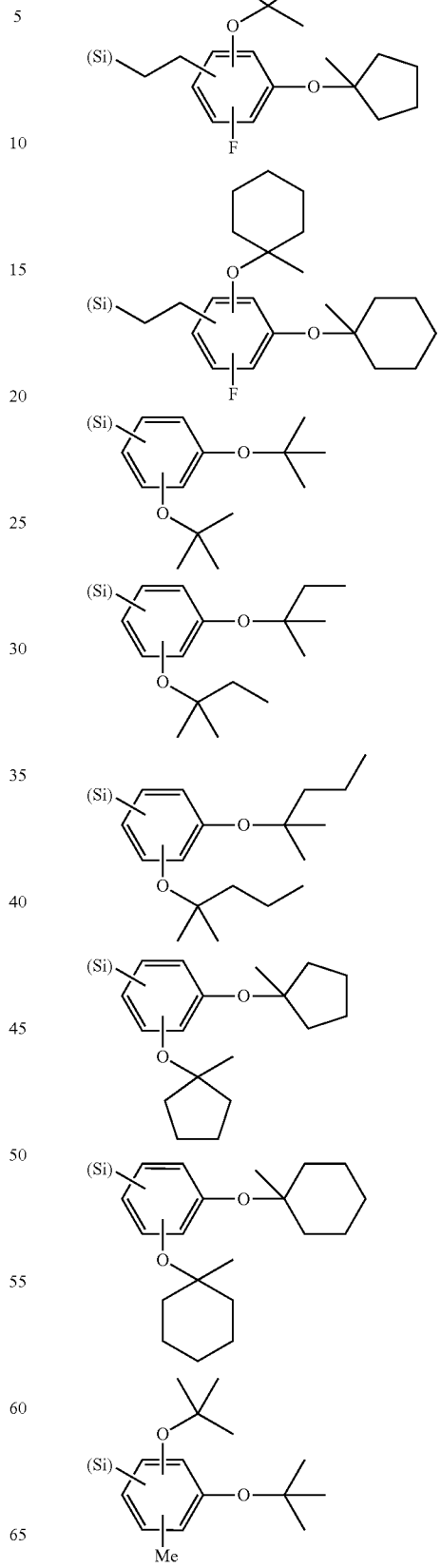

-continued
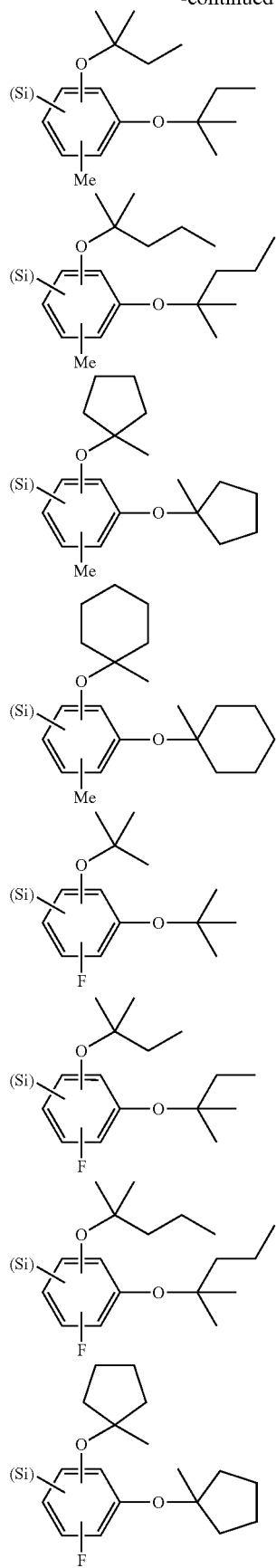
-continued
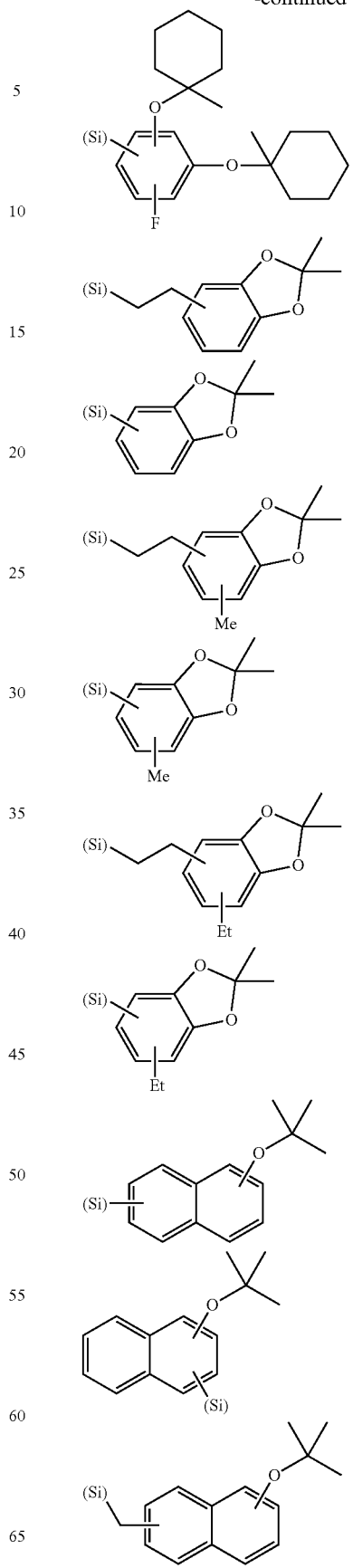

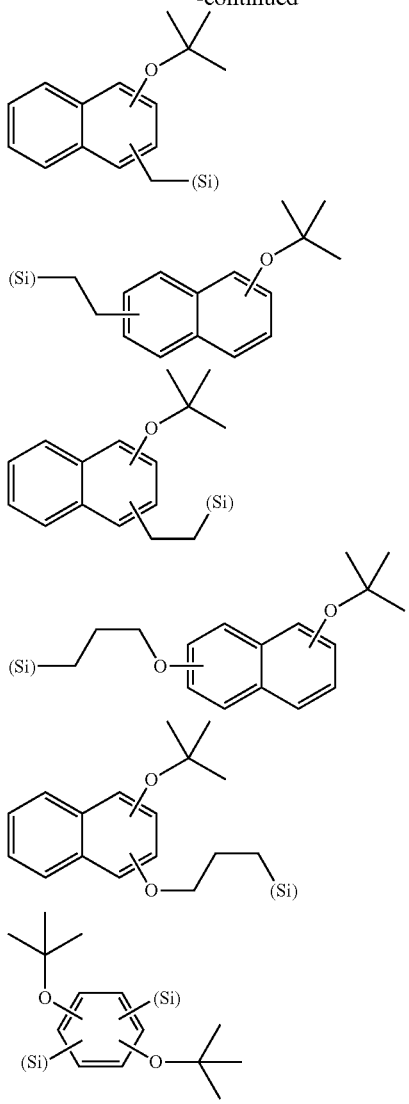

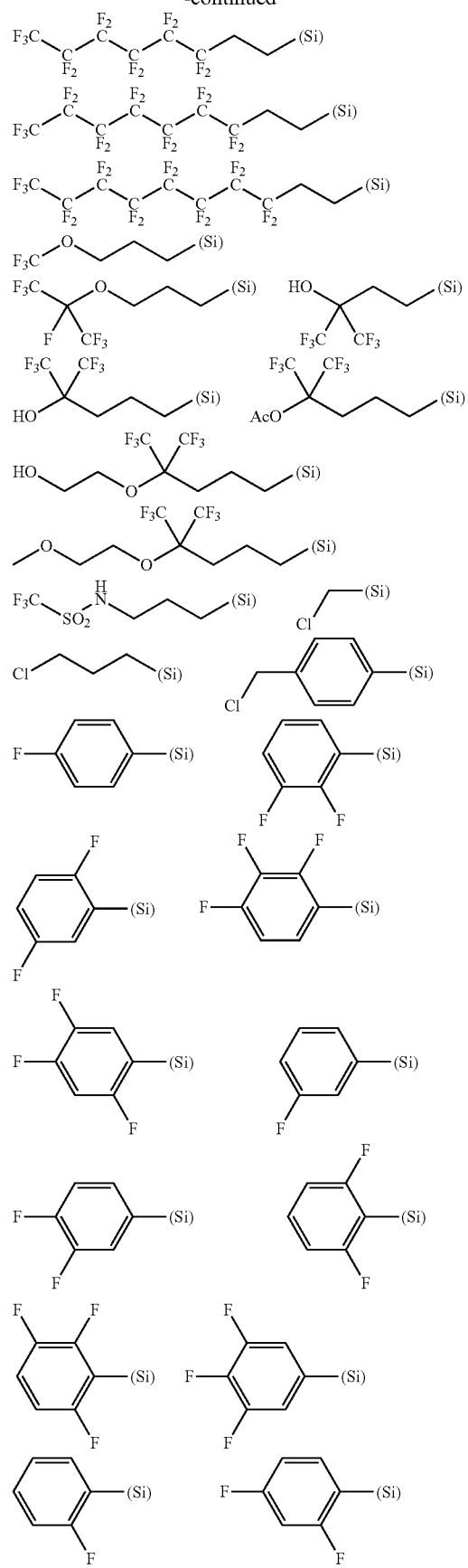

The polysiloxane contained in the composition for forming a silicon-containing film used in the present invention preferably contains a halogenated organic group. When the halogenated organic group is contained in the polysiloxane, the mask used for ion implantation can be accurately peeled. Preferably, halogen atom in the halogenated organic group is a fluorine atom or a chlorine atom.

The organic group in which the hydrogen atom(s) of the organic group represented by $R^{1A}$, $R^{2A}$, and $R^{3A}$ in the formula (A-1) is/are substituted by a halogen atom(s) can be exemplified by the following.

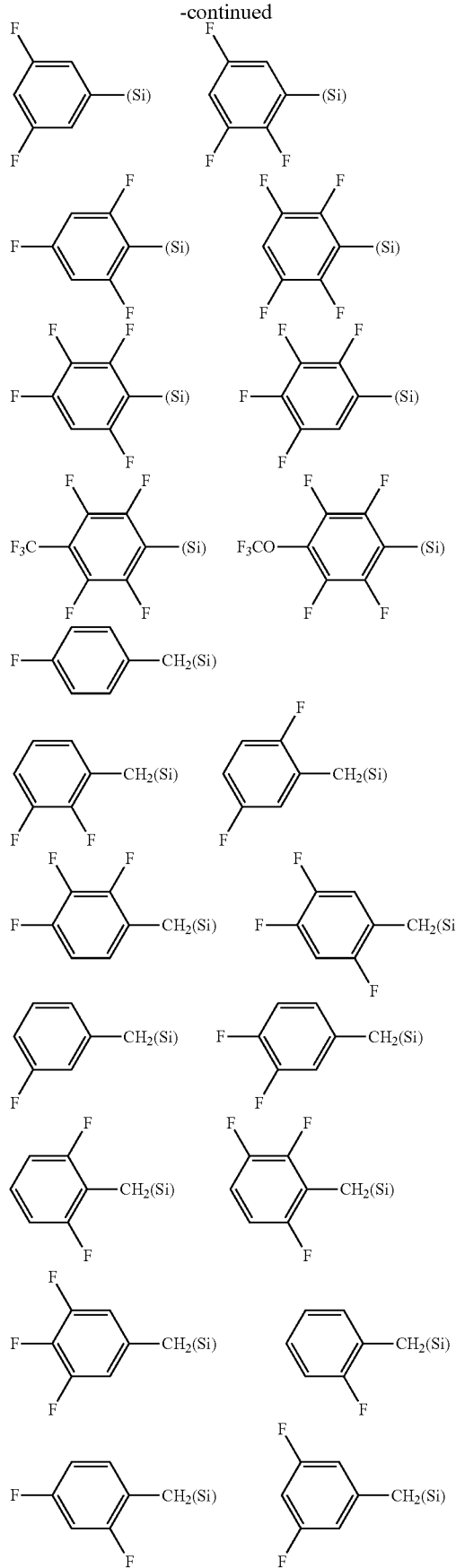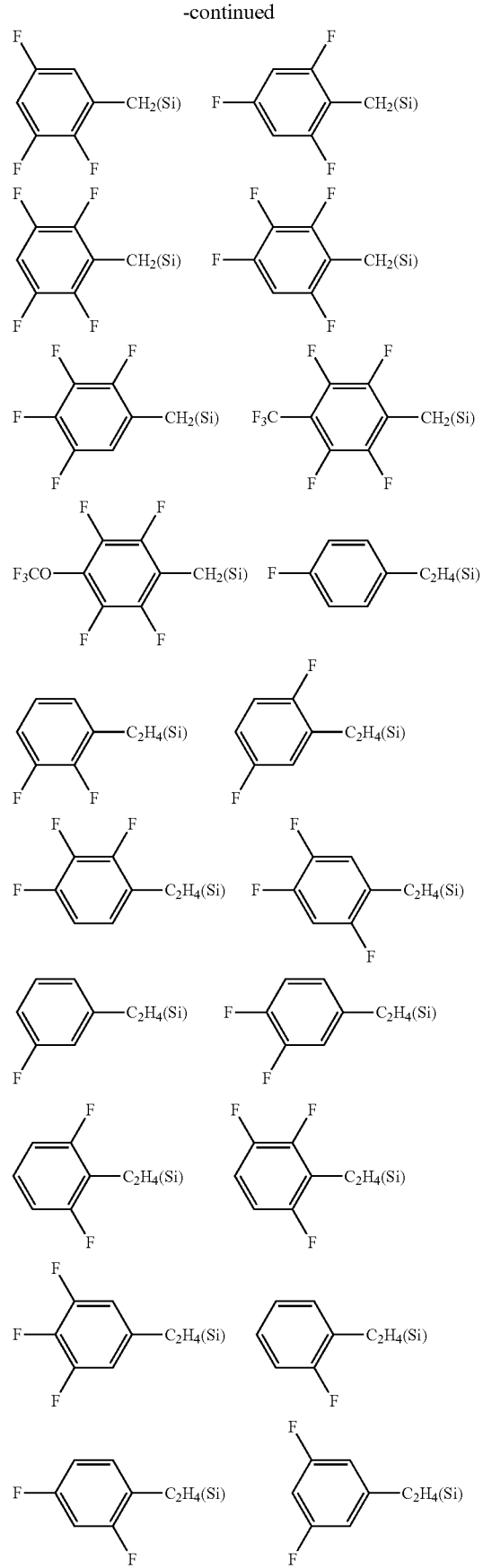

-continued
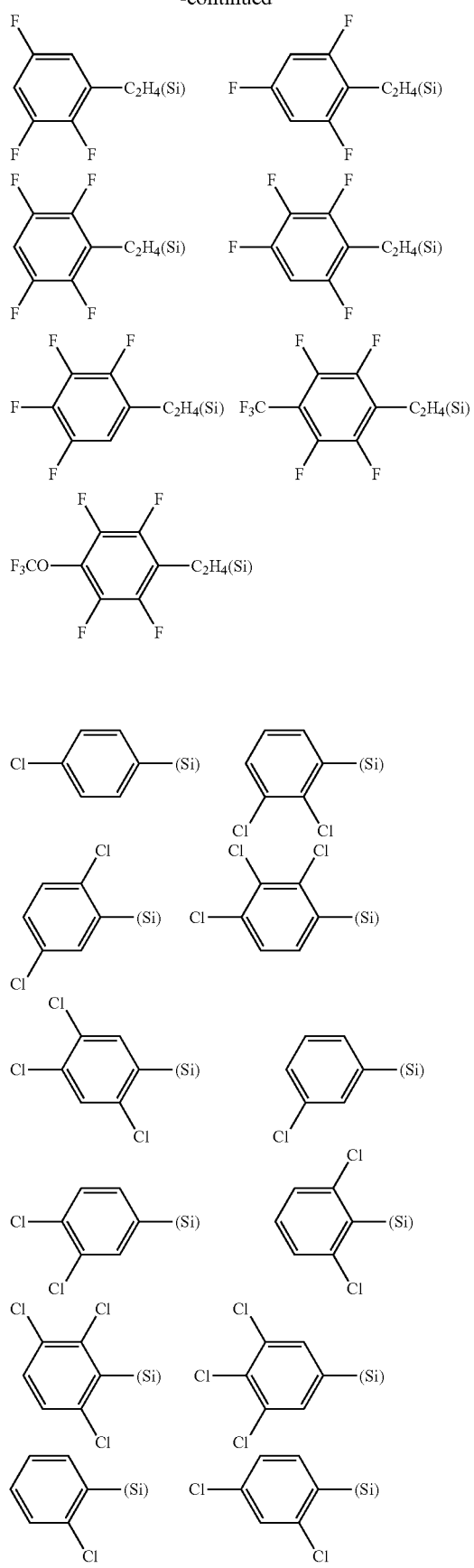
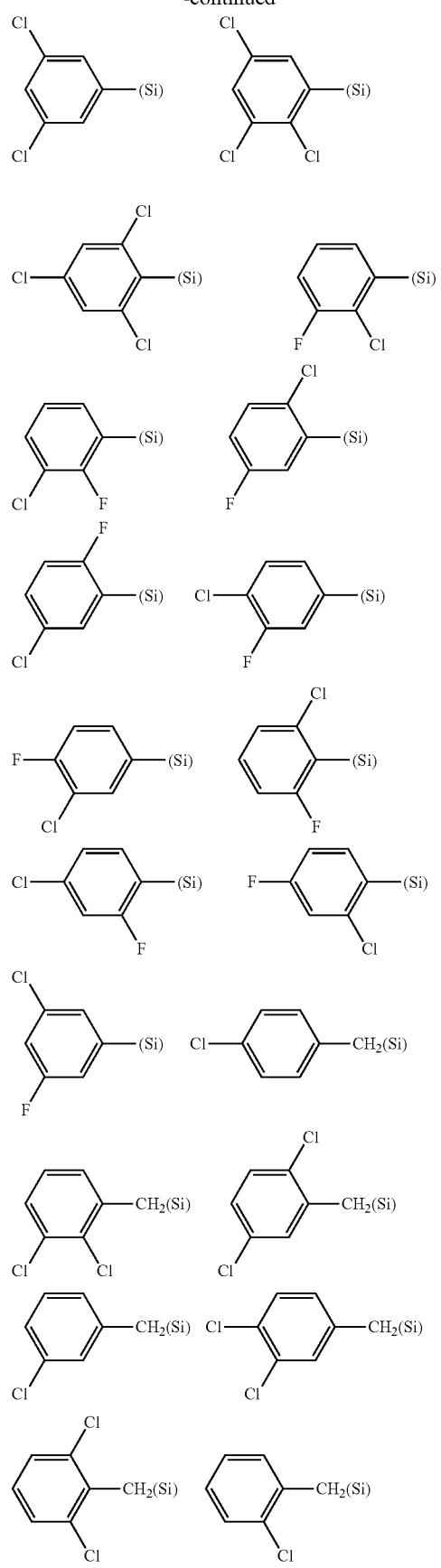

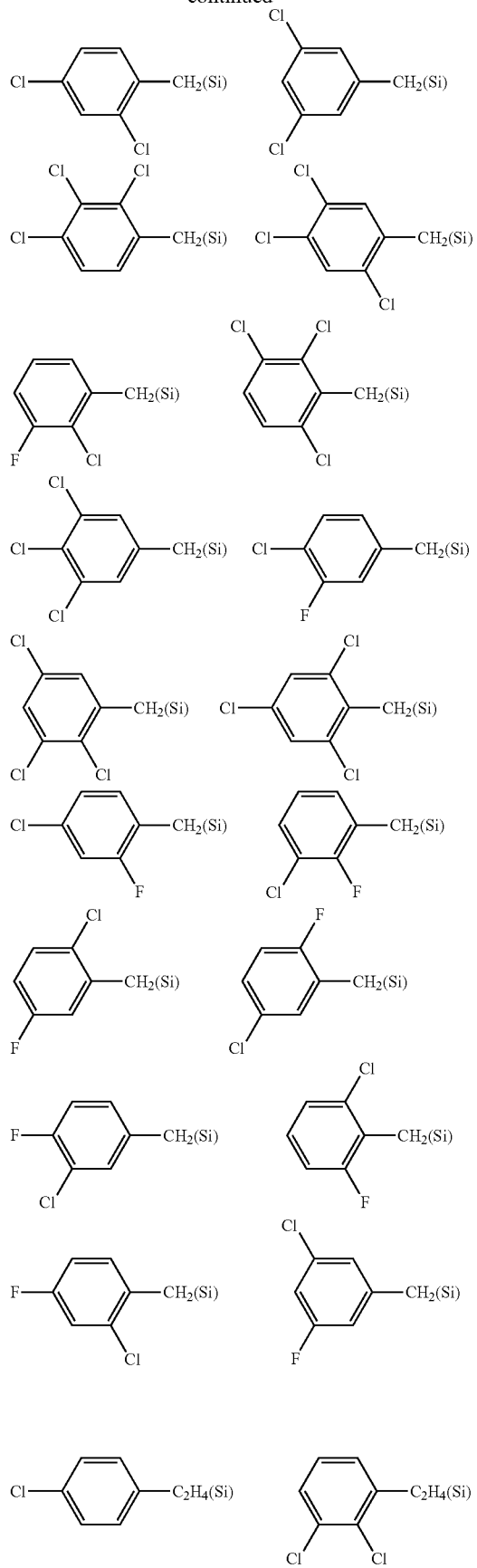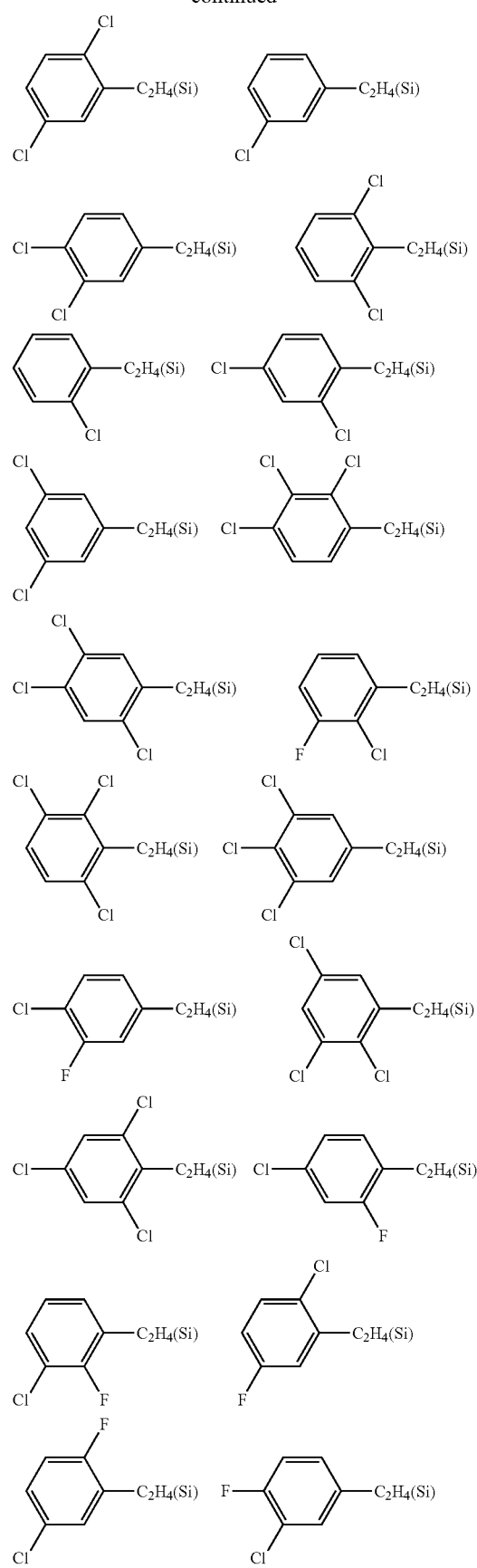

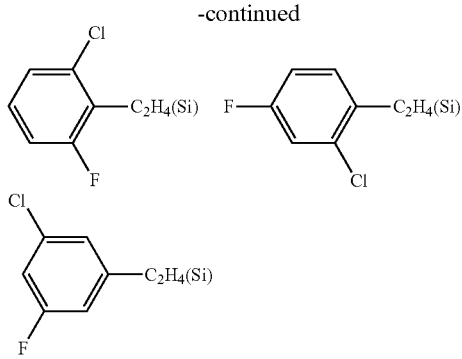

Other example of the organic groups represented by the above $R^{1A}$, $R^{2A}$, and $R^{3A}$ includes an organic group having one or more of a carbon-oxygen single bond or a carbon-oxygen double bond. Specifically, an organic group having one or more of a group selected from the group consisting of an epoxy group, an ester group, an alkoxy group, and a hydroxyl group may be mentioned. Illustrative example of this organic group includes an organic group represented by the following formula (A-2).

$$(P-Q_1-(S_a)_{v1}-Q_2-)_u-(T)_{v2}-Q_3-(S_b)_{v3}-Q_4-\quad (A-2)$$

wherein P represents a hydrogen atom,

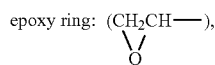

a hydroxyl group, an alkoxy group having 1 to 4 carbon atoms, an alkylcarbonyloxy group having 1 to 6 carbon atoms, or an alkylcarbonyl group having 1 to 6 carbon atoms; each of $Q_1$, $Q_2$, $Q_3$, and $Q_4$ independently represent —$C_qH_{(2q-p)}P_p$—, wherein P has the same meaning as defined above, p represents an integer of 0 to 3, q represents an integer of 0 to 10 (with the proviso that q=0 means a single bond); u represents an integer of 0 to 3; each of $S_a$ and $S_b$ independently represent —O—, —CO—, —OCO—, —COO—, or —OCOO—. Each of v1, v2, and v3 independently represent 0 or 1. Concurrently with the above, T represents divalent group comprising an alicycle or an aromatic ring optionally containing a heteroatom, and illustrative examples of the alicycle or the aromatic ring T optionally containing a heteroatom such as an oxygen atom include those shown below. In T, a bonding site between $Q_2$ and $Q_3$ is not particularly restricted; and the site is appropriately selected by considering reactivity due to steric factors, availability of commercially reagents, and so on.

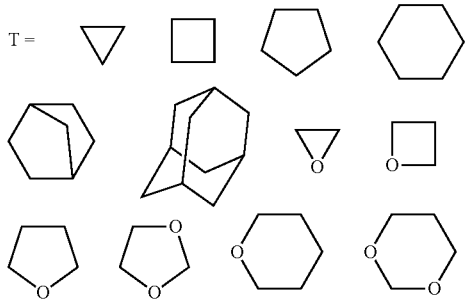

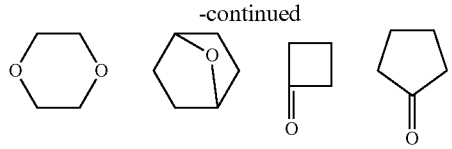
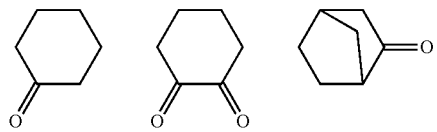
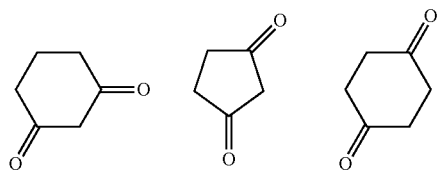
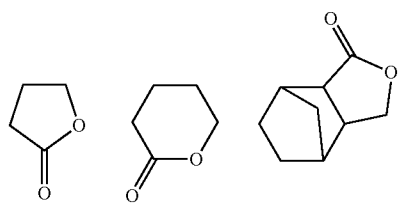
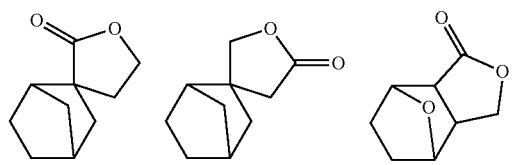
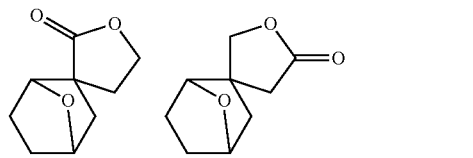
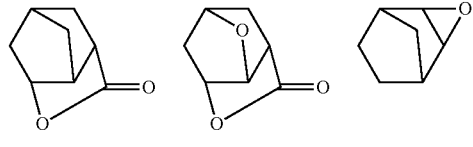
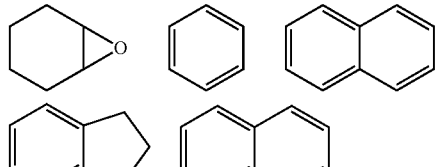
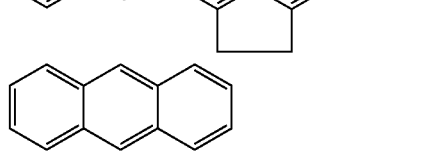

Preferable examples of the organic group having one or more of a carbon-oxygen single bond or a carbon-oxygen double bond in the above formula (A-2) include those shown below.

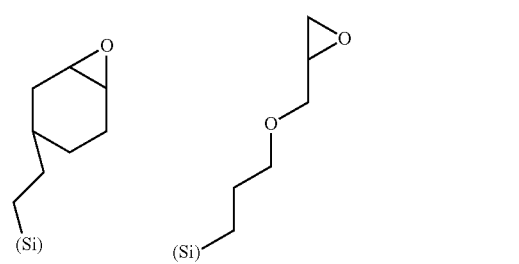
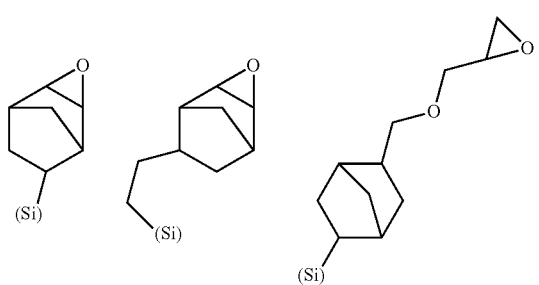
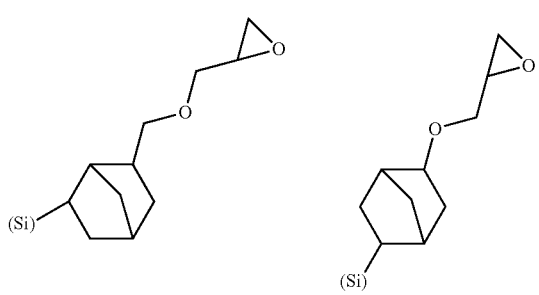
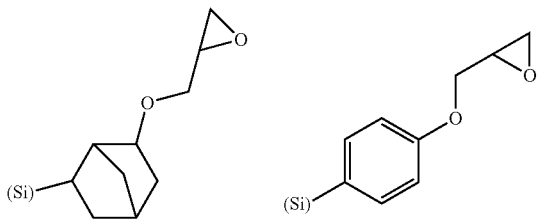
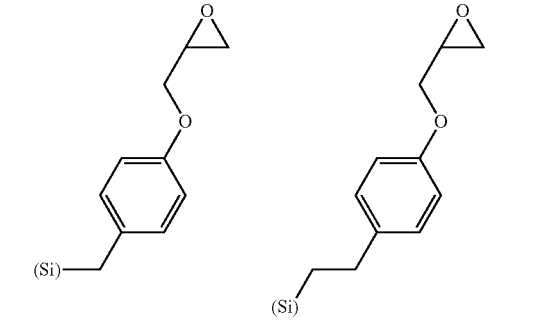
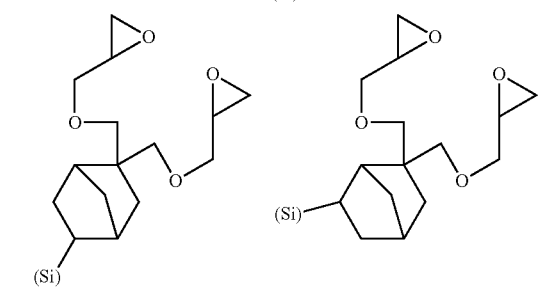
-continued
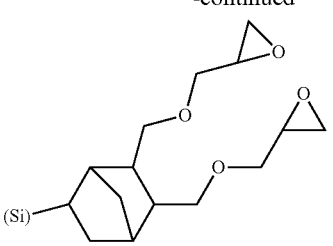
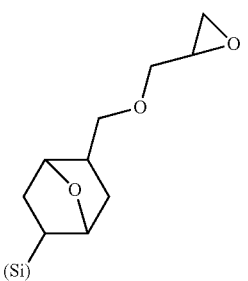
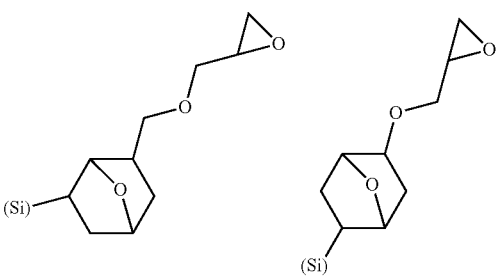
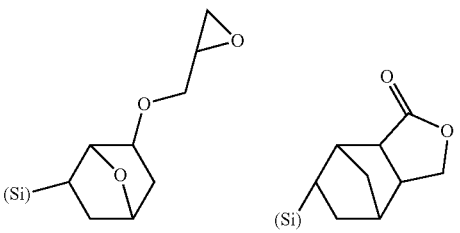
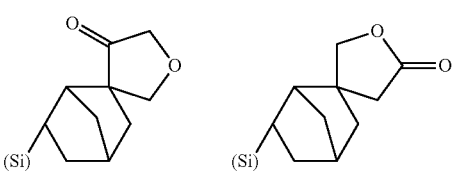
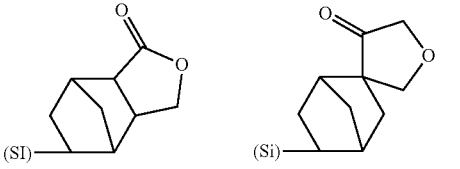
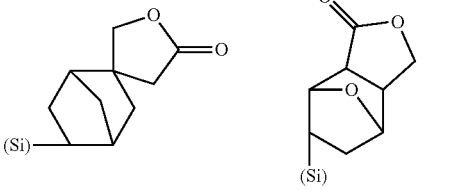

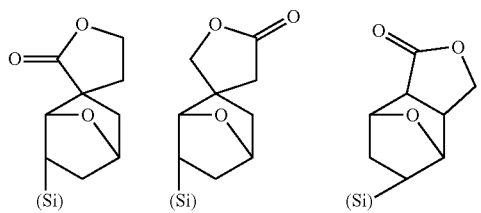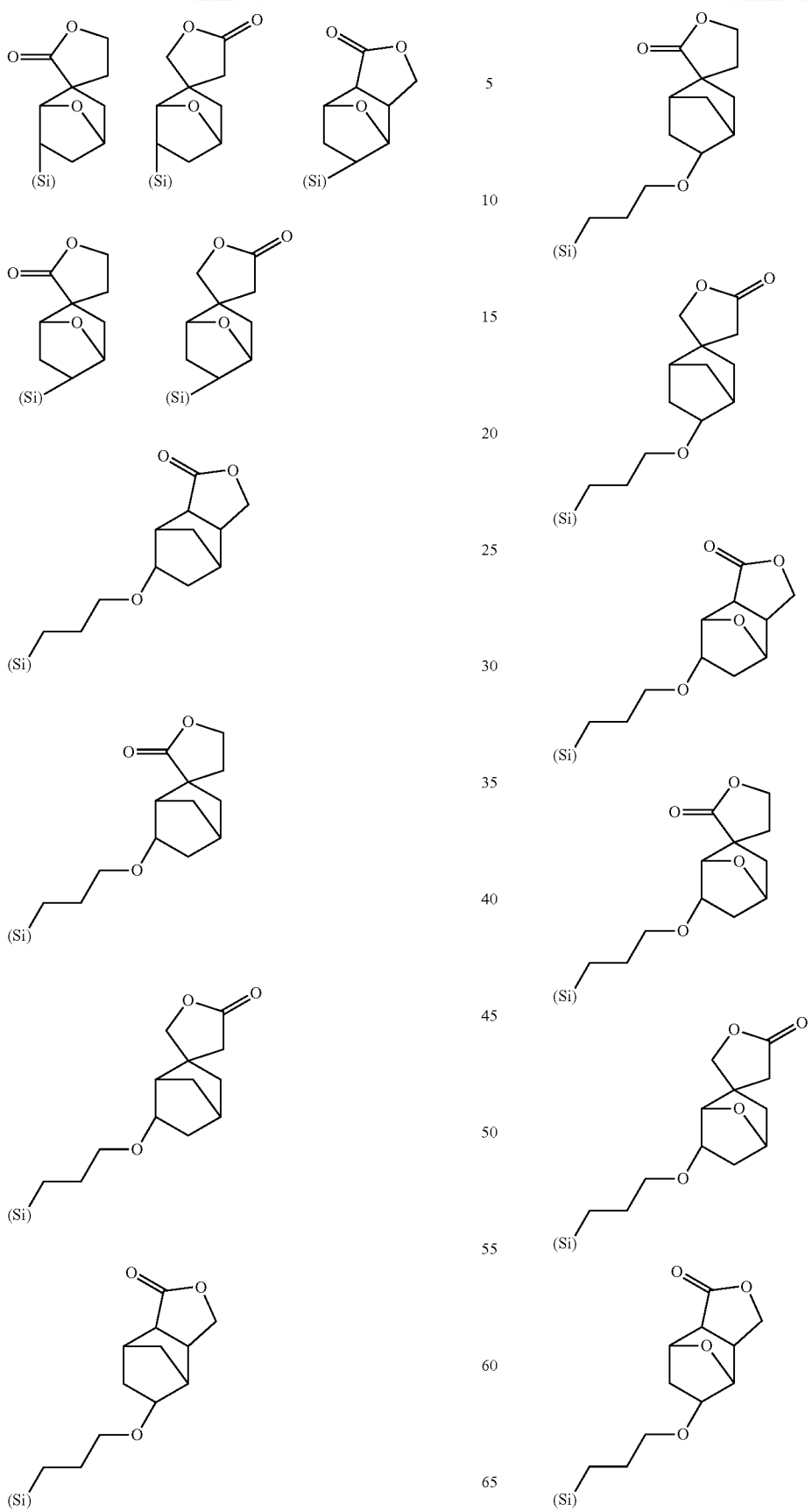

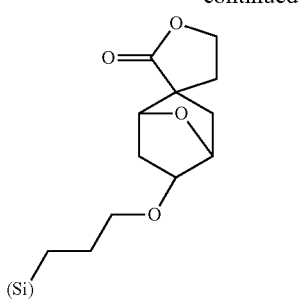
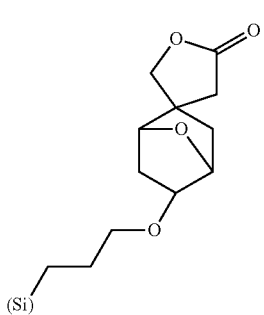
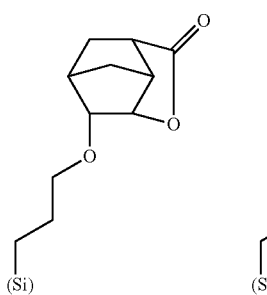
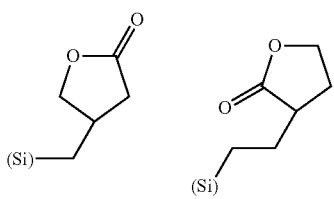
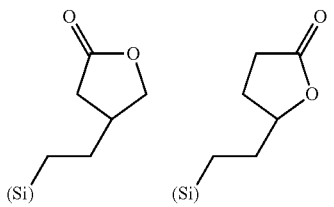
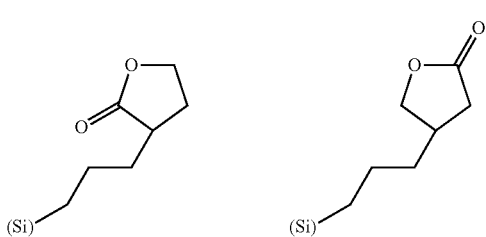
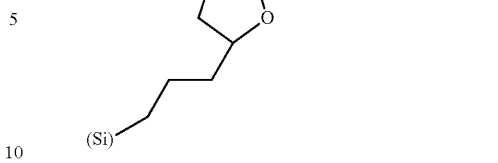
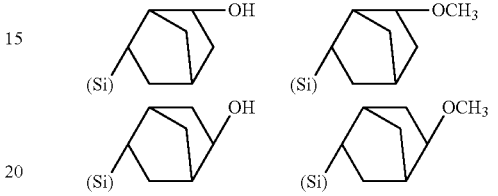
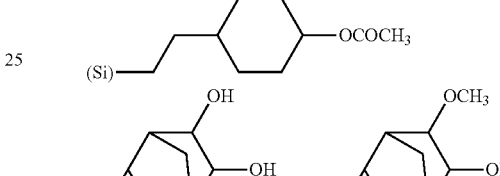
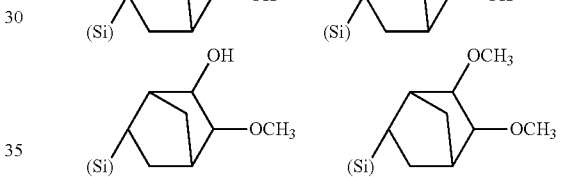
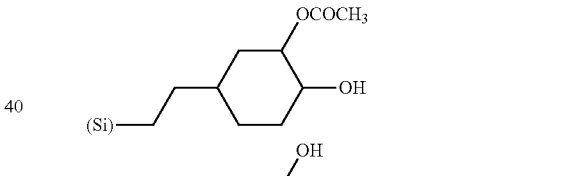
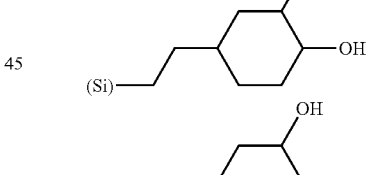
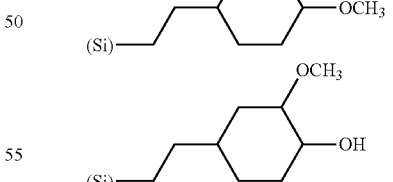
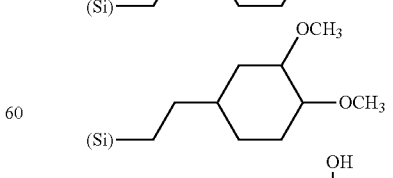
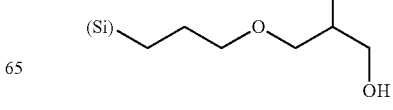

-continued

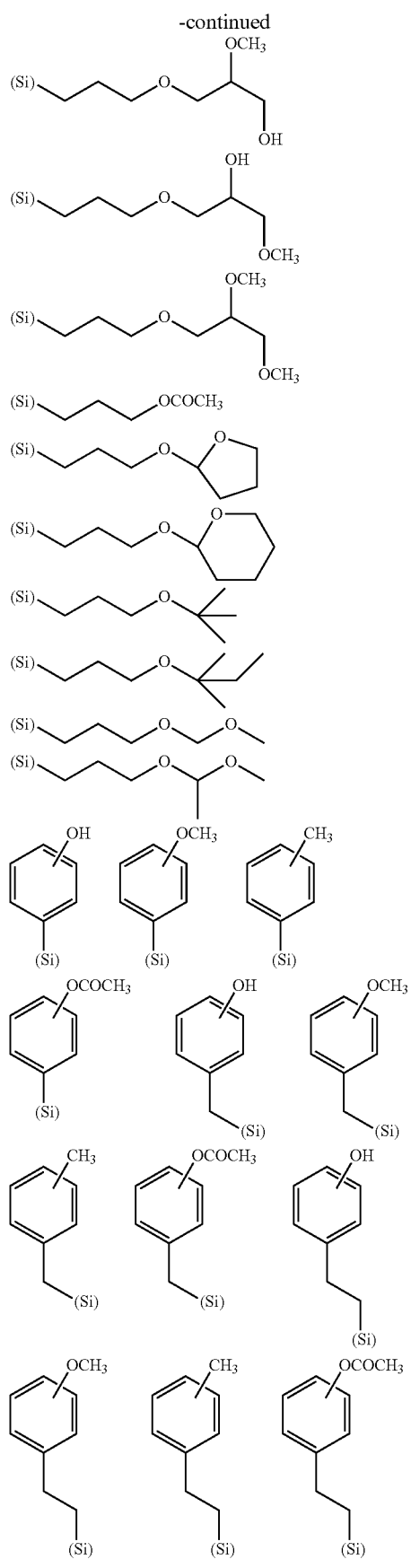

The polysiloxane contained in the composition for forming a silicon-containing film used in the present invention preferably contains a crosslinkable organic group. That is, among the above organic groups, those having the crosslinkable organic group are especially preferable. That is, among the above organic groups, those having a crosslinkable organic group are especially preferable. When such a crosslinkable organic group is contained in the polysiloxane, a silicon-containing film having better adhesion can be formed. Preferably, the crosslinkable organic group is any of an epoxy group, a phenol group, and a naphthol group.

Further, the organic groups represented by $R^{1A}$, $R^{2A}$, and $R^{3A}$ may be an organic group having a Si—Si bond. Illustrative examples thereof is shown below.

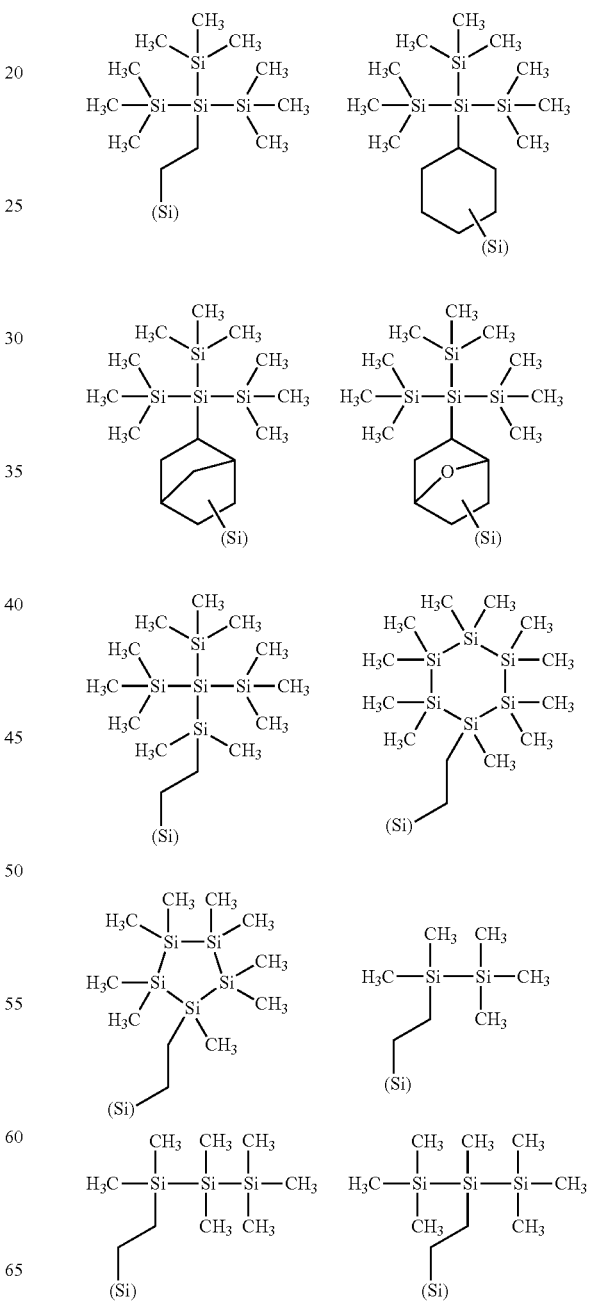

-continued

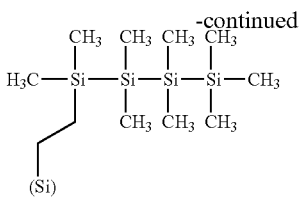

(Si)

The polysiloxane contained in the composition for forming a silicon-containing film of the present invention may contain a hydrolysable metal compound represented by the formula (A-3) as a starting material, in addition to the compound represented by the formula (A-1), $$L'(OR^{4A})_{A4}(OR^{5A})_{A5}(O)_{A6} \quad (A-3)$$

wherein $R^{4A}$ and $R^{5A}$ represent a hydrogen atom or an organic group having 1 to 30 carbon atoms; A4, A5, and A6 represent an integer of 0 or more, and A4+A5+A6 is a number of valency determined by L'; and L' represents an element belonging to the group III, IV, or V in the periodic table except for a carbon.

Examples of the hydrolysable metal compound represented by the formula (A-3) include the following compounds.

In the case that L' is boron, illustrative examples of the compound represented by the formula (A-3) include boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, and boron oxide.

In the case that L' is aluminum, illustrative examples of the compound represented by the formula (A-3) include aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl acetoacetate, aluminum dibutoxyethyl acetoacetate, aluminum propoxybisethyl acetoacetate, aluminum butoxybisethyl acetoacetate, aluminum 2,4-pentanedionate, and aluminum 2,2,6,6-tetramethyl-3,5-heptanedionate.

In the case that L' is gallium, illustrative examples of the compound represented by the formula (A-3) include gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl acetoacetate, gallium dibutoxyethyl acetoacetate, gallium propoxybisethyl acetoacetate, gallium butoxybisethyl acetoacetate, gallium 2,4-pentanedionate, and gallium 2,2,6,6-tetramethyl-3,5-heptanedionate.

In the case that L' is yttrium, illustrative examples of the compound represented by the formula (A-3) include yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl acetoacetate, yttrium dibutoxyethyl acetoacetate, yttrium propoxybisethyl acetoacetate, yttrium butoxybisethyl acetoacetate, yttrium 2,4-pentanedionate, and yttrium 2,2,6,6-tetramethyl-3,5-heptanedionate.

In the case that L' is germanium, illustrative examples of the compound represented by the formula (A-3) include germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

In the case that L' is titanium, illustrative examples of the compound represented by the formula (A-3) include titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxybisethyl acetoacetate, titanium dibutoxybisethyl acetoacetate, titanium dipropoxy bis-2,4-pentanedionate, and titanium dibutoxy bis-2,4-pentanedionate.

In the case that L' is hafnium, illustrative examples of the compound represented by the formula (A-3) include hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxybisethyl acetoacetate, hafnium dibutoxybisethyl acetoacetate, hafnium dipropoxy-bis-2,4-pentanedionate, and hafnium dibutoxybis-2,4-pentanedionate.

In the case that L' is tin, illustrative examples of the compound represented by the formula (A-3) include tin methoxide, tin ethoxide, tin propoxide, tin butoxide, tin phenoxide, tin methoxyethoxide, tin ethoxyethoxide, tin 2,4-pentanedionate, and tin 2,2,6,6-tetramethyl-3,5-heptanedionate.

In the case that L' is arsenic, illustrative examples of the compound represented by the formula (A-3) include arsenic methoxide, arsenic ethoxide, arsenic propoxide, arsenic butoxide, and arsenic phenoxide.

In the case that L' is antimony, illustrative examples of the compound represented by the formula (A-3) include antimony methoxide, antimony ethoxide, antimony propoxide, antimony butoxide, antimony phenoxide, antimony acetate, and antimony propionate.

In the case that L' is niobium, illustrative examples of the compound represented by the formula (A-3) include niobium methoxide, niobium ethoxide, niobium propoxide, niobium butoxide, and niobium phenoxide.

In the case that L' is tantalum, illustrative examples of the compound represented by the formula (A-3) include tantalum methoxide, tantalum ethoxide, tantalum propoxide, tantalum butoxide, and tantalum phenoxide.

In the case that L' is bismuth, illustrative examples of the compound represented by the formula (A-3) include bismuth methoxide, bismuth ethoxide, bismuth propoxide, bismuth butoxide, and bismuth phenoxide.

In the case that L' is phosphorous, illustrative examples of the compound represented by the formula (A-3) include trimethyl phosphite, triethyl phosphite, tripropyl phosphite, trimethyl phosphate, triethyl phosphate, tripropyl phosphate, and diphosphorous-pentaoxide.

In the case that L' is vanadium, illustrative examples of the compound represented by the formula (A-3) include vanadium oxide bis(2,4-pentanedionate), vanadium 2,4-pentanedionate, vanadium tributoxide oxide, and vanadium tripropoxide oxide.

In the case that L' is zirconium, illustrative examples of the compound represented by the formula (A-3) include zirconium methoxide, zirconium ethoxide, zirconium propoxide, zirconium butoxide, zirconium phenoxide, zirconium dibutoxide bis(2,4-pentanedionate), and zirconium dipropoxide bis(2,2,6,6-tetramethyl-3,5-heptanedionate).

One or more compounds mentioned above may be selected and mixed before or during the reaction to be used as the starting material (monomer) for producing the polysiloxane.

The polysiloxane used in the composition for forming a silicon-containing film of the present invention may be produced, for example, by hydrolysis condensation of the compounds represented by the formula (A-1), and if necessary, the compounds represented by the formula (A-3), by using one or more compounds selected from inorganic acid, aliphatic sulfonic acid, and aromatic sulfonic acid as an acid catalyst.

Illustrative examples of the acid catalyst used for the reaction include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The amount of the catalyst to be used is preferably in the range of $1 \times 10^{-6}$ to 10 mol, more preferably $1 \times 10^{-5}$ to 5 mol, and much more preferably $1 \times 10^{-4}$ to 1 mol per 1 mol of the monomers.

The amount of water for obtaining the polysiloxane by hydrolysis condensation of these monomers is preferably in the range of 0.01 to 100 mol, more preferably 0.05 to 50 mol, much more preferably 0.1 to 30 mol per 1 mol of a hydrolysable substituent bonded to the monomers. If the amount is 100 mol or less, a reaction device does not become excessively large, therefore it is economical.

As an operation manner, the monomers are added to a catalyst aqueous solution to start hydrolysis condensation reaction. In the manner, an organic solvent may be added to the catalyst aqueous solution, the monomers may be diluted with an organic solvent, or both may be performed. The reaction temperature is preferably in the range of 0 to 100° C., and more preferably 5 to 80° C. A method including maintaining the temperature at 5 to 80° C. while the monomers are added dropwise, and then aging the mixture at 20 to 80° C. is preferable.

Illustrative examples of the organic solvent that can be added to the catalyst aqueous solution, or can dilute the monomers, include methanol, ethanol, 1-propanol, 2-propanol, 1-butanol, 2-butanol, 2-methyl-1-propanol, ethylene glycol, propylene glycol, acetone, acetonitrile, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butyl ether acetate, γ-butyrolactone, and mixture thereof.

Among them, water-soluble solvents are preferable. Illustrative examples thereof include alcohols such as methanol, ethanol, 1-propanol, and 2-propanol; polyvalent alcohols such as ethylene glycol and propylene glycol; polyvalent alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone; acetonitrile; tetrahydrofuran; etc. Particularly preferable is a solvent with a boiling point of 100° C. or less.

The amount of the organic solvent to be used is preferably in the range of 0 to 1,000 mL, and particularly preferably 0 to 500 mL per 1 mol of the monomers. If the amount is in such a range, a reaction vessel does not become excessively large, therefore it is economical.

Thereafter, if necessary, neutralization reaction of the catalyst is carried out, and alcohol produced by hydrolysis condensation reaction is removed under reduced pressure to obtain a reaction mixture aqueous solution. The amount of an alkaline substance to be used for neutralization is preferably 0.1 to 2 equivalent weight with respect to an acid used as the catalyst. The alkaline substance may be any substance so long as it shows basicity in water.

Subsequently, it is preferable that by-products such as alcohol produced by hydrolysis condensation reaction be removed from the reaction mixture. The temperature for heating the reaction mixture is preferably in the range of 0 to 100° C., more preferably 10 to 90° C., and much more preferably 15 to 80° C. though it is depending on the kinds of the added organic solvent and the alcohol produced by reaction. Degree of vacuum in this operation is preferably an atmospheric pressure or less, more preferably 80 kPa or less in the absolute pressure, and much more preferably 50 kPa or less in the absolute pressure though it is depending on the kinds of the organic solvent and the alcohol to be removed, an exhausting equipment, a condensation equipment, and heating temperature. Although it is difficult to know exactly the amount of the alcohol removed, it is preferable that about 80% by mass or more of the produced alcohol and so forth be removed.

Next, the acid catalyst used for hydrolysis condensation may be removed from the reaction mixture. A method for removing the acid catalyst may be to mix water and the polysiloxane, and then extract the polysiloxane by an organic solvent. As the organic solvent, an organic solvent that can dissolve the polysiloxane, and be separated into two layers when mixed with water is preferably used. Illustrative examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butyl ether acetate, γ-butyrolactone, methyl isobutyl ketone, cyclopentyl methyl ether, etc., and mixture thereof.

Moreover, a mixture of a water-soluble organic solvent and a slightly water-soluble organic solvent can also be used. Preferable examples thereof include methanol+ethyl acetate mixture, ethanol+ethyl acetate mixture, 1-propanol+ethyl acetate mixture, 2-propanol+ethyl acetate mixture, butanediol monomethyl ether+ethyl acetate mixture, propylene glycol monomethyl ether+ethyl acetate mixture, ethylene glycol monomethyl ether+ethyl acetate mixture, butanediol monoethyl ether+ethyl acetate mixture, propylene glycol monoethyl ether+ethyl acetate mixture, ethylene glycol monoethyl ether+ethyl acetate mixture, butanediol monopropyl ether+ethyl acetate mixture, propylene glycol monopropyl ether+ethyl acetate mixture, ethylene glycol monopropyl ether+ ethyl acetate mixture, methanol+methyl isobutyl ketone mixture, ethanol+methyl isobutyl ketone mixture, 1-propanol+methyl isobutyl ketone mixture, 2-propanol+methyl isobutyl ketone mixture, propylene glycol monomethyl ether+methyl isobutyl ketone mixture, ethylene glycol monomethyl ether+methyl isobutyl ketone mixture, propylene glycol monoethyl ether+methyl isobutyl ketone mixture, ethylene glycol monoethyl ether+methyl isobutyl ketone mixture, propylene glycol monopropyl ether+methyl isobutyl ketone mixture, ethylene glycol monopropyl ether+methyl isobutyl ketone mixture, methanol+cyclopentyl methyl ether mixture, ethanol+cyclopentyl methyl ether mixture, 1-propanol+cyclopentyl methyl ether mixture, 2-propanol+cyclopentyl methyl ether mixture, propylene glycol monomethyl ether+cyclopentyl methyl ether mixture, ethylene glycol monomethyl ether+cyclopentyl methyl ether mixture, propylene glycol monoethyl ether+cyclopentyl methyl ether mixture, ethylene glycol monoethyl ether+cyclopentyl methyl ether mixture, propylene glycol monopropyl ether+cyclopentyl methyl ether mixture, ethylene glycol monopropyl ether+ cyclopentyl methyl ether mixture, methanol+propylene glycol methyl ether acetate mixture, ethanol+propylene glycol methyl ether acetate mixture, 1-propanol+propylene glycol methyl ether acetate mixture, 2-propanol+propylene glycol methyl ether acetate mixture, propylene glycol monomethyl ether+propylene glycol methyl ether acetate mixture, ethylene glycol monomethyl ether+propylene glycol methyl ether acetate mixture, propylene glycol monoethyl ether+propylene glycol methyl ether acetate mixture, ethylene glycol monoethyl ether+propylene glycol methyl ether acetate mixture, propylene glycol monopropyl ether+propylene glycol methyl ether acetate mixture, ethylene glycol monopropyl ether+propylene glycol methyl ether acetate mixture, etc., but are not restricted to the combination of these mixtures.

The mixing ratio of the water-soluble organic solvent and the slightly water-soluble organic solvent is appropriately determined. The amount of the water-soluble organic solvent is preferably in the range of 0.1 to 1,000 parts by mass, more preferably 1 to 500 parts by mass, and much more preferably 2 to 100 parts by mass, based on 100 parts by mass of the slightly water-soluble organic solvent.

Subsequently, the reaction mixture may be washed with neutral water. The neutral water may be water called deionized water or ultrapure water. The amount of the water is preferably in the range of 0.01 to 100 L, more preferably 0.05 to 50 L, and much more preferably 0.1 to 5 L per 1 L of the polysiloxane solution. The washing may be carried out in such a way that the both the polysiloxane solution and water are mixed in a vessel by stirring, and then settled to separate a water layer. The number of washing may be one or more, and preferably about 1 to 5 times because washing of 10 times or more is not worth to have full effects thereof.

Other methods for removing the acid catalyst include a method using an ion-exchange resin, and a method for removing an acid catalyst after neutralization with epoxy compounds such as ethylene oxide and propylene oxide. These methods can be appropriately selected according to the acid catalyst used in the reaction.

In the operation of water-washing, there is a case that a part of the polysiloxane escapes into a water layer, thereby substantially the same effect as fractionation operation is obtained. Therefore, the number of washing and the amount of water for washing may be appropriately determined in view of effects of catalyst removal and fractionation.

A final solvent is then added to the polysiloxane solution even when the acid catalyst remains therein or has been removed therefrom, and solvent-exchange is thereby performed under reduced pressure to obtain a desired solution of the polysiloxane. The temperature during the solvent-exchange is preferably in the range of 0 to 100° C., more preferably 10 to 90° C., and much more preferably 15 to 80° C. though it is depending on the kinds of the reaction solvent and the extraction solvent to be removed. Degree of vacuum in this operation is preferably an atmospheric pressure or less, more preferably 80 kPa or less in the absolute pressure, and much more preferably 50 kPa or less in the absolute pressure though it is depending on the kinds of the solvents to be removed, an exhausting equipment, condensation equipment, and heating temperature.

In this operation, sometimes the polysiloxane may become unstable because the solvent was exchanged. This occurs due to compatibility of the polysiloxane with the final solvent. Thus, in order to prevent this from occurring, a stabilizer mentioned later may be added thereto. The amount thereof to be added is preferably in the range of 0 to 25 parts by mass, more preferably 0 to 15 parts by mass, and much more preferably 0 to 5 parts by mass, or 0.5 parts by mass or more when it is added, based on 100 parts by mass of the polysiloxane contained in the solution before the solvent-exchange. If necessary, the stabilizer may be added to the solution before the solvent-exchange operation.

The concentration of the polysiloxane solution is preferably in the range of 0.1 to 20% by mass. If the concentration is in such a range, condensation reaction of the polysiloxane does not progress; thereby the polysiloxane does not change to the state that it cannot be dissolved into an organic solvent again. Further, if the concentration is in such a range, the amount of the solvent becomes appropriate, therefore it is economical.

Preferable examples of the final solvent added to the polysiloxane solution include alcohol solvents, and particularly monoalkyl ether derivatives of ethylene glycol, diethylene glycol, triethylene glycol, propylene glycol, dipropylene glycol, butanediol, or the like. Illustrative examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, etc.

In addition, if these solvents are a main solvent, a non-alcoholic solvent may be added thereinto as an adjuvant solvent. Illustrative examples of this adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butyl ether acetate, γ-butyrolactone, methyl isobutyl ketone, cyclopentyl methyl ether, etc.

As an alternative operation manner, water or a water-containing organic solvent may be added to the monomers or an organic solution of the monomers to start hydrolysis reaction. In the manner, the catalyst may be added to the monomers or the organic solution of the monomers, or may be added to the water or the water-containing organic solvent. The reaction temperature is preferably in the range of 0 to 100° C., and more preferably 10 to 80° C. A method including heating the mixture at 10 to 50° C. while water is added dropwise, and then increasing the temperature to 20 to 80° C. to age the mixture is preferable.

As the organic solvent, water-soluble solvent is preferable, and illustrative examples thereof include alcohols such as methanol, ethanol, 1-propanol, 2-propanol, 1-butanol, 2-butanol, and 2-methyl-1-propanol; polyvalent alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; acetone; tetrahydrofuran; acetonitrile, etc., and a mixture thereof.

The amount of the organic solvent to be used may be the same amount as above. The obtained reaction mixture may be post-treated like the above-mentioned method to obtain the polysiloxane.

Alternatively, the polysiloxane used in the composition for forming a silicon-containing film of the present invention may be produced, for example, by hydrolysis condensation of the compounds represented by the formula (A-1), and if necessary, the compounds represented by the formula (A-3), in the presence of a base catalyst.

Illustrative examples of the base catalyst include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethylmonoethanolamine, monomethyl-diethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, etc. The amount of the catalyst to be used is usually in the range of $1 \times 10^{-6}$ to 10 mol, preferably $1 \times 10^{-5}$ to 5 mol, more preferably $1 \times 10^{-4}$ to 1 mol per 1 mol of the monomers.

The amount of water for obtaining the polysiloxane by hydrolysis condensation of these monomers is preferably in the range of 0.1 to 50 mol per 1 mol of a hydrolysable substituent bonded to the monomers. If the amount is 50 mol or less, a reaction device does not become excessively large, therefore it is economical.

As an operation manner, the monomers are added to a catalyst aqueous solution to start hydrolysis condensation reaction. In the manner, an organic solvent may be added to the catalyst aqueous solution, the monomers may be diluted with an organic solvent, or both may be performed. The reaction temperature is preferably in the range of 0 to 100° C., and more preferably 5 to 80° C. A method including maintaining the temperature at 5 to 80° C. while the monomers are added dropwise, and then aging the mixture at 20 to 80° C. is preferable.

As the organic solvent that can be added to the base catalyst aqueous solution, or can dilute the monomers, the same solvents as those exemplified for the organic solvent that can be added to the acid catalyst aqueous solution are preferably used. The amount of the organic solvent to be used is preferably in the range of 0 to 1,000 mL, and particularly preferably 0 to 500 mL per 1 mol of the monomers. By using such an amount, a reaction vessel does not become excessively large, therefore it is economical.

Thereafter, if necessary, neutralization reaction of the catalyst is carried out, and alcohol produced by hydrolysis condensation reaction is removed under reduced pressure to obtain a reaction mixture aqueous solution. The amount of an acid substance to be used for neutralization is preferably 0.1 to 2 equivalent weight with respect to basic substance used as the catalyst. The acid substance may be any substance so long as it shows acidity in water.

Subsequently, it is preferable that by-products such as alcohol produced by hydrolysis condensation reaction be removed from the reaction mixture. The temperature for heating the reaction mixture and degree of vacuum may be the same temperature and degree of vacuum as in the case of using the acid catalyst.

Next, the base catalyst used for hydrolysis condensation may be removed from the reaction mixture. A method for removing the base catalyst may be to mix water and the polysiloxane, and then extract the polysiloxane by an organic solvent. As the organic solvent, the same solvent as those exemplified for the organic solvent used for removing the acid catalyst as mentioned above may be used.

Furthermore, a mixture of a water-soluble organic solvent and a slightly water-soluble organic solvent can also be used. As the mixture of a water-soluble organic solvent and a slightly water-soluble organic solvent, the same mixture as exemplified above for the mixture used for removing the acid catalyst may be used.

The mixing ratio of the water-soluble organic solvent and the slightly water-soluble organic solvent may be the same ratio as those used for removing the acid catalyst.

Subsequently, the reaction mixture may be washed with neutral water. The neutral water may be water called deionized water or ultrapure water. The amount of the water, the washing method, and the number of washing may be the same as in the case of using the acid catalyst.

Also, in the operation of water-washing, there is a case that a part of the polysiloxane escapes into a water layer, thereby substantially the same effect as fractionation operation is obtained. Therefore, the number of washing and the amount of water for washing may be appropriately determined in view of effects of catalyst removal and fractionation.

A final solvent is then added to the polysiloxane solution even when the base catalyst remains therein or has been removed therefrom, and solvent-exchange is thereby performed under reduced pressure to obtain a desired solution of the polysiloxane. The temperature and degree of vacuum during the solvent-exchange, and final concentration of the polysiloxane solution may be the same in the case of using the acid catalyst.

Also, the final solvent added to the polysiloxane solution may be the same as in the case of using the acid catalyst.

Moreover, a stabilizer may be added thereto like the case of using the acid catalyst.

As an alternative operation manner, water or a water-containing organic solvent may be added to the monomers or an organic solution of the monomers to start hydrolysis reaction. In the manner, the catalyst may be added to the monomers or the organic solution of the monomers, or may be added to the water or the water-containing organic solvent. The reaction temperature is preferably in the range of 0 to 100° C., and more preferably 10 to 80° C. A method including heating the mixture at 10 to 50° C. while water is added dropwise, and then increasing the temperature to 20 to 80° C. to age the mixture is preferable.

When the organic solvent is used, the same solvents as in the case of using the acid catalyst may be used.

The molecular weight of the polysiloxane thus obtained can be adjusted not only by selecting monomers, but also controlling reaction conditions during polymerization. The weight average molecular weight of the polysiloxane is preferably 100,000 or less, more preferably in the range of 200 to 50,000, and much more preferably 300 to 30,000. If the weight average molecular weight is 100,000 or less, generation of foreign matters and coating spots can be suppressed.

Meanwhile, the above weight average molecular weight is obtained as data, in terms of polystyrene as a reference material, by means of gel-permeation chromatography (GPC) using refractive index (RI) detector as a detector and tetrahydrofuran as an eluent.

(Other Additives)

To improve stability of the composition for forming a silicon-containing film of the present invention, a monovalent, divalent or more polyvalent organic acid having 1 to 30 carbon atoms is preferably added thereinto. Preferable examples of the organic acid include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, etc. Especially, oxalic acid, maleic acid, formic acid, acetic acid, propionic acid, citric acid, and the like are preferable. To keep stability, two or more kinds of these acids may be used as a mixture. The amount thereof to be added is preferably in the range of 0.001 to 25 parts by mass, more preferably 0.01 to 15 parts by mass, and much more preferably 0.1 to 5 parts by mass, based on 100 parts by mass of the polysiloxane contained in the composition.

Alternatively, the organic acid is preferably added such that pH of the composition becomes preferably $0 \leq pH \leq 7$, more preferably $0.3 \leq pH \leq 6.5$, and much more preferably $0.5 \leq pH \leq 6$.

Moreover, water may be added to the composition for forming a silicon-containing film of the present invention. When water is added thereinto, the polysiloxane is hydrated whereby improving a lithography performance. Water content in the solvent component of the composition is preferably more than 0% and less than 50% by mass, more preferably in the range of 0.3 to 30% by mass, and much more preferably 0.5 to 20% by mass.

The amount of all solvents including water is preferably in the range of 100 to 100,000 parts by mass, and more preferably 200 to 50,000 parts by mass, based on 100 parts by mass of the base polymer (polysiloxane). By adding in such an amount, lithography performance can be improved, and uniformity of the coated film does not tend to be deteriorated, thereby causing of eye holes can be suppressed.

An acid generator which generates an acid by the action of heat, light, or both may be added to the composition for forming a silicon-containing film used in the present invention. Illustrative examples of the acid generator include acid generators described in paragraphs (0061) to (0084) of Japanese Patent Laid-Open Publication No. 2007-199653.

An organic compound containing fluorine may be added to the composition for forming a silicon-containing film used in the present invention. Illustrative examples thereof include the following compounds.

The organic compound containing fluorine is not particularly limited so long as it can be dissolved in a solvent used for the composition for forming a silicon-containing film. For example, an organic compound containing one or more of repeating units represented by the following formulae (F1) to (F4) is preferred.

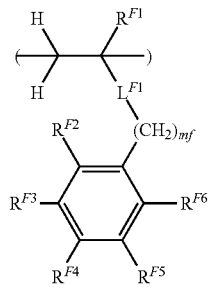

(F1)

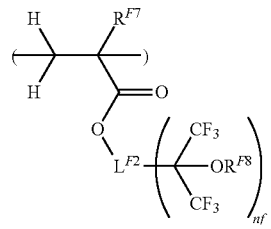

(F2)

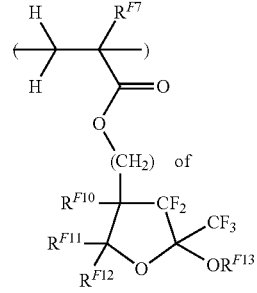

(F3)

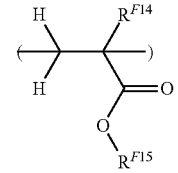

(F4)

In these formulae, each of $R^{F1}$, $R^{F7}$, $R^{F9}$, and $R^{F14}$ independently represent a hydrogen atom, a methyl group, a fluorine atom, or a trifluoromethyl group.

Each of $R^{F2}$ to $R^{F6}$ independently represent a hydrogen atom, a fluorine atom, a trifluoromethyl group, $-C(CF_3)_2 OR^{F16}$, or an alkyl group or an alkoxy group having 1 to 5 carbon atoms and whose one or more hydrogen atom(s) may be substituted by a fluorine atom(s), and one or more of $R^{F2}$ to $R^{F6}$ are a fluorine atom, or a group containing fluorine. When $R^{F2}$ to $R^{F6}$ are the alkoxy group having 1 to 5 carbon atoms and whose one or more hydrogen atom(s) may be substituted by a fluorine atom(s), illustrative examples thereof include a methoxy group, an ethoxy group, a n-propoxy group, an isopropoxy group, a n-butoxy group, a s-butoxy group, a t-butoxy group, a cyclobutoxy group, a n-pentoxy group, and a cyclopentoxy group. A part of or all of hydrogen atom(s) in the groups may be substituted by a fluorine atom(s).

Each of $R^{F16}$, $R^{F8}$, and $R^{F13}$ independently represents a hydrogen atom, or a linear, branched, or cyclic monovalent organic group having 1 to 22 carbon atoms. As the monovalent organic group, various protecting group of hydroxyl group can be used. Examples thereof include a monovalent hydrocarbon group such as a methyl group, an ethyl group, a propyl group, an isopropyl group, a n-butyl group, a s-butyl group, a t-butyl group, a t-amyl group, a n-pentyl group, a n-hexyl group, a n-heptyl group, a n-octyl group, a n-nonyl group, a n-decyl group, an icosanyl group, a cyclopropyl group, a cyclobutyl group, a cyclopentyl group, a cyclopentylmethyl group, a cyclopentylethyl group, a cyclopentylbutyl group, a cyclohexyl group, a cyclohexylmethyl group, a cyclohexylethyl group, a cyclohexylbutyl group, a methylcyclohexylmethyl group, an ethylcyclohexylmethyl group, an ethylcyclohexylethyl group, and a bicyclo[2.2.1]heptyl group. In the monovalent hydrocarbon groups, a part of hydrogen atom(s) may be substituted by a halogen atom(s), and —CH$_2$— which constitutes the hydrocarbon groups may be substituted by —O— or —C(=O)—.

Examples of $R^{F16}$, $R^{F8}$, and $R^{F13}$ include groups represented by the following formulae (R1-1) and (R1-2), a tertiary alkyl group having 4 to 20 carbon atoms, and in particular, 4 to 15 carbon atoms, a trialkylsilyl group having alkyl groups each having 1 to 5 carbon atoms, an oxoalkyl group having 4 to 20 carbon atoms, and in particular, 4 to 15 carbon atoms, and an acyl group having 1 to 10 carbon atoms.

(R1-1)

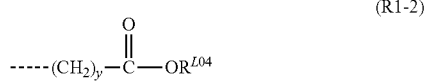

(R1-2)

In these formulae, the dotted line represents an atomic bonding (hereinafter as the same). $R^{L01}$ and $R^{L02}$ represent a hydrogen atom, or a linear, branched, or cyclic alkyl group having 1 to 18 carbon atoms, preferably 1 to 10 carbon atoms. Illustrative examples thereof include a methyl group, an ethyl group, a propyl group, an isopropyl group, a n-butyl group, a s-butyl group, a t-butyl group, a cyclopentyl group, a cyclohexyl group, a 2-ethylhexyl group, a n-octyl group, a norbornyl group, a tricyclodecanyl group, a tetracyclododecanyl group, and an adamantyl group. $R^{L03}$ represents a monovalent hydrocarbon group having 1 to 18 carbon atoms, preferably 1 to 10 carbon atoms, which may have a hetero atom such as an oxygen atom. Examples thereof include a linear, branched, or cyclic alkyl group in which a part of hydrogen atom(s) thereof is/are substituted by a hydroxyl group(s), an alkoxy group(s), an oxo group(s), an amino group(s), or an alkylamino group(s). Illustrative examples thereof include substituted alkyl groups described below.

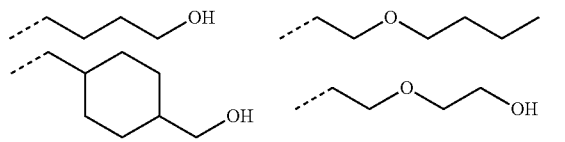

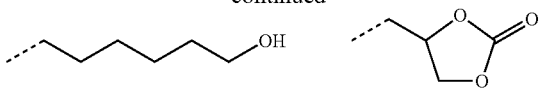

$R^{L01}$ and $R^{L02}$, $R^{L01}$ and $R^{L03}$, or $R^{L02}$ and $R^{L03}$ may bond together to form a ring with carbon and oxygen atoms to which they are bonded. When $R^{L01}$, $R^{L02}$, and $R^{L03}$ form a ring, each of $R^{L01}$, $R^{L02}$, and $R^{L03}$ represents a linear or branched alkylene group having 1 to 18 carbon atoms, preferably 1 to 10 carbon atoms.

$R^{L04}$ represents a tertiary alkyl group having 4 to 20 carbon atoms, preferably 4 to 15 carbon atoms, a trialkylsilyl group whose each alkyl group has 1 to 6 carbon atoms, an oxoalkyl group having 4 to 20 carbon atoms, or a group represented by the formula (R1-1). Illustrative examples of the tertiary alkyl group include a t-butyl group, a t-amyl group, a 1,1-diethylpropyl group, a 2-cyclopentylpropan-2-yl group, a 2-cyclohexylpropan-2-yl group, a 2-(bicyclo[2.2.1]heptan-2-yl)propan-2-yl group, a 2-(adamantan-1-yl)propan-2-yl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group, and a 2-ethyl-2-adamantyl group. Illustrative examples of the trialkylsilyl group include a trimethylsilyl group, a triethylsilyl group, and a dimethyl-t-butylsilyl group. Illustrative examples of the oxoalkyl group include a 3-oxocyclohexyl group, a 4-methyl-2-oxooxan-4-yl group, and a 5-methyl-2-oxooxolan-5-yl group. Illustrative examples of the acyl group include a formyl group, an acetyl group, an ethylcarbonyl group, a pivaloyl group, a methoxycarbonyl group, an ethoxycarbonyl group, a t-butoxycarbonyl group, a trifluoroacetyl group, and a trichloroacetyl group. "y" represents an integer of 0 to 6.

Among the protecting groups represented by the formula (R1-1), linear and branched groups are specifically exemplified by the following.

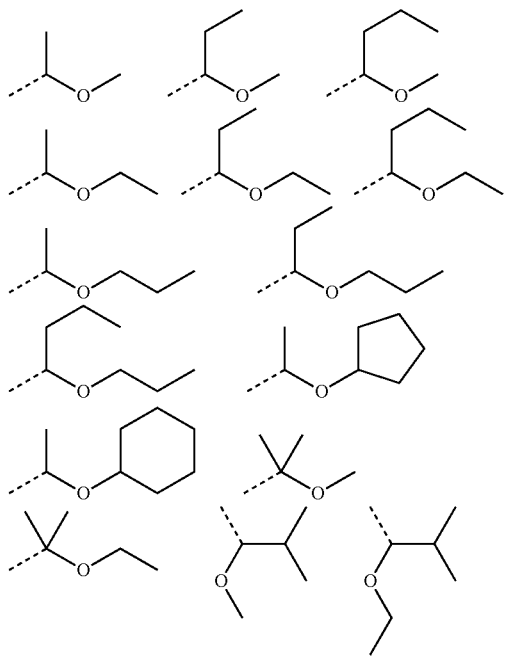

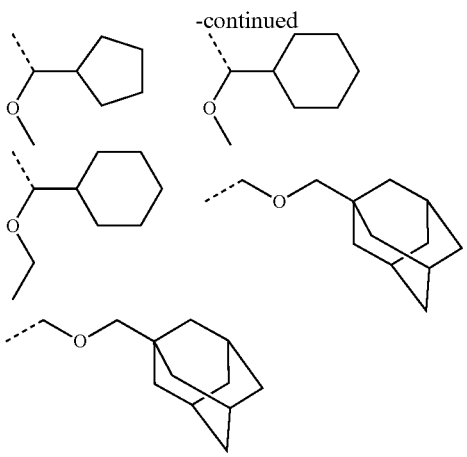

Illustrative examples of cyclic groups of the protecting groups represented by the formula (R1-1) include a tetrahydrofuran-2-yl group, a 2-methyltetrahydrofuran-2-yl group, a tetrahydropyran-2-yl group, and a 2-methyltetrahydropyran-2-yl group.

Illustrative examples of the protecting groups represented by the formula (R1-2) include a t-butoxycarbonyl group, a t-butoxycarbonylmethyl group, a t-amyloxycarbonyl group, a t-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, and a 2-tetrahydrofuranyloxycarbonylmethyl group.

$L^{F1}$ represents a single bond or —C(=O)O—. "mf" represents 0 or 1.

$L^{F2}$ is a linear, branched, or cyclic divalent or trivalent hydrocarbon group having 1 to 15 carbon atoms. Examples of $L^{F2}$ include a group in which two or three hydrogen atoms are eliminated from a hydrocarbon such as methane, ethane, propane, n-butane, n-pentane, n-hexane, n-heptane, n-octane, n-nonane, n-decane, 2-methylpropane, 2-methylbutane, 2,2-dimethylpropane, 2-methylpentane, 2-methylhexane, 2-methylheptane, cyclopentane, cyclohexane, methylcyclopentane, methylcyclohexane, ethylcyclopentane, methylcycloheptane, ethylcyclohexane, 1-methyladamantane, 2-methyladamantane, 1-ethyladamantane, and 2-ethyladamantane.

"nf" represents 1 or 2.

Each of $R^{F10}$ to $R^{F12}$ independently represents a hydrogen atom, a hydroxyl group, a halogen atom, or a linear, branched, or cyclic monovalent organic group having 1 to 16 carbon atoms. Two or more of $R^{F10}$ to $R^{F12}$ in any combination may bond together to form a ring with the carbon atom to which they are bonded.

Examples of the linear, branched, or cyclic monovalent organic group having 1 to 16 carbon atoms include a monovalent hydrocarbon group such as a linear, branched, or cyclic alkyl group including a methyl group, an ethyl group, a propyl group, an isopropyl group, a n-butyl group, a s-butyl group, a t-butyl group, a t-amyl group, a n-pentyl group, a n-hexyl group, a n-heptyl group, a n-octyl group, a n-nonyl group, a n-decyl group, a cyclopropyl group, a cyclobutyl group, a cyclopentyl group, a cyclopentylmethyl group, a cyclopentylethyl group, a cyclopentylbutyl group, a cyclohexyl group, a cyclohexylmethyl group, a cyclohexylethyl group, a cyclohexylbutyl group, and a methylcyclohexylmethyl group, an ethylcyclohexylmethyl group, an ethylcyclohexylethyl group, a bicyclo[2.2.1]heptyl group, a bicyclo[2.2.1]heptylmethyl group, a bicyclo[2.2.1]heptylethyl group, a bicyclo[2.2.1]heptylbutyl group, a methylbicyclo[2.2.1]heptylmethyl group, an ethylbicyclo[2.2.1]heptylmethyl group, an ethylbicyclo[2.2.1]heptylethyl group, a propylene glycol monopropyl ether; acetone; group, a bicyclo[2.2.2]octylethyl group, a bicyclo[2.2.2]octylbutyl group, a methylbicyclo[2.2.2]octylmethyl group, an ethylbicyclo[2.2.2]octylmethyl group, an ethylbicyclo[2.2.2]octylethyl group, a tricyclo[5.2.1.0$^{2,6}$]decyl group, a tricyclo[5.2.1.0$^{2,6}$]decylmethyl group, a tricyclo[5.2.1.0$^{2,6}$]decylethyl group, a tricyclo[5.2.1.0$^{2,6}$]decylbutyl group, a methyltricyclo[5.2.1.0$^{2,6}$]decylmethyl group, an ethyltricyclo[5.2.1.0$^{2,6}$]decylmethyl group, an ethyltricyclo[5.2.1.0$^{2,6}$]decylethyl group, an adamantyl group, an adamantylmethyl group, an adamantylethyl group, an adamantylbutyl group, a methyladamantylmethyl group, an ethyladamantylmethyl group, an ethyladamantylethyl group, a tetracyclo[4.4.0.1$^{2,5}$.1$^{7,10}$]dodecyl group, a tetracyclo[4.4.0.1$^{2,5}$.1$^{7,10}$]dodecylmethyl group, a tetracyclo[4.4.0.1$^{2,5}$.1$^{7,10}$]dodecylethyl group, a tetracyclo[4.4.0.1$^{2,5}$.1$^{7,10}$]dodecylbutyl group, an ethyltetracyclo[4.4.0.1$^{2,5}$.1$^{7,10}$]dodecylmethyl group, and an ethyltetracyclo[4.4.0.1$^{2,5}$.1$^{7,10}$]dodecylethyl group, an aryl group including a phenyl group, a methylphenyl group, a naphthyl group, an anthryl group, and a phenanthryl group, and an aralkyl group including a benzyl group, a diphenylmethyl group, and a phenethyl group; an alkoxy group such as a methoxy group, an ethoxy group, and a propoxy group; and an acyloxy group such as a formyloxy group and an acetoxy group. In these groups, a part of hydrogen atom(s) may be substituted by a halogen atom(s), an alkyl group(s), an aryl group(s), an alkoxy group(s), an alkoxycarbonyl group(s), an oxo group(s), an alkoxyalkyl group(s), an acyloxy group(s), an acyloxyalkyl group(s), or an alkoxyalkoxy group(s).

Two or more of $R^{F10}$ to $R^{F12}$ in any combination may bond together to form a ring with the carbon atom to which they are bonded. Typical examples of combination of forming a ring include $R^{F10}$ and $R^{F11}$, $R^{F10}$ and $R^{F12}$, and $R^{F11}$ and $R^{F12}$. In this case, examples of formed ring include an alicyclic hydrocarbon having 3 to 12 carbon atoms such as cyclopropane, cyclobutane, cyclopentane, cyclohexane, bicyclo[2.2.1]heptane, bicyclo[2.2.2]octane, tricyclo[5.2.1.0$^{2,6}$]decane, adamantane, and tetracyclo[4.4.0.1$^{2,5}$.1$^{7,10}$]dodecane. The formed ring may be a fused ring containing these rings. A part of hydrogen atom(s) in the alicyclic hydrocarbon may be substituted by a hydroxyl group(s), a halogen atom(s), an alkyl group(s), an aryl group(s), an alkoxy group(s), an alkoxycarbonyl group(s), an oxo group(s), an alkoxyalkyl group(s), an acyloxy group(s), an acyloxyalkyl group(s), or an alkoxyalkoxy group(s).

"of" represents 0 or 1.

$R^{F15}$ represents a hydrocarbon group having 2 to 15 carbon atoms whose one or more hydrogen atom(s) is/are substituted by a fluorine atom(s). Examples of $R^{F15}$ include an ethyl group, a propyl group, an isopropyl group, a n-butyl group, a s-butyl group, a t-butyl group, a t-amyl group, a n-pentyl group, a n-hexyl group, a n-heptyl group, a n-octyl group, a n-nonyl group, a n-decyl group, a cyclopropyl group, a cyclobutyl group, a cyclopentyl group, a cyclopentylmethyl group, a cyclopentylethyl group, a cyclopentylbutyl group, a cyclohexyl group, a cyclohexylmethyl group, a cyclohexylethyl group, a cyclohexylbutyl group, a methylcyclohexylmethyl group, an ethylcyclohexylmethyl group, an ethylcyclohexylethyl group, a bicyclo[2.2.1]heptyl group, and an adamantyl group whose a part of or all of hydrogen atoms are substituted by a fluorine atom.
Illustrative examples of repeating unit represented by the formula (F1) include, but not limited to, the following repeating units.
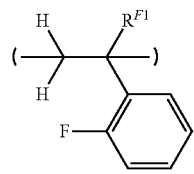 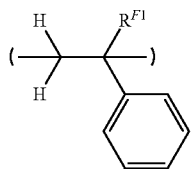
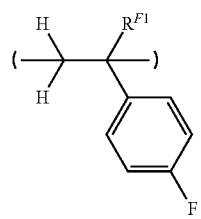 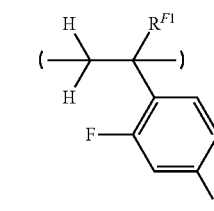
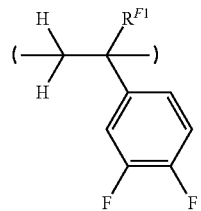 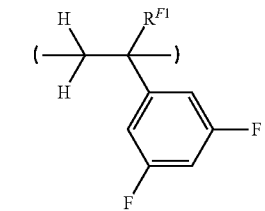
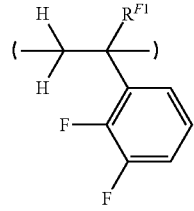 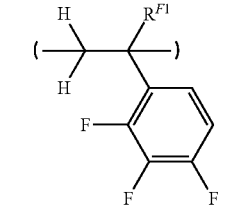
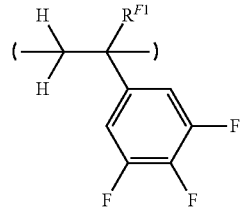 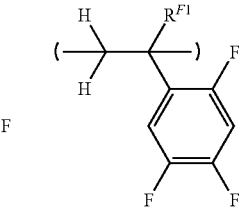
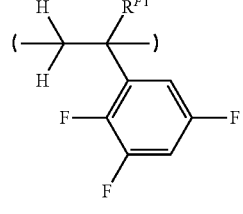 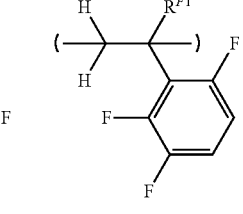
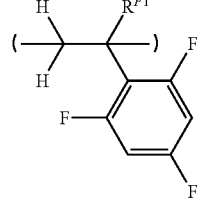 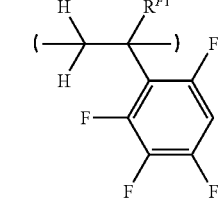
-continued
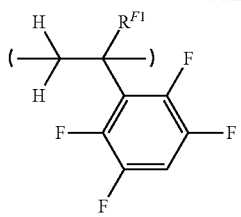 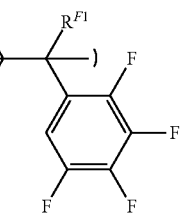
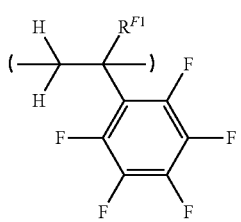 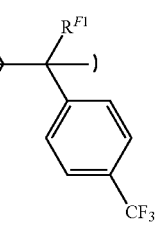
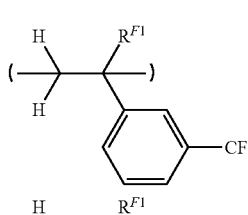 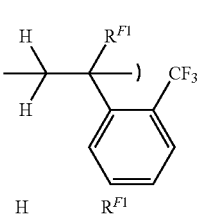
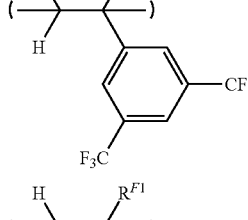 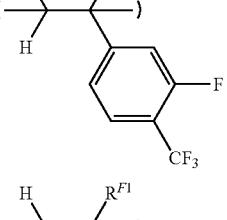
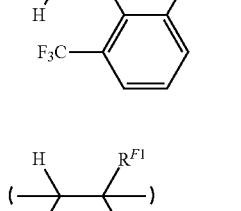 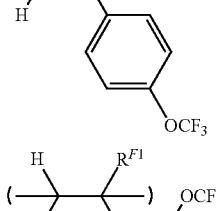
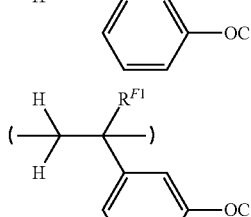 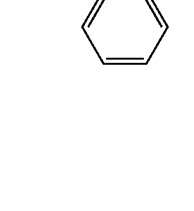
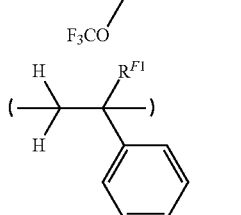 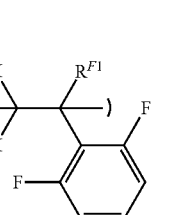

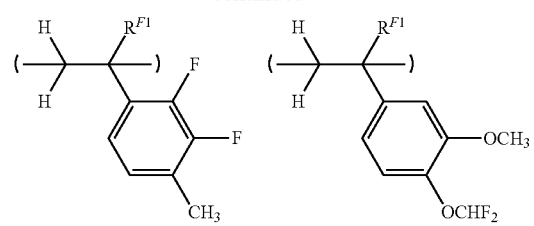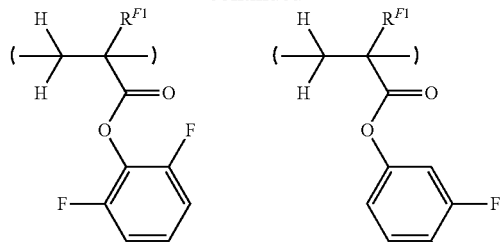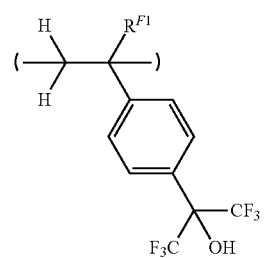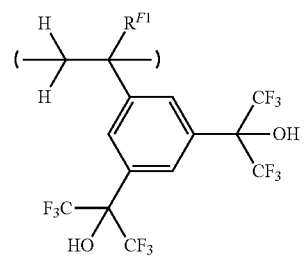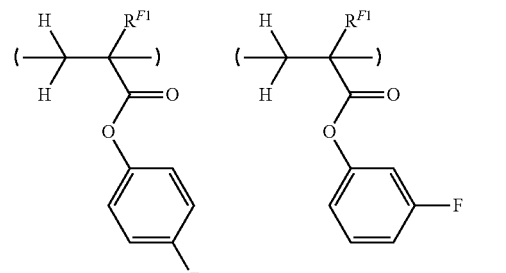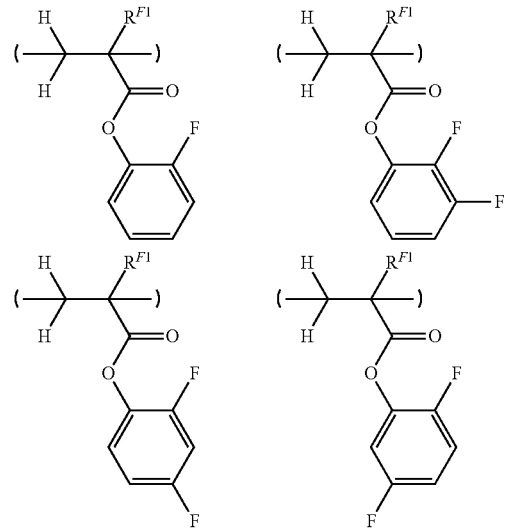

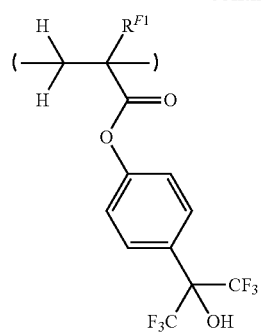
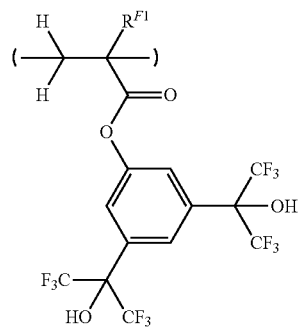
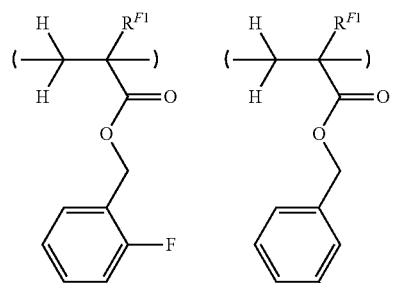
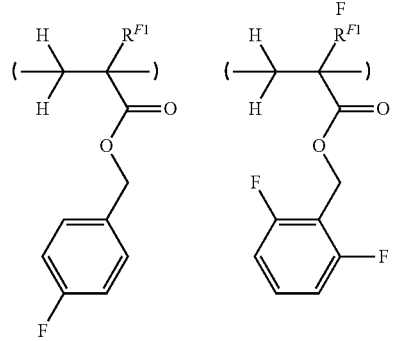
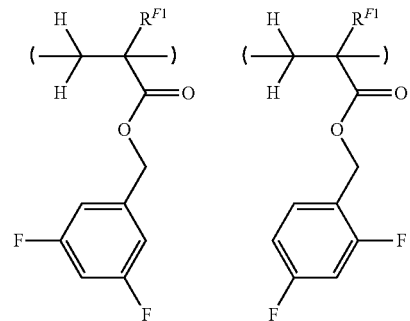
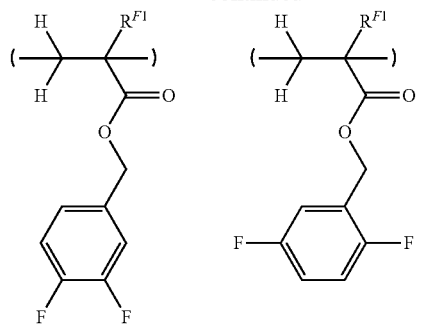
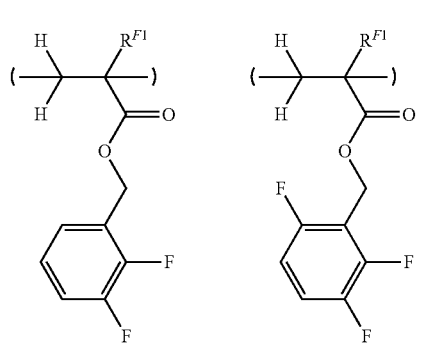
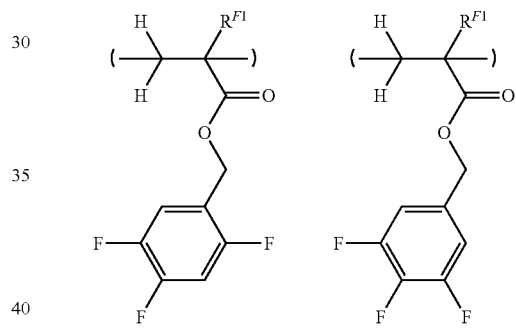
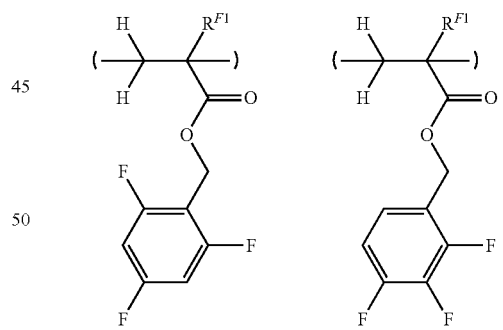
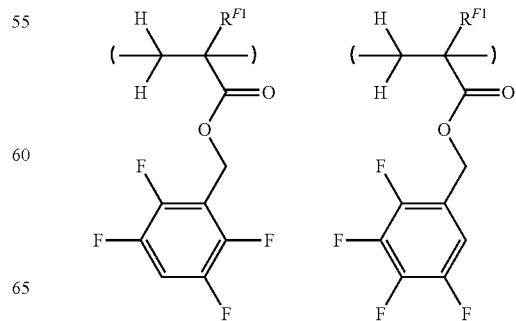

-continued
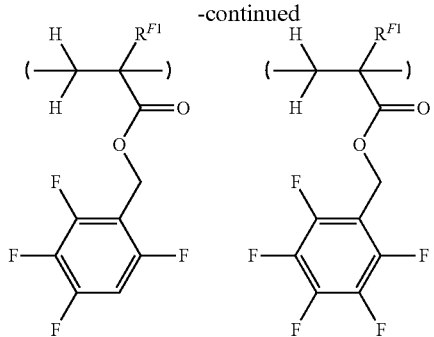
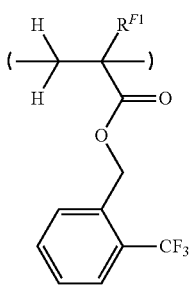
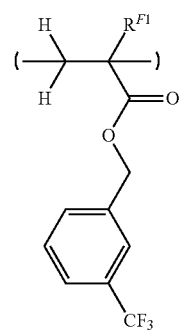
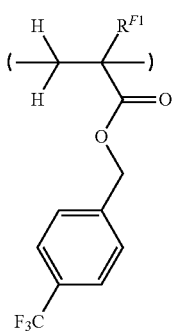
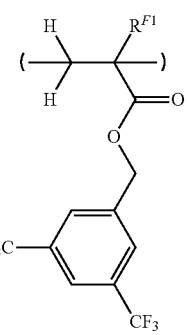
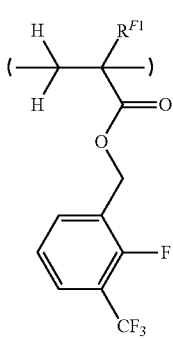
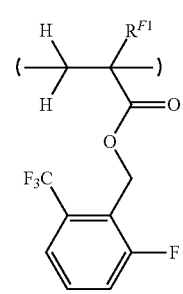
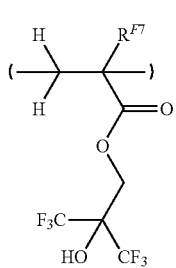
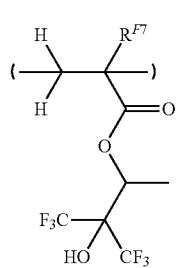
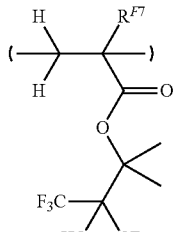
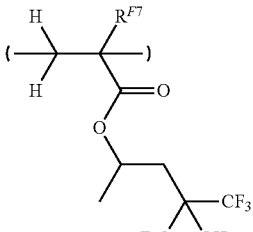
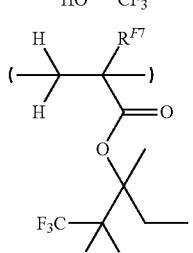
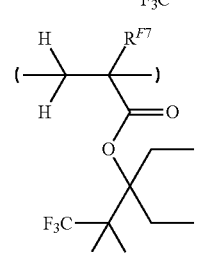
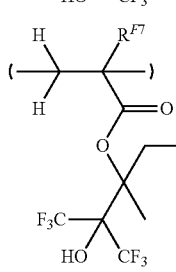
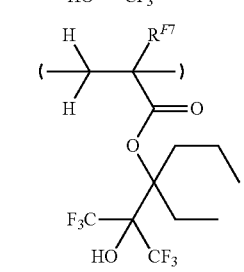
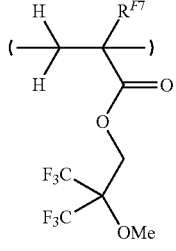
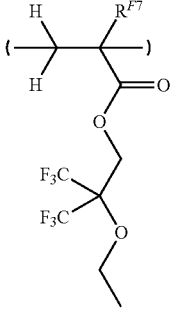
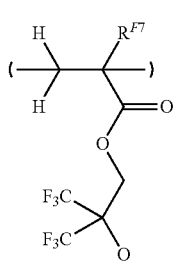
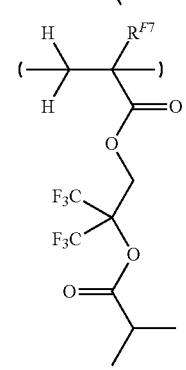
In these formulae, $R^{F1}$ represents the same meanings as before.
Illustrative examples of repeating unit represented by the formula (F2) include, but not limited to, the following repeating units.

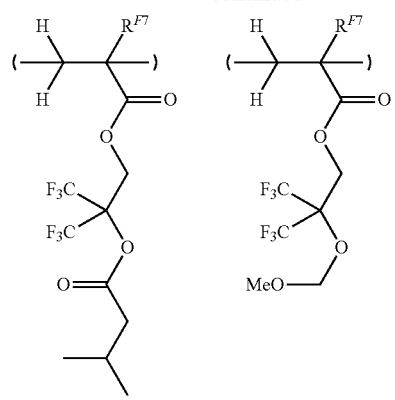
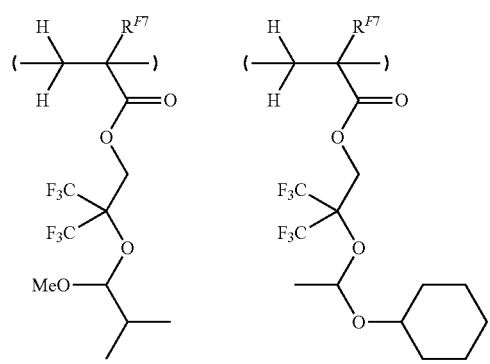
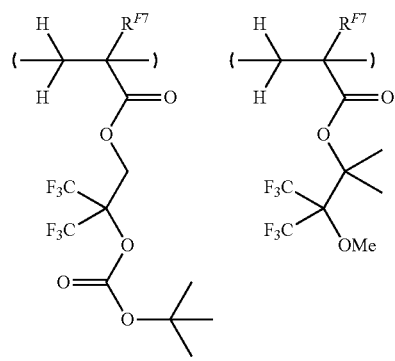
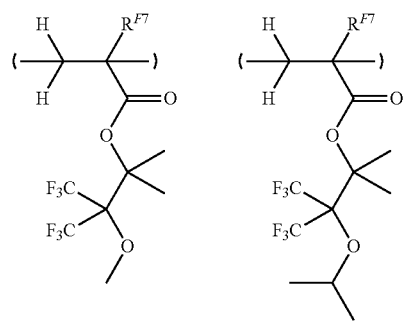
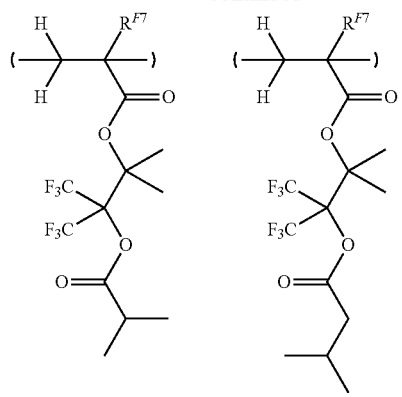
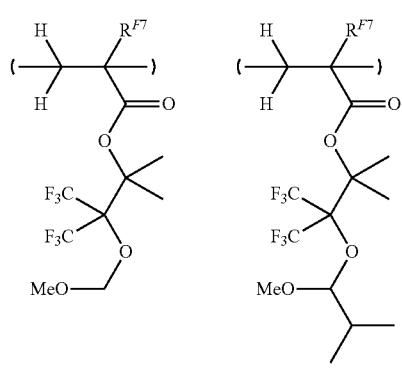
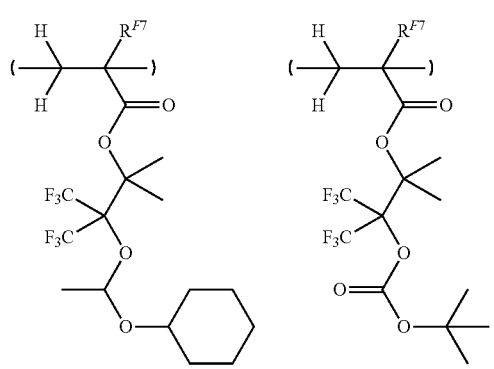
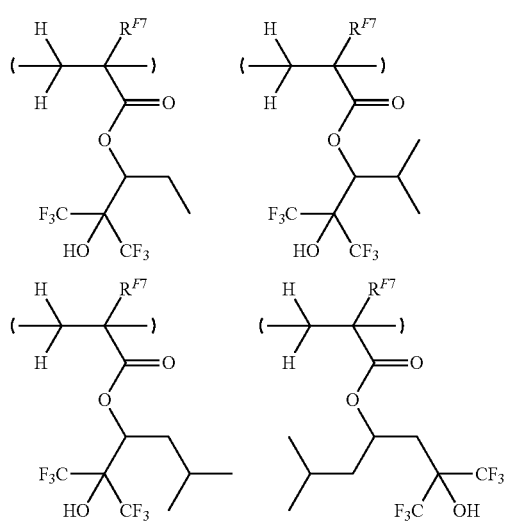

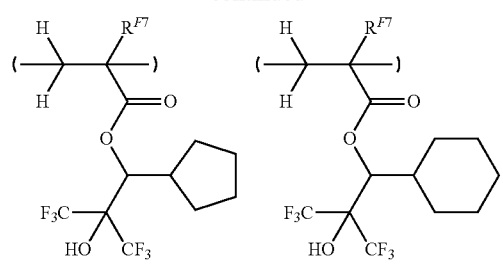
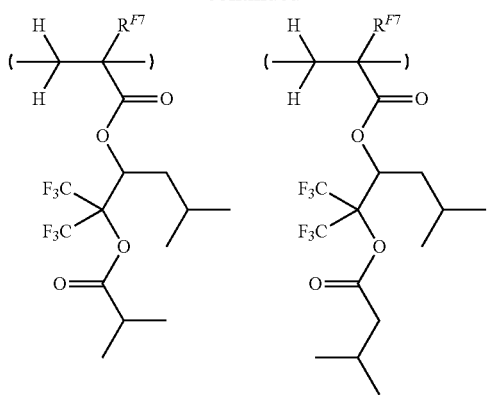
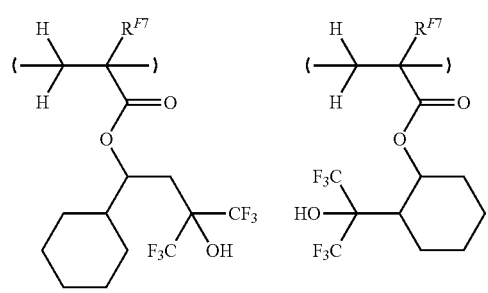
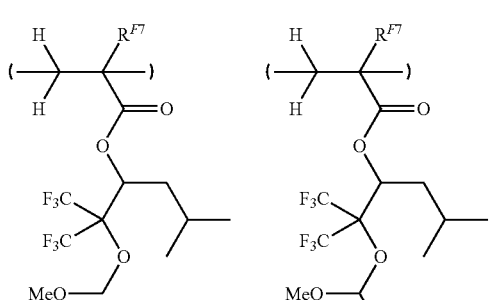
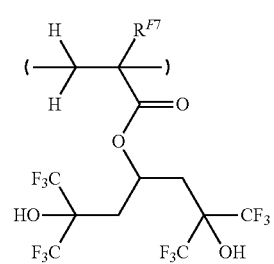
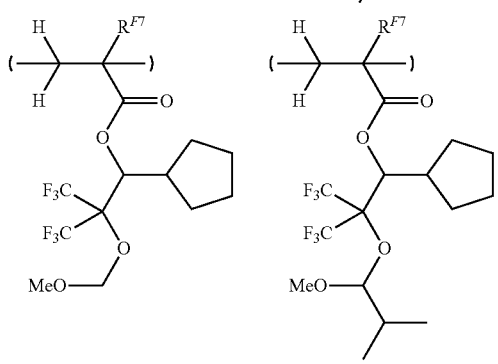
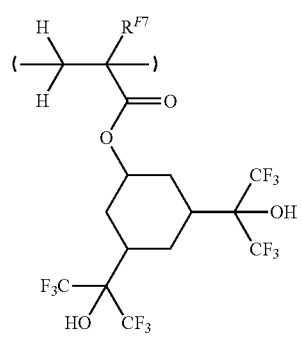
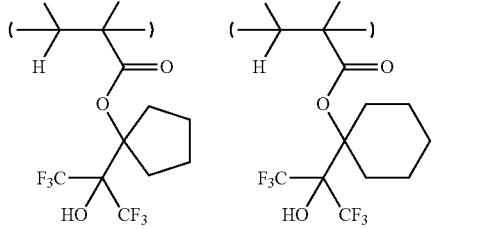
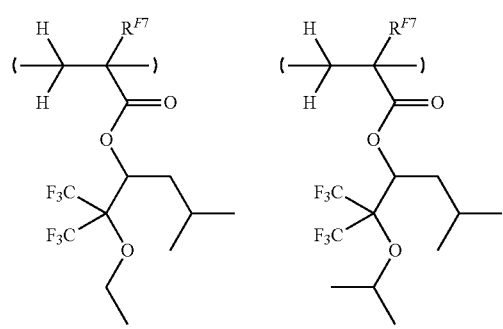
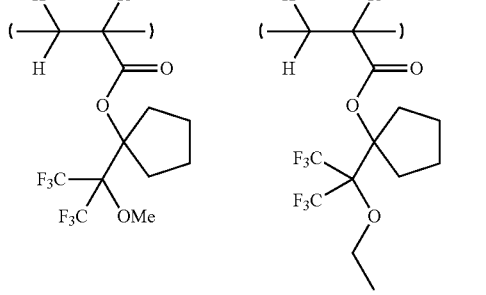

71
-continued
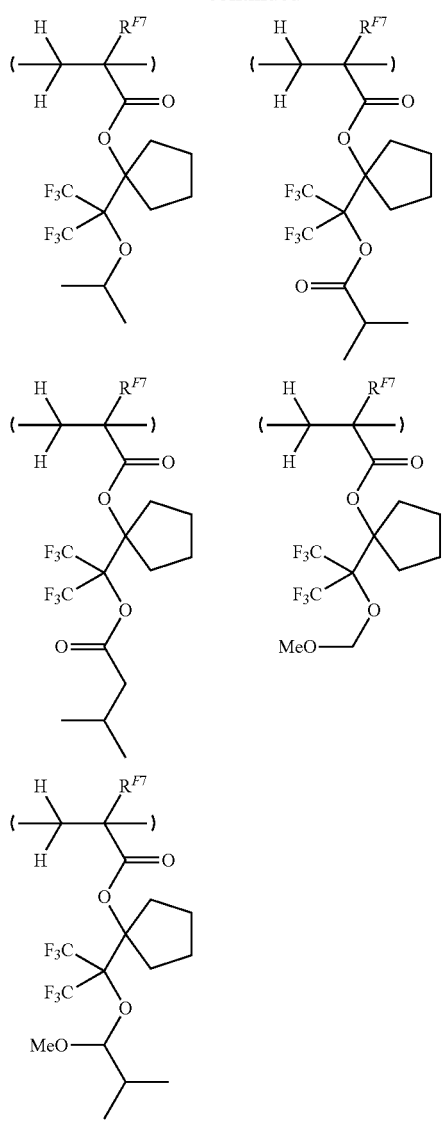
In these formulae, $R^{F7}$ represents the same meanings as before.
Illustrative examples of repeating unit represented by the formula (F3) include, but not limited to, the following repeating units.
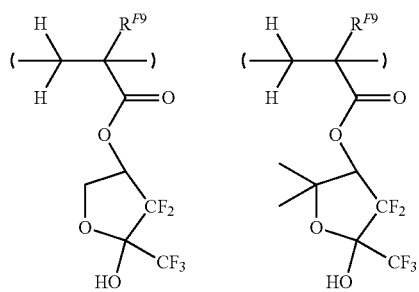
72
-continued
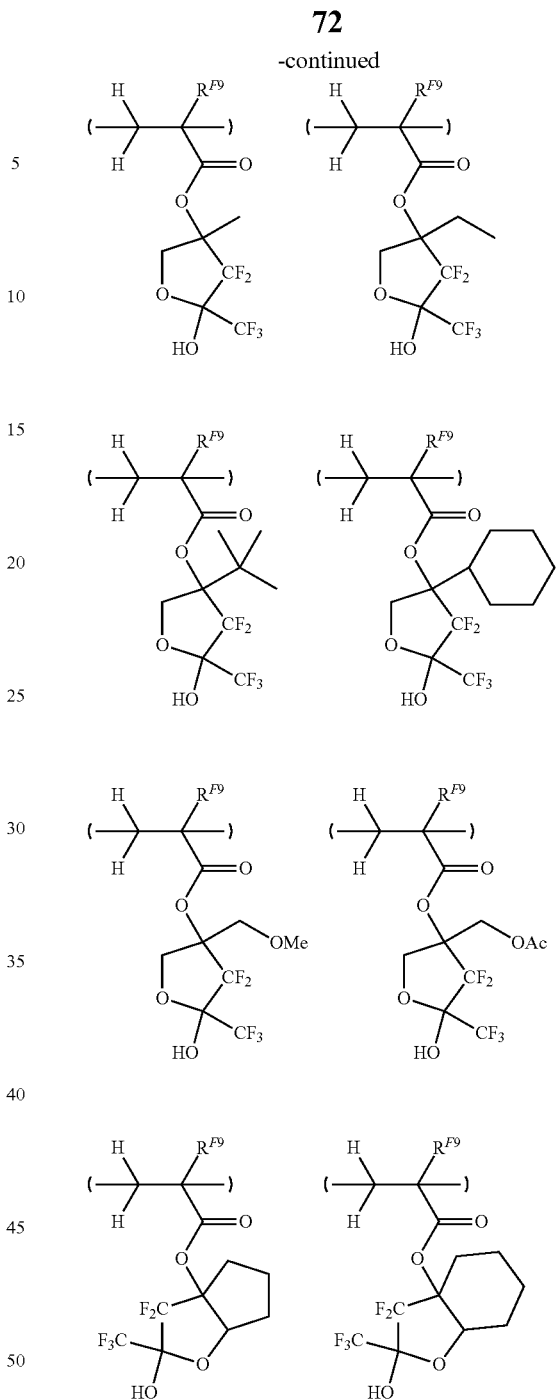
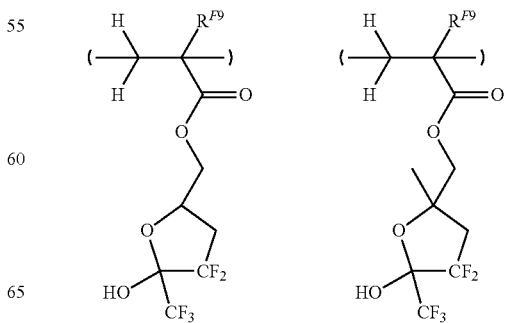

-continued
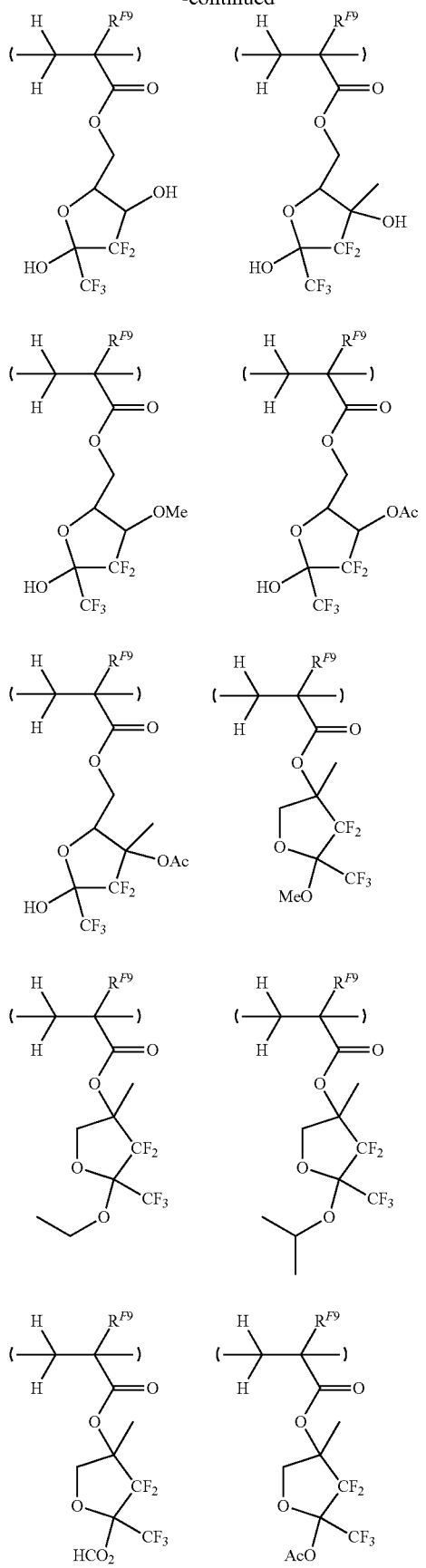
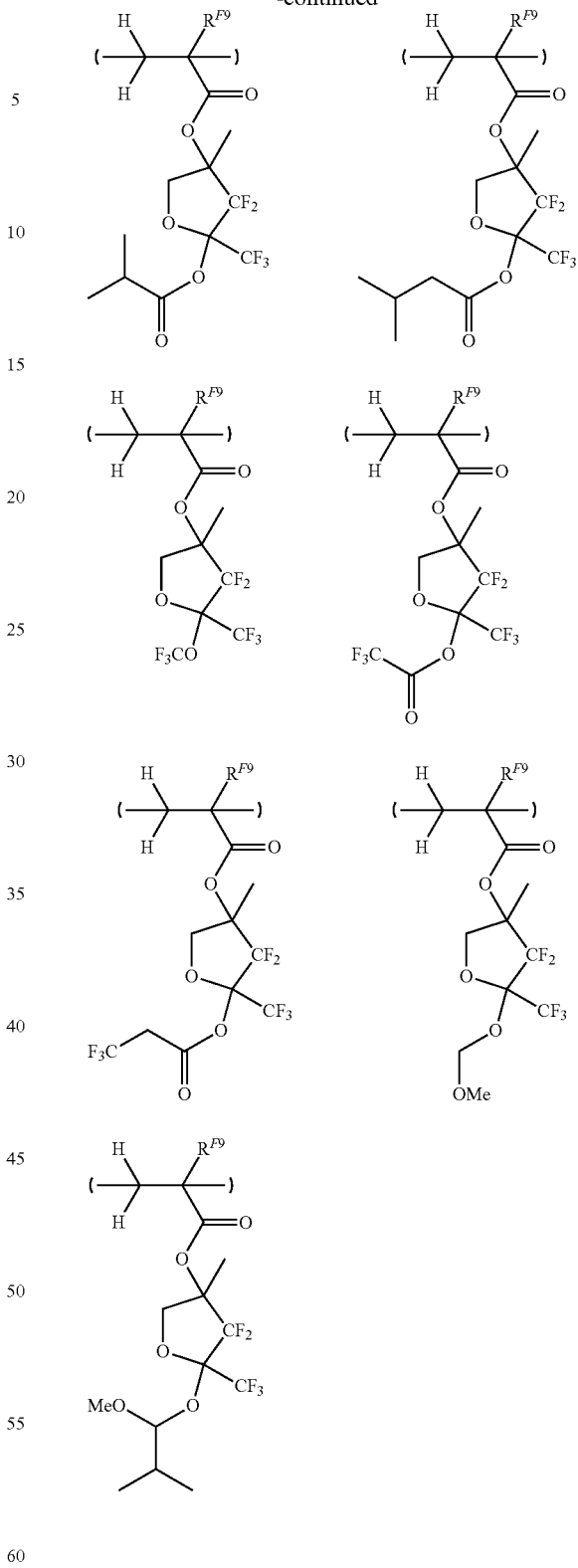
In these formulae, $R^{F9}$ represents the same meanings as before.
Illustrative examples of repeating unit represented by the formula (F4) include, but not limited to, the following repeating units.

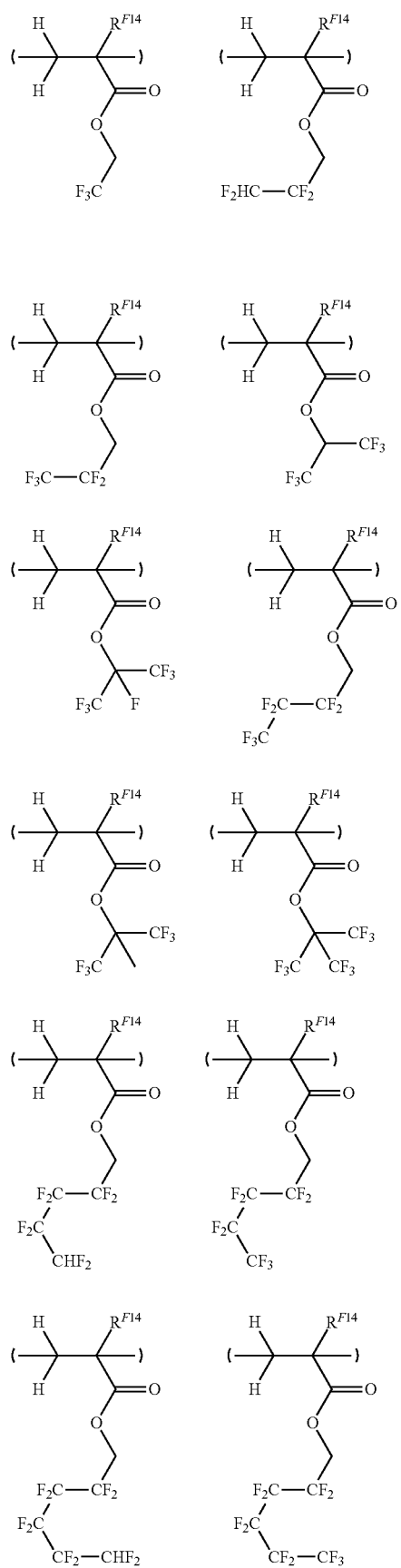
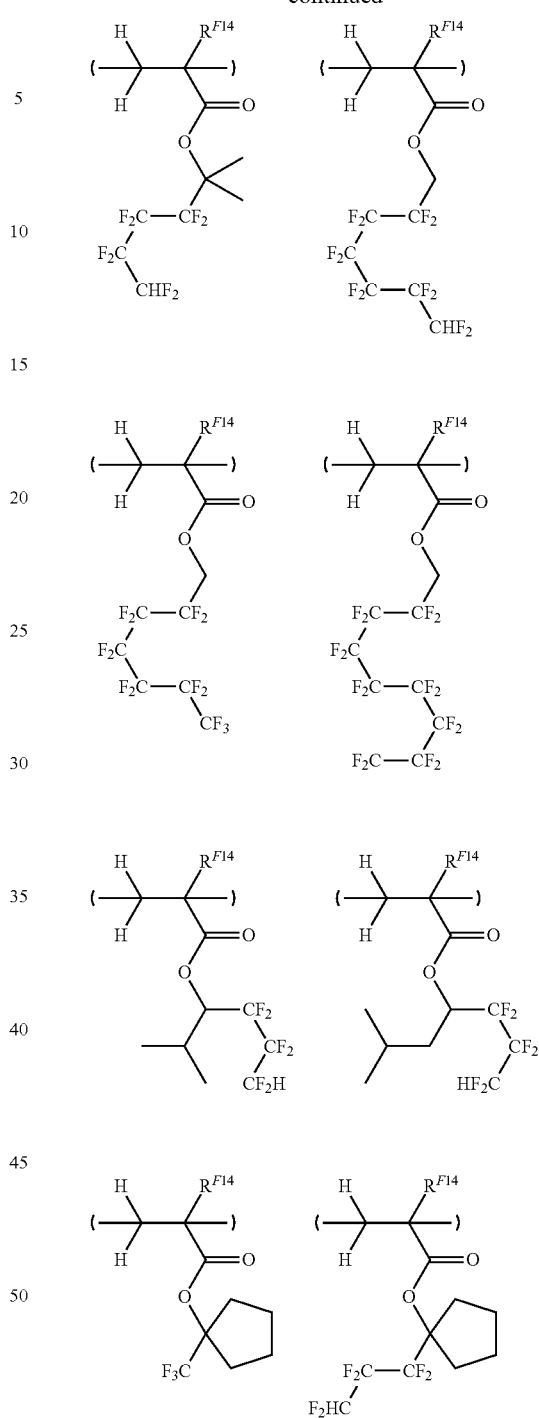

In these formulae, $R^{F14}$ represents the same meanings as before.

In order to improve the solubility in a solvent and peelability, one or more kinds of repeating units derived from a monomer containing a carbon-carbon double bond other than the above-described repeating units may be introduced into the organic compound containing fluorine. Examples of the units include, but not limited to, repeating units shown below having any one or more of a hydroxyl group, an alkoxy group, a carboxyl group, an ester group, and an ether structure.

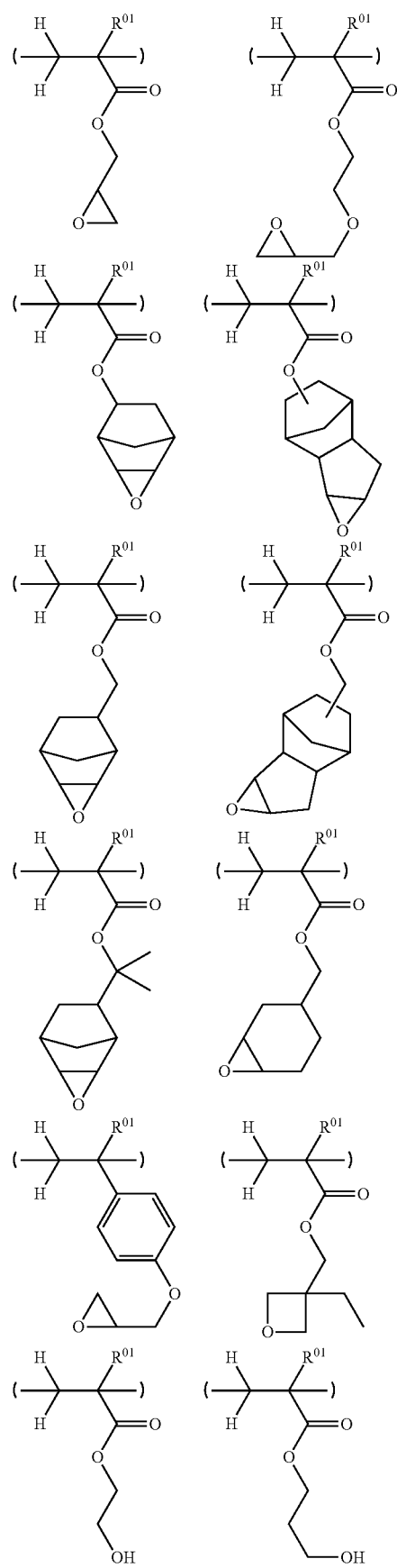
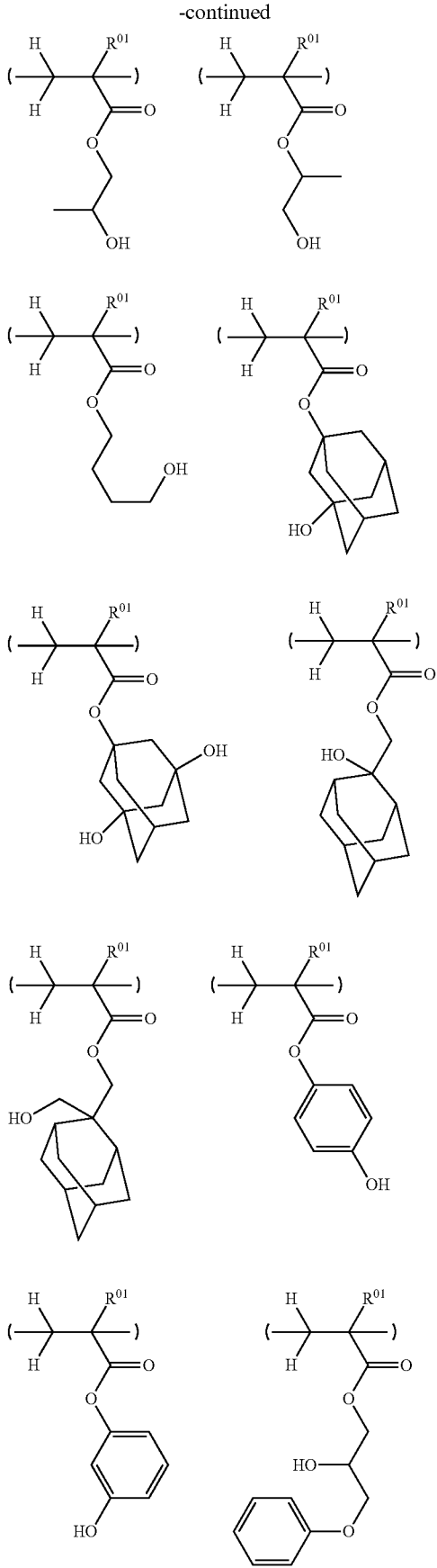

-continued
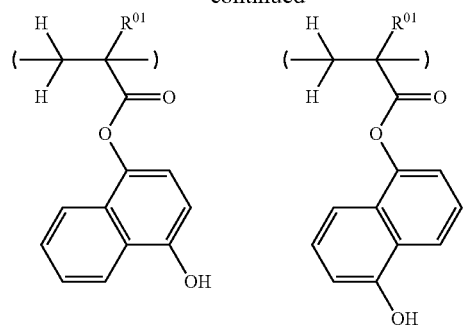
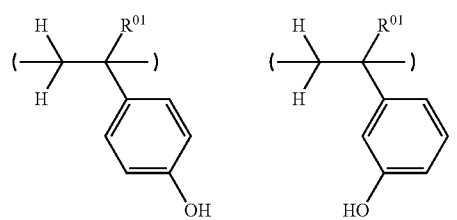
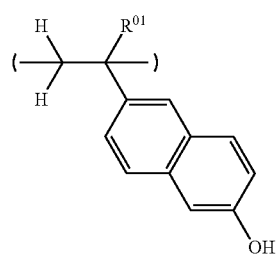
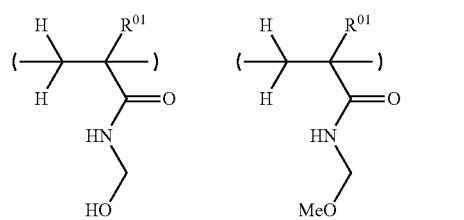
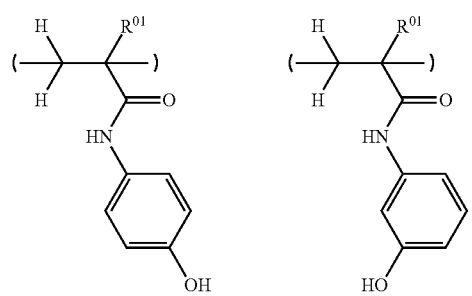
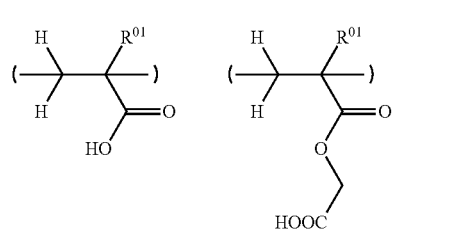
-continued
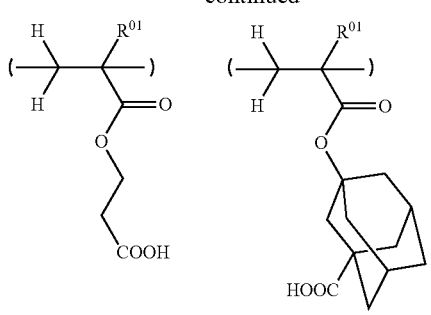
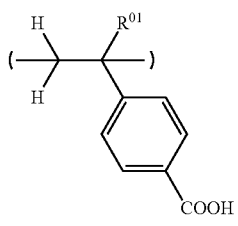
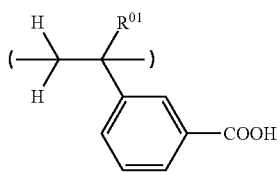
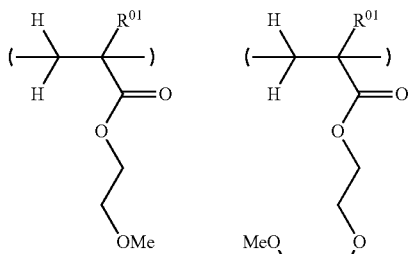
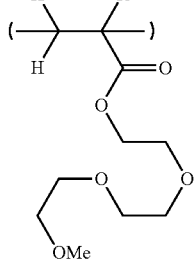
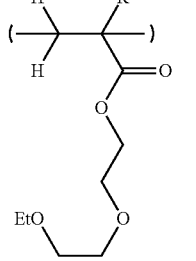

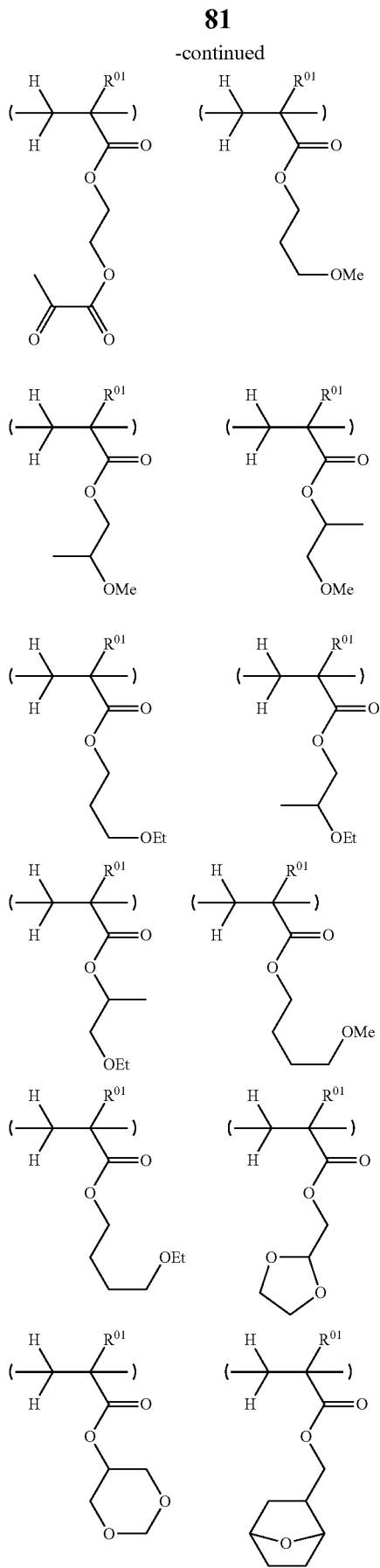

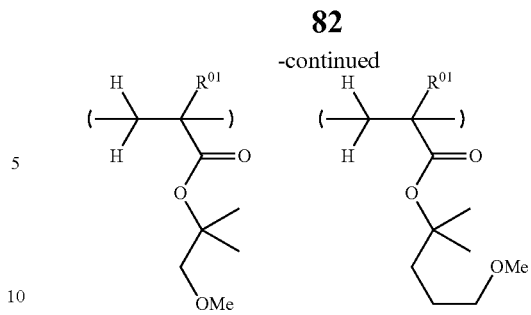

In these formulae, $R^{01}$ represents a hydrogen atom, a methyl group, a fluorine atom, a hydroxymethyl group, or a trifluoromethyl group.

If necessary, a crosslinker may be added to the composition for forming a silicon-containing film used in the present invention. Illustrative examples of the crosslinker include crosslinkers described in paragraphs (0056) to (0059) of Japanese Patent Laid-Open Publication No. 2007-199653.

If necessary, a polysiloxane containing a crosslinkable organic group may be further added to the composition for forming a silicon-containing film used in the present invention. Illustrative examples of such a polysiloxane include a polysiloxane obtained by hydrolysis condensation of compounds (monomers) represented by the formulae (A-1) and (A-2) having an epoxy group, a phenolic hydroxyl group, or a phenolic hydroxyl group bonded to a tertiary alkyl group.

If necessary, a surfactant may be added to the composition for forming a silicon-containing film used in the present invention. Illustrative examples of the surfactant include surfactants described in paragraph (0185) of Japanese Patent Laid-Open Publication No. 2009-126940.

If necessary, a thermal crosslinking accelerator may be added to the composition for forming a silicon-containing film used in the present invention. Illustrative examples of the thermal crosslinking accelerator include thermal crosslinking accelerators described in Japanese Patent Laid-Open Publication No. 2007-302873.

The thermal crosslinking accelerator may be used one kind alone, or in combination of two or more kinds thereof. The amount of the thermal crosslinking accelerator to be added is preferably in the range of 0.01 to 50 parts by mass, more preferably 0.1 to 40 parts by mass, based on 100 parts by mass of the base resin (the polysiloxane).

If necessary, an acid generator for thermal crosslinking may be added to the composition for forming a silicon-containing film used in the present invention. Illustrative examples of the acid generator for thermal crosslinking include acid generators for thermal crosslinking described in Japanese Patent Laid-Open Publication No. 2007-226204.

The acid generator for thermal crosslinking may be used one kind alone, or in combination of two or more kinds thereof. The amount of the acid generator for thermal crosslinking to be added preferably in the range of 0.001 to 20 parts by mass, more preferably 0.01 to 10 parts by mass, based on 100 parts by mass of the base resin (the polysiloxane).

Here, the silicon content in the silicon-containing film is defined as follows.

When the hydrolysable silicon compound represented by the formula (A-1) is a monomer, a reaction in which water is sufficiently added to the compound, resulting in hydrolysis condensation, to obtain a polysiloxane is as follows.

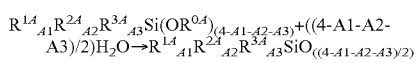

Herein, when the formula weight of $R^{1A}{}_{A1}R^{2A}{}_{A2}R^{3A}{}_{A3}$ moiety is $R_w$, the formula weight $R_s$ of the polysiloxane obtained by hydrolysis condensation is represented by the following equation.

$$R_s = R_w + 28.1 + 16.0 \times ((4-A1-A2-A3)/2)$$

As a result, the silicon content $S_1$ (% by mass) in the polysiloxane is represented by the following equation.

$$S_1 = (28.1/R_s) \times 100$$

When two or more kinds of monomers are mixed to obtain a polysiloxane, $R_s$ of monomer 1 represents $R_{s1}$, the molar ratio thereof represents $R_{m1}$, $R_s$ of monomer 2 represents $R_{s2}$, the molar ratio thereof represents $R_{m2}$, $R_s$ of monomer "n" represents $R_{sn}$, and the molar ratio thereof represents $R_{mn}$. In this case, the silicon content $S_1$ (% by mass) in the polysiloxane is represented by the following equation.

$$S_1 = \left\{ 28.1 \bigg/ \sum_{z=1}^{n} (R_{mz} \times R_{sz}) \right\} \times 100$$

When the amounts of the organic compound containing fluorine and the crosslinker to be added to the composition based on 100 g of the polysiloxane represent $R_{Fw}$ and $R_{Xw}$, respectively, the silicon content S (% by mass) in the silicon-containing film is represented by the following equation.

$$S = S_1/(100 + R_{Fw} + R_{Xw})$$

In the present invention, the silicon content in the silicon-containing film needs to be 1% by mass or more and 30% by mass or less, as described above. The silicon content is preferably 5% by mass or more and 25% by mass or less. When the silicon content is more than 30% by mass, a residue generated in the insufficient peeling remains on the substrate at the peeling step with the peeling liquid. In contrast, when the silicon content is less than 1% by mass, dry etching selectivity between the resist film and the organic under layer film is deteriorated, and pattern formation by a three-layer resist process is made difficult.

The silicon-containing film in the present invention can be formed on the organic under layer film using the composition for forming a silicon-containing film by a spin coating method or the like, like the resist film. After spin coating, it is desired to be baked for evaporating the solvent, preventing from mixing with the resist film, and promoting crosslinking reaction. The baking temperature is preferably in the range of 50 to 500° C., and the heating time is preferably in the range of 10 to 300 seconds. Particularly preferable temperature range is 400° C. or less in order to reduce heat damage to the devices though it is depending on the structure of the devices to be fabricated.

The thickness of the silicon-containing film is not particularly limited, and is preferably about 20 nm to about 100 nm.

[Resist Film]

The resist film formed on the silicon-containing film in the present invention is not limited so long as it is formed by applying a resist composition containing a polymer whose polarity is changed by an acid action to change solubility thereof in a developer. As such a resist composition, a known resist composition can be used. The thickness of the resist film is not particularly limited, and is preferably about 100 nm to about 200 nm.

<Method for Producing Semiconductor Apparatus Substrate>

Hereinafter, the method for producing a semiconductor apparatus substrate of the present invention will be described in detail with reference to the drawing. FIG. 1 (FIG. 1 (0) to (7)) is a flow chart showing one example of the method for producing a semiconductor apparatus substrate of the present invention.

In the method for producing a semiconductor apparatus substrate of FIG. 1, a substrate 1 to be processed for producing a semiconductor apparatus is first prepared (FIG. 1 (0)), an organic under layer film 2 is formed on the substrate 1 to be processed for producing a semiconductor apparatus (FIG. 1 (1a)), a composition for forming a silicon-containing film is applied to the organic under layer film 2, followed by heating, to form a silicon-containing film 3 (FIG. 1 (1b)), in a step (1). The silicon content in the silicon-containing film 3 is set to be 1% by mass or more and 30% by mass or less. Then, in a step (2), a resist composition is applied to the silicon-containing film 3, to form a resist film 4 (FIG. 1 (2)). Then, in a step (3), the resist film 4 is exposed (FIG. 1 (3a)), followed by development, to form a resist pattern 4' (FIG. 1 (3b)). Then, in a step (4), the pattern is transferred to the silicon-containing film 3 by dry etching using the resist pattern 4' as a dry etching mask (FIG. 1 (4)). Then, in a step (5), the pattern is transferred to the organic under layer film 2 by dry etching using the silicon-containing film 3 having the transferred pattern as a dry etching mask (FIG. 1 (5)). At that time, the dry etching condition is adjusted so that a part of or all of the silicon-containing film 3 remains on the organic under layer film 2. Then, in a step (6), ions are implanted into the substrate 1 to be processed for producing a semiconductor apparatus using the pattern formed from a part of or all of the silicon-containing film 3 and the organic under layer film 2 as a mask (FIG. 1 (6)). Then, in a step (7), the organic under layer film 2 used as the mask on which a part of or all of the silicon-containing film 3 remains is peeled with a peeling liquid and removed at a time (FIG. 1 (7)).

In the step (3), exposure can be carried out by a known method. As exposure light, for example, a KrF laser, an ArF laser, or the like can be used.

In the step (3), development can be carried out by a known method. For example, as a developer, an alkaline developer or an organic solvent developer can be used. The developer may be appropriately selected depending on the resist composition to be used.

It is preferable that the ion implanted in the step (6) be any of boron, phosphorous, arsenic, carbon, nitrogen, oxygen, fluorine, argon, silicon, gallium, germanium, indium, and antimony.

As described above, in the step (6) of the present invention, ions can be implanted into the substrate to be processed for producing a semiconductor apparatus using the pattern formed from a part of or all of the silicon-containing film and the organic under layer film as a mask.

In terms of efficiency of peeling, it is preferable that the organic under layer film used as the mask for ion implantation on which a part of or all of the silicon-containing film remains be peeled with the peeling liquid at a time in the step (7) as described above. Of course, the silicon-containing film and the organic under layer film may be separately peeled.

It is preferable that a peeling liquid containing hydrogen peroxide be used as the peeling liquid used in the peeling of the step (7). Such a peeling liquid is particularly suitable for peeling the silicon-containing film. To promote peeling, it is preferable that an acid or an alkali be added to adjust the pH of the peeling liquid. Examples of a pH adjustor include an inorganic acid such as hydrochloric acid and sulfuric acid, an organic acid such as acetic acid, oxalic acid, tartaric acid, citric acid, and lactic acid, an alkali containing nitrogen such as ammonia, ethanolamine, and tetramethylammonium hydroxide, and an organic acid compound containing nitrogen such as ethylenediamine tetraacetate (EDTA). Sulfuric acid is particularly preferred.

Specifically, as a peeling liquid that does not cause damage to the semiconductor apparatus substrate, a peeling liquid which is generally used in a process of producing a semiconductor such as a hydrogen peroxide-containing ammonia aqueous solution called SC1, a hydrochloric acid containing hydrogen peroxide called SC2, a sulfuric acid peroxide mixture called SPM, or the like can be suitably used.

In the peeling of the step (7), for example, a peeling liquid of 0° C. to 200° C., preferably 5° C. to 180° C. is prepared, and the substrate to be processed having the formed organic under layer film on which the silicon-containing film remains may be immersed in the peeling liquid. If necessary, by an ordinary procedure including spraying the peeling liquid on a surface or applying the peeling liquid while the substrate to be processed is rotated, the silicon-containing film can be easily removed.

In the step (7), by additional treatment with a peeling liquid containing fluorine ions after treatment with the peeling liquid, the mask used for ion implantation can be more accurately peeled.

In the step (7), by cleaning with a cleaning liquid containing ammonia after treatment with the peeling liquid, a residue adhered to the semiconductor apparatus substrate after peeling can be removed.

The number of residues on the substrate can be examined by a microscope. In consideration of yield of chips on the substrate, the number of residues is preferably 50 or less, more preferably 10 or less.

According to the method for producing a semiconductor apparatus substrate of the present invention, by adjusting the silicon content in a silicon-containing film within a predetermined range, an organic under layer film can be peeled and removed, for example, with a peeling liquid, together with a part of or all of the silicon-containing film that may remain on the organic under layer film. Therefore, even when the pattern formed from the silicon-containing film and the organic under layer film is used as a mask for ion implantation, wet peeling with a peeling liquid can be easily carried out after ion implantation without causing damage to the semiconductor apparatus substrate. Since processing is carried out by a three-layer process without causing damage to the ion-implanted substrate, the present invention is particularly suitable for production of a three-dimensional transistor.

EXAMPLES

Hereinafter, the present invention will be specifically described with reference to Synthesis Examples, Experimental Examples, Comparative Experimental Examples, Examples, and Comparative Examples, but is not restricted to the following description. In the following Examples, percentages were based on mass, and measurement of molecular weight was based on GPC.

Synthesis of Silicon-Containing Compound

Synthesis Example 1

To a mixture of 400 g of ethanol, 5 g of 25% tetramethylammonium hydroxide, and 200 g of deionized water, a mixture of 19.8 g of Monomer 100 and 98.6 g of Monomer 110 was added, and the resulting mixture was held at 40° C. for 4 hours to carry out hydrolysis condensation. After completion of the reaction, 2 g of acetic acid was added to neutralize the resultant, and alcohol as a byproduct was removed under reduced pressure. To the resultant, 1,200 mL of ethyl acetate and 400 g of propylene glycol methyl ether acetate (hereinafter referred to as PGMEA) were added, and the water layer was removed by separation. 300 mL of ion-exchanged water was added to the remaining organic layer, and the mixture was stirred, allowed to stand, and separated. This procedure was repeated three times. 500 g of PGMEA was added to the remaining organic layer, and the mixture was then concentrated under reduced pressure to obtain 850 g of solution of Silicon-containing compound 1 (silicon content: 17%) in PGMEA (compound concentration: 9.9%). The molecular weight Mw thereof in terms of polystyrene was measured to be 6,500.

Synthesis Example 2

To a mixture of 400 g of ethanol, 5 g of 25% tetramethylammonium hydroxide, and 200 g of deionized water, a mixture of 19.8 g of Monomer 100, 73.9 g of Monomer 110, and 23.6 g of Monomer 111 was added, and the resulting mixture was held at 40° C. for 4 hours to carry out hydrolysis condensation. After completion of the reaction, 2 g of acetic acid was added to neutralize the resultant, and alcohol as a byproduct was removed under reduced pressure. To the resultant, 1,200 mL of ethyl acetate and 400 g of PGMEA were added, and the water layer was removed by separation. 300 mL of ion-exchanged water was added to the remaining organic layer, and the mixture was stirred, allowed to stand, and separated. This procedure was repeated three times. 500 g of PGMEA was added to the remaining organic layer, and the mixture was then concentrated under reduced pressure to obtain 860 g of solution of Silicon-containing compound 2 (silicon content: 17%) in PGMEA (compound concentration: 9.6%). The molecular weight Mw thereof in terms of polystyrene was measured to be 6,600.

Synthesis Example 3

To a mixture of 400 g of ethanol, 5 g of 25% tetramethylammonium hydroxide, and 200 g of deionized water, a mixture of 19.8 g of Monomer 100, 20.9 g of Monomer 103, and 73.9 g of Monomer 110 was added, and the resulting mixture was held at 40° C. for 8 hours to carry out hydrolysis condensation. After completion of the reaction, 2 g of acetic acid was added to neutralize the resultant, and alcohol as a byproduct was removed under reduced pressure. To the resultant, 1,200 mL of ethyl acetate and 400 g of PGMEA were added, and the water layer was removed by separation. 300 mL of ion-exchanged water was added to the remaining organic layer, and the mixture was stirred, allowed to stand, and separated. This procedure was repeated three times. 300 g of PGMEA was added to the remaining organic layer, and the mixture was then concentrated under reduced pressure to obtain 670 g of solution of Silicon-containing compound 3 (silicon content: 19%) in PGMEA (compound concentration: 10.8%). The molecular weight Mw thereof in terms of polystyrene was measured to be 8,800.

Synthesis Example 4

To a mixture of 400 g of ethanol, 5 g of 25% tetramethylammonium hydroxide, and 200 g of deionized water, a mixture of 21.2 g of Monomer 104, 86.2 g of Monomer 110, and 18.6 g of Monomer 116 was added, and the resulting mixture was held at 40° C. for 8 hours to carry out hydrolysis condensation. After completion of the reaction, 2 g of acetic acid was added to neutralize the resultant, and alcohol as a byproduct was removed under reduced pressure. To the resultant, 1,200 mL of ethyl acetate and 400 g of PGMEA were added, and the water layer was removed by separation. 300 mL of ion-exchanged water was added to the remaining organic layer, and the mixture was stirred, allowed to stand, and separated. This procedure was repeated three times. 500 g of PGMEA was added to the remaining organic layer, and the mixture was then concentrated under reduced pressure to obtain 920 g of solution of Silicon-containing compound 4 (silicon content: 16%) in PGMEA (compound concentration: 9.8%). The molecular weight Mw thereof in terms of polystyrene was measured to be 7,400.

Synthesis Example 5

To a mixture of 400 g of ethanol, 5 g of 25% tetramethylammonium hydroxide, and 200 g of deionized water, a mixture of 19.8 g of Monomer 100, 61.6 g of Monomer 110, and 41.8 g of Monomer 112 was added, and the resulting mixture was held at 40° C. for 8 hours to carry out hydrolysis condensation. After completion of the reaction, 2 g of acetic acid was added to neutralize the resultant, and alcohol as a byproduct was removed under reduced pressure. To the resultant, 1,200 mL of ethyl acetate and 400 g of PGMEA were added, and the water layer was removed by separation. 300 mL of ion-exchanged water was added to the remaining organic layer, and the mixture was stirred, allowed to stand, and separated. This procedure was repeated three times. 500 g of PGMEA was added to the remaining organic layer, and the mixture was then concentrated under reduced pressure to obtain 940 g of solution of Silicon-containing compound 5 (silicon content: 16%) in PGMEA (compound concentration: 9.4%). The molecular weight Mw thereof in terms of polystyrene was measured to be 7,200.

Synthesis Example 6

To a mixture of 120 g of methanol, 1 g of 70% nitric acid, and 60 g of deionized water, a mixture of 94.6 g of Monomer 113 and 41.2 g of Monomer 114 was added, and the resulting mixture was held at 40° C. for 12 hours to carry out hydrolysis condensation. After completion of the reaction, 300 g of propylene glycol monoethyl ether (hereinafter referred to as PGEE) was added, and alcohol as a byproduct and excess water were removed under reduced pressure. To the resultant, 1,200 mL of ethyl acetate was added, and the water layer was removed by separation. 300 mL of ion-exchanged water was added to the remaining organic layer, and the mixture was stirred, allowed to stand, and separated. This procedure was repeated three times. 600 g of PGEE was added to the remaining organic layer, and the mixture was then concentrated under reduced pressure to obtain 940 g of solution of Silicon-containing compound (silicon content: 14%) in PGEE (compound concentration: 9.4%). The molecular weight Mw thereof in terms of polystyrene was measured to be 1,600.

Synthesis Example 7

To a mixture of 120 g of methanol, 0.1 g of 70% nitric acid, and 60 g of deionized water, a mixture of 9.9 g of Monomer 100, 13.6 g of Monomer 101, and 94.6 g of Monomer 113 was added, and the resulting mixture was held at 40° C. for 12 hours to carry out hydrolysis condensation. After completion of the reaction, 300 g of PGEE was added, and alcohol as a byproduct and excess water were removed under reduced pressure. To the resultant, 1,200 mL of ethyl acetate was added, and the water layer was removed by separation. 300 mL of ion-exchanged water was added to the remaining organic layer, and the mixture was stirred, allowed to stand, and separated. This procedure was repeated three times. 600 g of PGEE was added to the remaining organic layer, and the mixture was then concentrated under reduced pressure to obtain 860 g of solution of Silicon-containing compound 7 (silicon content: 17%) in PGEE (compound concentration: 9.8%). The molecular weight Mw thereof in terms of polystyrene was measured to be 2,500.

Synthesis Example 8

To a mixture of 200 g of methanol, 0.2 g of 70% nitric acid, and 100 g of deionized water, a mixture of 11.4 g of Monomer 105, 67.6 g of Monomer 113, and 74.5 g of Monomer 116 was added, and the resulting mixture was held at 40° C. for 12 hours to carry out hydrolysis condensation. After completion of the reaction, 300 g of PGEE was added, and alcohol as a byproduct and excess water were removed under reduced pressure. To the resultant, 1,200 mL of ethyl acetate was added, and the water layer was removed by separation. 300 mL of ion-exchanged water was added to the remaining organic layer, and the mixture was stirred, allowed to stand, and separated. This procedure was repeated three times. 800 g of PGEE was added to the remaining organic layer, and the mixture was then concentrated under reduced pressure to obtain 1,070 g of solution of Silicon-containing compound 8 (silicon content: 13%) in PGEE (compound concentration: 10.3%). The molecular weight Mw thereof in terms of polystyrene was measured to be 1,500.

Synthesis Example 9

To a mixture of 120 g of methanol, 0.1 g of 70% nitric acid, and 60 g of deionized water, a mixture of 9.9 g of Monomer 100, 13.6 g of Monomer 101, 30.4 g of Monomer 102, and 41.2 g of Monomer 114 was added, and the resulting mixture was held at 40° C. for 12 hours to carry out hydrolysis condensation. After completion of the reaction, 300 g of PGEE was added, and alcohol as a byproduct and excess water were removed under reduced pressure. To the resultant, 1,200 mL of ethyl acetate was added, and the water layer was removed by separation. 300 mL of ion-exchanged water was added to the remaining organic layer, and the mixture was stirred, allowed to stand, and separated. This procedure was repeated three times. 400 g of PGEE was added to the remaining organic layer, and the mixture was then concentrated under reduced pressure to obtain 630 g of solution of Silicon-containing compound 9 (silicon content: 25%) in PGEE (compound concentration: 8.9%). The molecular weight Mw thereof in terms of polystyrene was measured to be 3,100.

Synthesis Example 10

To a mixture of 120 g of methanol, 0.1 g of 70% nitric acid, and 60 g of deionized water, a mixture of 5.0 g of Monomer 100, 17.0 g of Monomer 101, 34.2 g of Monomer 102, 18.6 g of Monomer 116, 2.5 g of Monomer 117, and 5.2 g of Monomer 118 was added, and the resulting mixture was held at 40° C. for 12 hours to carry out hydrolysis condensation. After completion of the reaction, 200 g of PGEE was added, and alcohol as a byproduct and excess water were removed under reduced pressure. To the resultant, 1,000 mL of ethyl acetate was added, and the water layer was removed by separation.

250 mL of ion-exchanged water was added to the remaining organic layer, and the mixture was stirred, allowed to stand, and separated. This procedure was repeated three times. 200 g of PGEE was added to the remaining organic layer, and the mixture was then concentrated under reduced pressure to obtain 380 g of solution of Silicon-containing compound 10 (silicon content: 29%) in PGEE (compound concentration: 10.9%). The molecular weight Mw thereof in terms of polystyrene was measured to be 2,500.

Synthesis Example 11

To a mixture of 120 g of methanol, 0.1 g of 70% nitric acid, and 60 g of deionized water, a mixture of 9.9 g of Monomer 100, 13.6 g of Monomer 101, 30.4 g of Monomer 102, and 29.8 g of Monomer 115 was added, and the resulting mixture was held at 40° C. for 12 hours to carry out hydrolysis condensation. After completion of the reaction, 300 g of PGEE was added, and alcohol as a byproduct and excess water were removed under reduced pressure. To the resultant, 1,200 mL of ethyl acetate was added, and the water layer was removed by separation. 300 mL of ion-exchanged water was added to the remaining organic layer, and the mixture was stirred, allowed to stand, and separated. This procedure was repeated three times. 200 g of PGEE was added to the remaining organic layer, and the mixture was then concentrated under reduced pressure to obtain 430 g of solution of Silicon-containing compound 11 (silicon content: 31%) in PGEE (compound concentration: 10.4%). The molecular weight Mw thereof in terms of polystyrene was measured to be 2,900.

Synthesis Example 12

To a mixture of 120 g of methanol, 0.1 g of 70% nitric acid, and 60 g of deionized water, a mixture of 5.0 g of Monomer 100, 20.4 g of Monomer 101, 38.1 g of Monomer 102, 2.5 g of Monomer 117, and 5.2 g of Monomer 118 was added, and the resulting mixture was held at 40° C. for 12 hours to carry out hydrolysis condensation. After completion of the reaction, 200 g of PGEE was added, and alcohol as a byproduct and excess water were removed under reduced pressure. To the resultant, 800 mL of ethyl acetate was added, and the water layer was removed by separation. 200 mL of ion-exchanged water was added to the remaining organic layer, and the mixture was stirred, allowed to stand, and separated. This procedure was repeated three times. 200 g of PGEE was added to the remaining organic layer, and the mixture was then concentrated under reduced pressure to obtain 290 g of solution of Silicon-containing compound 12 (silicon content: 38%) in PGEE (compound concentration: 11.0%). The molecular weight Mw thereof in terms of polystyrene was measured to be 3,200.

The monomers used in Synthesis Examples are as follows.

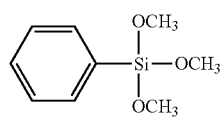

Monomer 100

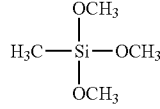

Monomer 101

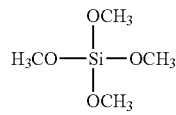

Monomer 102

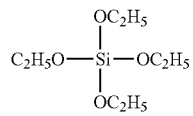

Monomer 103

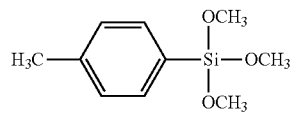

Monomer 104

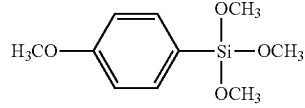

Monomer 105

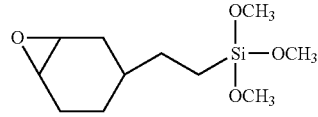

Monomer 110

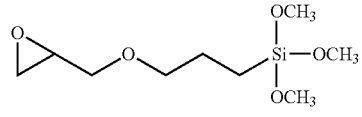

Monomer 111

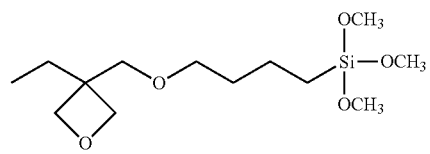

Monomer 112

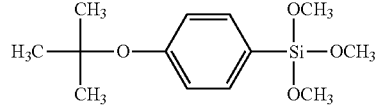

Monomer 113

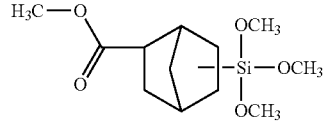

Monomer 114

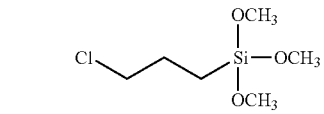

Monomer 115

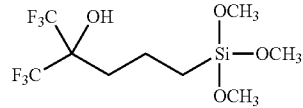

Monomer 116

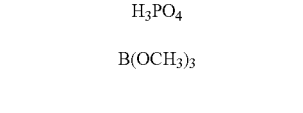

Monomer 117

H$_3$PO$_4$

Monomer 118

B(OCH$_3$)$_3$

[Preparation of Solution of Composition for Forming Silicon-Containing Film]

Each silicon-containing compound obtained in Synthesis Examples, additives, and solvents were mixed at a ratio shown in Table 1A and 1B. The mixture was filtrated through a 0.1 μm-fluoride resin filter, to prepare each solution of a composition for forming a silicon-containing film as Sols. 1 to 25.

TABLE 1A

| No. | Silicon-containing compound (parts by mass) | Additives Thermal crosslinking accelerator (parts by mass) | Additives Ultraviolet absorber (parts by mass) | Additives Others (parts by mass) | Solvent (parts by mass) | Silicon content (% by mass) |
|---|---|---|---|---|---|---|
| Sol. 1 | 1 (4.0) | BnTBATf (0.04) | — | — | PGMEA (160) | 17% |
| Sol. 2 | 1 (4.0) | BnTBATf (0.04) | UV-1 (0.4) | — | PGMEA (160) | 15% |
| Sol. 3 | 2 (4.0) | BnTBATf (0.04) | — | — | PGMEA (160) | 17% |
| Sol. 4 | 2 (4.0) | BnTBATf (0.04) | UV-1 (0.4) | — | PGMEA (160) | 15% |
| Sol. 5 | 3 (4.0) | BnTBATf (0.04) | — | Fluorine-containing surfactant FC-4430 (0.02) | PGMEA (160) | 19% |
| Sol. 6 | 3 (4.0) | BnTBATf (0.04) | UV-1 (0.4) | — | PGMEA (160) | 17% |
| Sol. 7 | 4 (4.0) | BnTBATf (0.04) | — | — | PGMEA (160) | 16% |
| Sol. 8 | 4 (4.0) | BnTBATf (0.04) | UV-1 (0.4) | — | PGMEA (160) | 15% |
| Sol. 9 | 5 (4.0) | BnTBATf (0.04) | — | — | PGMEA (160) | 16% |
| Sol. 10 | 5 (4.0) | BnTBATf (0.04) | UV-1 (0.4) | — | PGMEA (160) | 15% |
| Sol. 11 | 5 (4.0) | BnTBATf (0.04) | UV-1 (0.4) | Fluorine-containing polymer [Compound 120] (0.4) | PGMEA (160) | 13% |
| Sol. 12 | 6 (4.0) | TPSMA (0.04) | — | — | PGEE/H$_2$O (150/10) | 14% |
| Sol. 13 | 6 (4.0) | TPSMA (0.04) | UV-2 (0.4) | — | PGEE/H$_2$O (150/10) | 13% |

TABLE 1B

| No. | Silicon-containing compound (parts by mass) | Additives Thermal crosslinking accelerator (parts by mass) | Additives Ultraviolet absorber (parts by mass) | Additives Others (parts by mass) | Solvent (parts by mass) | Silicon content (% by mass) |
|---|---|---|---|---|---|---|
| Sol. 14 | 7 (4.0) | TPSMA (0.04) | — | — | PGEE/H$_2$O (150/10) | 17% |
| Sol. 15 | 7 (4.0) | TPSMA (0.04) | UV-2 (0.4) | — | PGEE/H$_2$O (150/10) | 16% |
| Sol. 16 | 8 (4.0) | TPSMA (0.04) | — | — | PGEE/H$_2$O (150/10) | 13% |
| Sol. 17 | 8 (4.0) | TPSMA (0.04) | UV-2 (0.4) | — | PGEE/H$_2$O (150/10) | 12% |
| Sol. 18 | 9 (4.0) | TPSMA (0.04) | UV-3 (0.8) | — | PGEE/H$_2$O (150/10) | 21% |
| Sol. 19 | 9 (4.0) | TPSMA (0.04) | — | — | PGEE/H$_2$O (150/10) | 25% |
| Sol. 20 | 10 (4.0) | TPSMA (0.04) | UV-3 (0.8) | — | PGEE/H$_2$O (150/10) | 24% |
| Sol. 21 | 10 (4.0) | TPSMA (0.04) | — | — | PGEE/H$_2$O (150/10) | 29% |
| Sol. 22 | 11 (4.0) | TPSMA (0.04) | UV-3 (0.8) | — | PGEE/H$_2$O (150/10) | 26% |
| Sol. 23 | 11 (4.0) | TPSMA (0.04) | — | — | PGEE/H$_2$O (150/10) | 31% |
| Sol. 24 | 12 (4.0) | TPSMA (0.04) | UV-3 (0.8) | — | PGEE/H$_2$O (150/10) | 32% |
| Sol. 25 | 12 (4.0) | TPSMA (0.04) | — | — | PGEE/H$_2$O (150/10) | 38% |

TPSMA: mono(triphenylsulfonium) maleate
BnTBATf: benzyltributylammonium trifluoromethanesulfonate Fluorine-containing polymer:

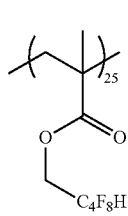 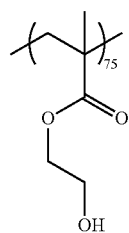

Compound 120

Ultraviolet Absorber:

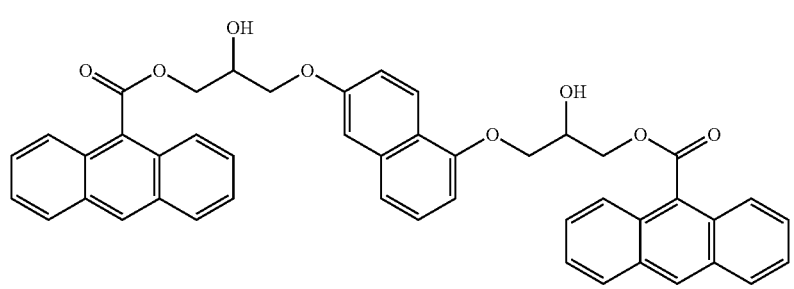

(UV-1)

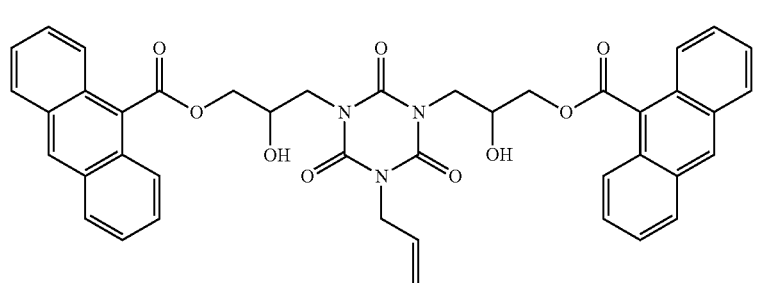

(UV-2)

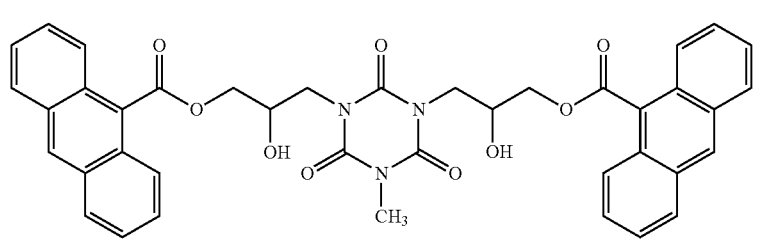

(UV-3)

Experimental Examples and Comparative Experimental Examples

Patterning Test

A spin-on carbon film ODL-50 (carbon content: 80% by mass) available from Shin-Etsu Chemical Co., Ltd., having a thickness of 200 nm was formed on a silicon wafer. The solutions of compositions for forming a silicon-containing film Sols. 1 to 25 were each applied thereto, and heated at 200° C. for 60 seconds to form silicon-containing films having a thickness of 35 nm as Films 1 to 25.

Subsequently, an ArF resist solution for positive development (PR-1) described in Table 2 was applied to each of Films 1 to 25, and baked at 110° C. for 60 seconds to form a photoresist layer (resist film) having a thickness of 250 nm.

The resist film was exposed using an ArF exposure device (manufactured by Nikon Corporation; NSR-S307E, NA: 0.85, σ: 0.85, 0.93/0.85), baked (PEB) at 110° C. for 90 seconds, and developed with an aqueous solution of 2.38% by mass tetramethylammonium hydroxide (TMAH) for 30 seconds, to obtain a 120 nm 1:1 positive line and space pattern. In the resulting pattern, pattern collapse was observed by an electron microscope (CG4000) manufactured by Hitachi High-Technologies Corporation., and the cross-sectional shape was observed by an electron microscope (S-9380) manufactured by Hitachi, Ltd. The results are shown in Table 3.

TABLE 2

| No. | Polymer (parts by mass) | Acid generator (parts by mass) | Base (parts by mass) | Solvent (parts by mass) |
|---|---|---|---|---|
| PR-1 | ArF resist polymer 1 (10) | PAG1 (0.2) | Quencher (1.0) | PGMEA (600) |

ArF resist polymer 1: Molecular weight (Mw)=6,800
Distribution (Mw/Mn)=1.68

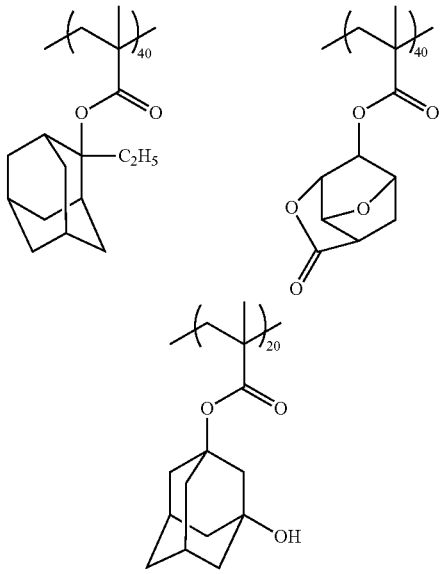

Acid generator (PAG1): triphenylsulfonium nonafluorobutanesulfonate
Base (Quencher): triethanolamine

TABLE 3

| | Silicon-containing film | Pattern cross-sectional shape after development | Pattern collapse |
|---|---|---|---|
| Experimental Example 1 | Film 1 | Vertical shape | None |
| Experimental Example 2 | Film 2 | Vertical shape | None |
| Experimental Example 3 | Film 3 | Vertical shape | None |
| Experimental Example 4 | Film 4 | Vertical shape | None |
| Experimental Example 5 | Film 5 | Vertical shape | None |
| Experimental Example 6 | Film 6 | Vertical shape | None |
| Experimental Example 7 | Film 7 | Vertical shape | None |
| Experimental Example 8 | Film 8 | Vertical shape | None |
| Experimental Example 9 | Film 9 | Vertical shape | None |
| Experimental Example 10 | Film 10 | Vertical shape | None |
| Experimental Example 11 | Film 11 | Vertical shape | None |
| Experimental Example 12 | Film 12 | Vertical shape | None |
| Experimental Example 13 | Film 13 | Vertical shape | None |
| Experimental Example 14 | Film 14 | Vertical shape | None |
| Experimental Example 15 | Film 15 | Vertical shape | None |
| Experimental Example 16 | Film 16 | Vertical shape | None |
| Experimental Example 17 | Film 17 | Vertical shape | None |
| Experimental Example 18 | Film 18 | Vertical shape | None |
| Experimental Example 19 | Film 19 | Vertical shape | None |
| Experimental Example 20 | Film 20 | Vertical shape | None |
| Experimental Example 21 | Film 21 | Vertical shape | None |
| Experimental Example 22 | Film 22 | Vertical shape | None |
| Comparative Experimental Example 1 | Film 23 | Vertical shape | None |
| Comparative Experimental Example 2 | Film 24 | Vertical shape | None |
| Comparative Experimental Example 3 | Film 25 | Vertical shape | None |

As shown in Table 3, in all of Experimental Examples 1 to 22 (Films 1 to 22) in which the silicon content in the silicon-containing film was 1 to 30% by mass and Comparative Experimental Examples 1 to 3 (Films 23 to 25) in which the silicon content in the silicon-containing film was more than 30% by mass, a pattern having a vertical cross-sectional shape was obtained, and pattern collapse did not occur.

Examples and Comparative Examples

Patter Etching, Ion Implantation, and Wet Peeling Test

The silicon wafer on which the resist pattern was formed in the patterning test was dry etched using the formed resist pattern as a mask under a condition (1) to transfer the pattern to the silicon-containing film. Subsequently, the spin-on carbon film was dry etched using the silicon-containing film having the transferred pattern as a mask under a condition (2) to transfer the pattern to the spin-on carbon film. At that time, a part of the silicon-containing film remained on the spin-on carbon film.

(1) Etching condition using $CHF_3/CF_4$ series gas
Device: dry etching device Telius SP manufactured by Tokyo Electron Limited
Etching condition (1):
Chamber pressure: 10 Pa
Upper/Lower RF power: 500 W/300 W
$CHF_3$ gas flow rate: 50 mL/min
$CF_4$ gas flow rate: 150 mL/min
Ar gas flow rate: 100 mL/min
Treatment time: 40 sec (2) Etching Condition Using $O_2/N_2$ Series Gas
Device: dry etching device Telius SP manufactured by Tokyo Electron Limited
Etching condition (2):
Chamber pressure: 2 Pa
Upper/Lower RF power: 1,000 W/300 W
$O_2$ gas flow rate: 300 mL/min
$N_2$ gas flow rate: 100 mL/min
Ar gas flow rate: 100 ml/min
Treatment time: 30 sec Boron ions were implanted into the silicon wafer using the spin-on carbon film having the pattern formed by dry etching on which a part of the silicon-containing film remained as a mask by an ion implanter EXCEED3000AH manufactured by Nissin Ion Equipment Co., Ltd., under a condition of 80 keV and $7 \times 10^{15}/cm^2$.

Subsequently, the silicon wafer in which the ions were implanted was peeled using sulfuric acid peroxide mixture ($H_2SO_4:H_2O_2:H_2O=96:1:3$). The spin-on carbon film used as the mask on which a part of the silicon-containing film remained was removed, and the number of residues of the mask was counted using an optical microscope. The results are shown in Table 4.

TABLE 4

| | Silicon-containing film | Silicon content in silicon-containing film | Presence or absence (number) of mask residues after peeling (treatment with sulfuric acid peroxide mixture) |
|---|---|---|---|
| Example 1 | Film 1 | 17% | No residue (0) |
| Example 2 | Film 2 | 15% | No residue (0) |
| Example 3 | Film 3 | 17% | No residue (0) |
| Example 4 | Film 4 | 15% | No residue (0) |
| Example 5 | Film 5 | 19% | No residue (0) |
| Example 6 | Film 6 | 17% | No residue (0) |
| Example 7 | Film 7 | 16% | No residue (0) |
| Example 8 | Film 8 | 15% | No residue (0) |
| Example 9 | Film 9 | 16% | No residue (0) |
| Example 10 | Film 10 | 15% | No residue (0) |
| Example 11 | Film 11 | 13% | No residue (0) |
| Example 12 | Film 12 | 14% | No residue (0) |
| Example 13 | Film 13 | 13% | No residue (0) |
| Example 14 | Film 14 | 17% | No residue (0) |
| Example 15 | Film 15 | 16% | No residue (0) |
| Example 16 | Film 16 | 13% | No residue (0) |
| Example 17 | Film 17 | 12% | No residue (0) |
| Example 18 | Film 18 | 21% | No residue (0) |
| Example 19 | Film 19 | 25% | No residue (0) |
| Example 20 | Film 20 | 24% | No residue (0) |
| Example 21 | Film 21 | 29% | Residues (5) |
| Example 22 | Film 22 | 26% | No residue (0) |
| Comparative Example 1 | Film 23 | 31% | Residues (50) |
| Comparative Example 2 | Film 24 | 32% | Residues (100) |
| Comparative Example 3 | Film 25 | 38% | Residues (1,000) |

As shown in Table 4, in Examples 1 to 22 using each of the silicon-containing films (Films 1 to 22) whose silicon content is 1 to 30% by mass, the residue after peeling do not almost remain. This shows that the mask used for ion implantation can be peeled with a peeling liquid after the ion implantation.

In Comparative Examples 1 to 3 using each of the silicon-containing films (Films 23 to 25) whose silicon content is more than 30% by mass, the residue after peeling is observed. This shows that the mask used for ion implantation cannot be peeled with a peeling liquid after the ion implantation.

From the results mentioned above, it could be clarified that according to the method for producing a semiconductor apparatus substrate of the present invention, the mask used in ion implantation can be easily peeled with a peeling liquid without causing damage to the semiconductor apparatus substrate in a method for producing a semiconductor apparatus substrate using a silicon-containing film.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A method for producing a semiconductor apparatus substrate comprising the steps of:

(1) forming an organic under layer film on a substrate to be processed for producing a semiconductor apparatus, and applying a composition for forming a silicon-containing film on the organic under layer film, followed by heating, to form a silicon-containing film having a silicon content of 1% by mass or more and 30% by mass or less;

(2) applying a resist composition on the silicon-containing film to form a resist film, the resist composition containing a polymer whose polarity is changed by an acid action to change solubility thereof in a developer;

(3) forming a resist pattern by exposing and developing the resist film;

(4) transferring the pattern to the silicon-containing film by dry etching using the resist pattern as a dry etching mask;

(5) transferring the pattern to the organic under layer film by dry etching using the silicon-containing film to which the pattern has been transferred as a dry etching mask, to leave a part of or all of the silicon-containing film after the pattern transferring, on the organic under layer film to which the pattern has been transferred;

(6) implanting ions into the substrate to be processed for producing a semiconductor apparatus using the organic under layer film to which the pattern has been transferred as a mask; and (7) peeling the organic under layer film used as the mask for ion implantation on which a part of or all of the silicon-containing film remains, with a peeling liquid.

2. The method for producing a semiconductor apparatus substrate according to claim 1, wherein in the step (6), ions are implanted into the substrate to be processed for producing a semiconductor apparatus using the pattern formed from a part of or all of the silicon-containing film and the organic under layer film as a mask.

3. The method for producing a semiconductor apparatus substrate according to claim 1, wherein in the step (7), the organic under layer film used as the mask for ion implantation on which a part of or all of the silicon-containing film remains is peeled with the peeling liquid at a time.

4. The method for producing a semiconductor apparatus substrate according to claim 2, wherein in the step (7), the organic under layer film used as the mask for ion implantation on which a part of or all of the silicon-containing film remains is peeled with the peeling liquid at a time.

5. The method for producing a semiconductor apparatus substrate according to claim 1, wherein the peeling liquid contains hydrogen peroxide.

6. The method for producing a semiconductor apparatus substrate according to claim 1, wherein the peeling liquid contains sulfuric acid.

7. The method for producing a semiconductor apparatus substrate according to claim 1, wherein in the step (7), the treatment with the peeling liquid is followed by peeling with another peeling liquid containing fluorine ions.

8. The method for producing a semiconductor apparatus substrate according to claim 1, wherein in the step (7), the treatment with the peeling liquid is followed by cleaning with a cleaning liquid containing ammonia.

9. The method for producing a semiconductor apparatus substrate according to claim 1, wherein the substrate to be processed for producing a semiconductor apparatus is a semiconductor apparatus substrate on which a part of or all of semiconductor circuit is formed or a material in which any of a metal film, an amorphous metal film, a metal carbide film, a metal oxide film, a metal nitride film, a metal oxycarbide film, and a metal oxynitride film is formed on the semiconductor apparatus substrate.

10. The method for producing a semiconductor apparatus substrate according to claim 9, wherein the metal comprises silicon, titanium, tungsten, hafnium, zirconium, chromium, germanium, copper, silver, gold, aluminum, indium, gallium, arsenic, palladium, iron, tantalum, iridium, molybdenum, or an alloy of these metals.

11. The method for producing a semiconductor apparatus substrate according to claim 1, wherein the ion implanted is any of boron, phosphorus, arsenic, carbon, nitrogen, oxygen, fluorine, argon, silicon, gallium, germanium, indium, and antimony.

12. The method for producing a semiconductor apparatus substrate according to claim 1, wherein the composition for forming a silicon-containing film contains at least a polysiloxane and a solvent.

13. The method for producing a semiconductor apparatus substrate according to claim 2, wherein the composition for forming a silicon-containing film contains at least a polysiloxane and a solvent.

14. The method for producing a semiconductor apparatus substrate according to claim 12, wherein the polysiloxane contains a crosslinkable organic group.

15. The method for producing a semiconductor apparatus substrate according to claim 14, wherein the crosslinkable organic group is any of an epoxy group, a phenol group, and a naphthol group.

16. The method for producing a semiconductor apparatus substrate according to claim 12, wherein the polysiloxane contains a halogenated organic group.

17. The method for producing a semiconductor apparatus substrate according to claim 16, wherein halogen in the halogenated organic group is fluorine or chlorine.

18. The method for producing a semiconductor apparatus substrate according to claim 12, wherein the composition for forming a silicon-containing film further contains an acid generator which generates an acid by an action of heat, light, or both.

19. The method for producing a semiconductor apparatus substrate according to claim 12, wherein the composition for forming a silicon-containing film further contains an organic compound containing fluorine.

20. The method for producing a semiconductor apparatus substrate according to claim 12, wherein the composition for forming a silicon-containing film further contains a crosslinker.

* * * * *